(12) United States Patent
Hwang et al.

(10) Patent No.: US 6,919,168 B2
(45) Date of Patent: Jul. 19, 2005

(54) MASKING METHODS AND ETCHING SEQUENCES FOR PATTERNING ELECTRODES OF HIGH DENSITY RAM CAPACITORS

(75) Inventors: Jeng H. Hwang, Cupertino, CA (US); Steve S. Y. Mak, Pleasanton, CA (US); True-Lon Lin, Cupertino, CA (US); Chentsau Ying, Cupertino, CA (US); John W. Schaller, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/057,674

(22) Filed: Jan. 24, 2002

(65) Prior Publication Data

US 2003/0059720 A1 Mar. 27, 2003

Related U.S. Application Data

(63) Continuation of application No. 09/421,467, filed on Oct. 19, 1999, now abandoned, which is a continuation-in-part of application No. 09/251,588, filed on Feb. 17, 1999, now abandoned, and a continuation-in-part of application No. 09/251,826, filed on Feb. 17, 1999, now Pat. No. 6,323,132, and a continuation-in-part of application No. 09/251,633, filed on Feb. 17, 1999, now Pat. No. 6,265,318, which is a continuation-in-part of application No. 09/006,092, filed on Jan. 13, 1998, now abandoned.

(51) Int. Cl.[7] .............................. G03F 7/00; G03F 7/36
(52) U.S. Cl. .................... 430/318; 430/311; 430/313; 430/316; 430/317; 438/653; 216/67; 216/75
(58) Field of Search ................. 430/311, 313, 316, 317, 318; 438/653; 216/67, 75

(56) References Cited

U.S. PATENT DOCUMENTS 4,456,675 A * 6/1984 Anderson, Jr. et al. ..... 430/256
4,544,602 A * 10/1985 Kobayashi et al. ......... 438/336

(Continued)

FOREIGN PATENT DOCUMENTS

| DE | 19728473 | 1/1999 | ........... H01L/21/28 |
| EP | 0725430 | 8/1996 | ....... H01L/21/3205 |
| EP | 0786805 | 7/1997 | ......... H01L/21/321 |
| EP | 0795896 | 9/1997 | ......... H01L/21/311 |
| EP | 0858103 | 12/1998 | ....... H01L/21/3213 |
| EP | 0889519 | 1/1999 | ....... H01L/21/8242 |
| JP | 59016334 | 1/1984 | ......... H01L/21/302 |
| JP | 11111695 | 4/1999 | ....... H01L/21/3065 |
| WO | WO 9800859 | 1/1998 | ......... H01L/21/302 |

OTHER PUBLICATIONS

C. H. Chou et al., "Platinum metal etching in a microwave oxygen plasma", J. Appl. Phys., 68 (5), pp. 2415–2423 (1990).

(Continued)

Primary Examiner—Mark F. Huff
Assistant Examiner—Nicole Barreca
(74) Attorney, Agent, or Firm—Shirley L. Church; Kathi Bean; Joseph Bach

(57) ABSTRACT

A method of etching a noble metal electrode layer disposed on a substrate to produce a semiconductor device including a plurality of electrodes separated by a distance equal to or less than about 0.35 $\mu$m and having a noble metal profile equal to or greater than about 80°. The method comprises heating the substrate to a temperature greater than about 150° C., and etching the noble metal electrode layer by employing a high density inductively coupled plasma of an etchant gas comprising a gas selected from the group consisting of nitrogen, oxygen, a halogen (e.g., chlorine), argon, and a gas selected from the group consisting of $BCl_3$, HBr, and $SiCl_4$ mixtures thereof. Masking methods and etching sequences for patterning high density RAM capacitors are also provided.

28 Claims, 34 Drawing Sheets

U.S. PATENT DOCUMENTS

| | | | |
|---|---|---|---|
| 4,889,588 A | | 12/1989 | Fior .......................... 156/643 |
| 4,902,377 A | | 2/1990 | Berglund et al. ........... 156/643 |
| 5,188,704 A | | 2/1993 | Babie et al. ................. 156/643 |
| 5,232,747 A | | 8/1993 | Evans, Jr. ................... 427/539 |
| 5,258,093 A | | 11/1993 | Maniar ....................... 156/626 |
| 5,492,855 A | | 2/1996 | Matsumoto et al. .......... 437/60 |
| 5,498,768 A | | 3/1996 | Nishitani et al. ........... 437/192 |
| 5,515,984 A | | 5/1996 | Yokoyama et al. ........... 216/41 |
| 5,527,729 A | | 6/1996 | Matsumoto et al. .......... 437/60 |
| 5,554,866 A | | 9/1996 | Nishioka et al. ............. 257/295 |
| 5,565,036 A | | 10/1996 | Westendorp et al. ........ 118/723 |
| 5,591,671 A | * | 1/1997 | Kim et al. ................... 437/190 |
| 5,613,296 A | * | 3/1997 | Kurino et al. ................ 29/852 |
| 5,658,820 A | | 8/1997 | Chung ........................... 438/3 |
| 5,679,213 A | | 10/1997 | Noshiro ....................... 156/643 |
| 5,686,339 A | | 11/1997 | Lee et al. ...................... 437/60 |
| 5,696,018 A | | 12/1997 | Summerfelt et al. .......... 437/60 |
| 5,702,970 A | | 12/1997 | Choi ............................ 437/52 |
| 5,707,487 A | | 1/1998 | Hori et al. ............. 156/659.11 |
| 5,753,044 A | | 5/1998 | Hanawa et al. ............. 118/723 |
| 5,792,593 A | | 8/1998 | McClure et al. ............ 430/314 |
| 5,854,104 A | | 12/1998 | Onishi et al. ............... 438/240 |
| 5,948,570 A | * | 9/1999 | Kornblit et al. ............... 430/5 |
| 6,004,882 A | * | 12/1999 | Kim et al. ................... 438/706 |
| 6,046,113 A | * | 4/2000 | Hong et al. ................. 438/694 |
| 6,087,265 A | | 7/2000 | Hwang ....................... 438/706 |
| 6,143,476 A | * | 11/2000 | Ye .............................. 430/318 |
| 6,277,251 B1 | | 8/2001 | Hwang et al. ......... 204/192.33 |
| 6,482,745 B1 | | 11/2002 | Hwang ....................... 438/706 |

OTHER PUBLICATIONS

C. W. Chung et al., "Study on Fence–Free Platinum Etching Using Chlorine–Based Gases in Inductively Coupled Plasma", J. Electrochem. Soc., vol. 144, No. 11, pp. L294–L296 (1997).

S. DeOrnellas et al., "Plasma Etch of Ferroelectric Capacitors in FeRAMs and DRAMs", Semiconductor International, pp. 103–107 (Sep. 1997).

C. E. Farrell et al., "Reaction ion etch study for producing patterned platinum structures", Integrated Ferroelectrics, vol. 16, No. 1–4, Part 3, pp. 109–138 (1997).

I. Kazuya et al., "Process Integration of the Stacked Ferroelectric Capacitor Cell", Proceedings of the Symposium on Semiconductors and Integrated Circuits Technology, vol. 52, pp. 159–164 (1997).

D. Keil et al., "The Etching of Platinum Electrodes for PZT Based Ferroelectric Devices", Electrochemical Society Proceedings, vol. 96–12, pp. 515–521 (1996).

D. E. Kotecki, "High–K Dielectric Materials for DRAM Capacitors", Semiconductor International, pp. 109–116 (Nov. 1996).

K. Kwon et al., "The study on the etching mechanism of Pt thin film by inductive coupled plasma", Journal of the Korean Institute of Telematics and Electronics, pp. 27–32 (1997).

H. S. Lee et al., "Patterning of Pt thin films using $SiO_2$ mask in a high density plasma", Journal of the Korean Institute of Telematics and Electronics, pp. 87–92 (1997).

K. R. Milkove, "New Insight Into the Reactive Ion Etching of Fence–free Patterned Platinum Structures", $43^{rd}$ National Symposium of the American Vacuum Society (1996).

K. Nishikawa et al., "Platinum Etching and Plasma Characteristics in RF Magnetron and Electron Cyclotron Resonance Plasmas", Jpn. J. Appl. Phys., vol. 32, pp. 6102–6108 (1993).

S. Teruo et al., "Etching of platinum and high dielectric constant films", Oyo Butsuri, vol. 63, No. 11, pp. 1139–1142 (1998).

G. Xing et al., "A Novel Method of Dry Etching Fence–Free Pt Electrodes for Gbit DRAMs".

High–Temperature Etching of PZT/Pt/TiN Structure by High Density ECR Plasma, Jpn. J. Appl. Phys., vol. 34, Part 1, No. 2B, pp. 767–770 (1995).

W. J. Yoo et al., "Control of Etch Slope during Etching of Pt in $Ar/Cl_2/O_2$ Plasmas", Jpn. J. Appl. Phys., vol. 35, Part 1, No. 4B, pp. 2501–2504 (1996).

Tegal News Release, "Tegal's Ferroelectric Etch System Utilized by Rohm to Produce First Volume Production of Nonvolatile Memory Products" (Oct. 8, 1996).

Tegal News Release, "Tegal Receives Multiple Orders For Ferroelectric Memory ETCH Systems; Japanese And U.S. Semiconductor Companies Order Tegal 6540 HRE Critical ETCH Systems For Development And Pilot Production of Nonvolatile Ferroelectric Memory Devices" (Jul. 10, 1996).

* cited by examiner

HM Open in Std DPS →

MASKING METHODS AND ETCHING SEQUENCES FOR PATTERNING ELECTRODES OF HIGH DENSITY RAM CAPACITORS

This application is a continuation application of application Ser. No. 09/421,467, filed Oct. 19, 1999, which is abandoned. Application Ser. No. 09/421,467 is a continuation-in-part of the following applications: Ser. No. 09/251,588, filed Feb. 17, 1999, which is abandoned; Ser. No. 09/251,826, filed Feb. 17, 1999, which issued as U.S. Pat. No. 6,323,132, on Nov. 27, 2001; and Ser. No. 09/251,633, filed Feb. 17, 1999, which issued as U.S. Pat. No. 6,265,318, on Jul. 24, 2001. Application Ser. Nos. 09/251,588; 09/251,826; and 09/251,633 are continuations-in-part of application Ser. No. 09/006,092, filed Jan. 13, 1998, which is abandoned.

FIELD OF THE INVENTION

This invention relates to plasma etching of a noble metal (e.g., Pt, Ir, Ru, Pd, etc.). More specifically, this invention provides masking methods and etching sequences for plasma etching of a noble metal, such as platinum and/or iridium, for producing semiconductor integrated circuits containing noble metal (e.g., platinum, iridium, or an oxide or alloy of platinum and/or iridium) electrodes.

BACKGROUND OF THE INVENTION

Description of the Prior Art

The implementation of digital information storage and retrieval is a common application of modern digital electronics. Memory size and access time serve as a measure of progress in computer technology. Quite often storage capacitors are employed as memory array elements. As the state of the art has advanced, small-feature-size high density dynamic random access memory (DRAM) devices require storage capacitors of larger capacitance having high dielectric constant materials. The high dielectric constant materials or ferroelectric materials are made primarily of sintered metal oxide and contain a substantial amount of very reactive oxygen. In the formation of capacitors with such ferroelectric materials or films, the electrodes must be composed of materials with least reactivity to prevent oxidation of the electrodes which would decrease the capacitance of storage capacitors. Therefore, precious metals, such as platinum (Pt), palladium (Pd), iridium (Ir), ruthenium (Ru), etc., are preferred metals used in the manufacture of capacitors for high density DRAM.

Among the possible precious metals for capacitor electrodes, platinum and iridium have emerged as an attractive candidate because they are inert to oxidation and are known to have a leakage current ($<10^{-9}$ amps/cm$^2$) lower than other electrodes such as $RuO_2$ and Pd. Platinum and iridium also are good conductors.

In the prior art, platinum and iridium etching has been conducted by means of isotropic etching, such as wet etching with aqua regia, or by anisotropic etching, such as ion milling with Ar gas or by other means. Because of the nature of isotropic etching, using wet etching with aqua regia causes deteriorated processing accuracy. The grade of precision in isotropic etching is not high enough for fine pattern processing. Therefore, it is difficult to perform sub-micron patterning of platinum electrodes due to its isotropic property. Furthermore, a problem with ion milling (i.e., anisotropic etching) occurs because the etching speed on platinum and iridium, which is to form the electrode, is too slow for mass production.

In order to increase processing accuracy in etching platinum and iridium, research and development has been quite active, particularly in the area of etching platinum and iridium by means of a dry etching process where etchants gases (e.g., $Cl_2$, HBr, $O_2$, etc.) are used. The following prior art is representative of the state of art with respect to etching platinum and iridium with a plasma of etching gases.

U.S. Pat. No. 5,492,855 to Matsumoto et al. discloses a semiconductor device manufacturing method, wherein an insulation layer, a bottom electrode Pt layer, a dielectric film and a top electrode Pt layer are provided on top of a substrate having already-completed circuit elements and wiring, and then, a capacitor is formed by selectively dry etching the bottom electrode Pt layer after selectively dry etching the top electrode Pt layer and the dielectric film. The manufacturing method uses a gas containing an S component as etching gas for Pt etching, or an etching gas containing S component as an additive gas; and also it implants S into the Pt layer before the Pt dry etching process by means of ion implantation to compose a S and Pt compound, and then dry etches the Pt compound thus composed.

U.S. Pat. No. 5,527,729 to Matsumoto et al. discloses process steps to form on a substrate in which circuit elements and wirings, etc., are already shaped, an insulation layer, a first metal layer, a dielectric film and a second metal layer. A top electrode and a capacitance film are formed by dry etching the second metal layer and the dielectric film. A bottom electrode is formed by dry etching the first metal layer. The etching gas for dry etching the second metal layer is a mixed gas containing hydrogen halide (e.g., HBr) and oxygen, having a ratio of oxygen against the total of hydrogen halide and oxygen set at about 10%–35%. The etching gas is also taught as a gas containing hydrocarbon, such as chloroform. Matsumoto et al. employs a silicon oxide layer as the insulation layer on the substrate, and a platinum layer or palladium layer as the first and second metal layers. Dry etching of the second metal layer and dielectric film is conducted in a low pressure region not higher than about 5 Pa, where the etching speed is high. Matsumoto et al. further teaches that where a mixed gas of hydrogen halide and oxygen is used as the etching gas, the etching speed on the silicon oxide layer can be made sufficiently low relative to that on the second metal layer made of a platinum layer or a palladium layer; in this way, the excessive etching of the silicon oxide layer underlying the first metal layer is avoided, and damage to the circuit elements and wiring, etc. underneath the silicon oxide layer can be prevented. Furthermore according to Matsumoto et al, the ratio of etching speed of the platinum and dielectric material to the resist can be increased by lowering the etching speed on the resist. Therefore, etching of the platinum and dielectric material may be conducted by using a mask of normal lay-thickness resist (generally speaking, about 1.2 $\mu$m to about 2.0 $\mu$m thick), instead of using a conventional thick-layer resist (about 3 $\mu$m and thicker).

Chou et al. in an article entitled "Platinum Metal Etching in a Microwave Oxygen Plasma", J. Appl. Phys. 68 (5), 1 Sep. 1990, pages 2415–2423, discloses a study to understand the etching of metals in both plasma and chemical systems. The study found that the etching of platinum foils in an oxygen plasma generated in a flow-type microwave system and that very rapid etching (~6 Å/s) took place even at low power inputs (200 W). The principal plasma parameters, including oxygen atom concentration, ion concentration, and electron temperature, were measured by Chou et al. as a function of distance below the microwave coupler. These were correlated to the rate of foil etching, which decreased with increasing distance from the coupler. On the basis of these correlations Chou et al. formulated a simple mechanistic model. The study by Chou et al. further found that the etching of platinum in an oxygen plasma jet results from the concomitant action of oxygen atoms and high energy electrons.

Nishikawa et al. in an article entitled "Platinum Etching and Plasma Characteristics in RF Magnetron and Electron Cyclotron Resonance Plasmas", Jpn. J. Appl. Phys., Vol. 34 (1995), pages 767–770, discloses a study wherein the properties of platinum etching were investigated using both RF magnetron and electron cyclotron resonance (ECR) plasmas, together with measurement of the plasma parameters (neutral concentration, plasma density, etc.). Nishikawa et al. performed experiments in $Cl_2$ plasmas over a pressure ranging from 0.4 to 50 mTorr. In RF magnetron plasmas, the etch rate of Pt was constant at the substrate temperature of from 20 to 160° C. The etch rate and the plasma electron density increased with gas pressure decreasing from 50 to 5 mTorr. In ECR plasmas for RF power of 300 W, Nishikawa et al. found that the etch rate of Pt was almost constant (~100 nm/min) with gas pressure decreasing from 5 to 0.4 mTorr, while the plasma electron density gradually increased with decreasing gas pressure. The study by Nishikawa et al. discusses these experimental results with respect to the relationship between the etch yield and the ratio of neutral $Cl_2$ flux and ion flux incident on the substrate.

Yokoyama et al. in an article entitled "High-Temperature Etching of PZT/Pt/TiN Structure by High-Density ECR Plasma", Jpn. J. Appl. Phys., Vol. 34 (1995), pages 767–770, discloses a study wherein micron patterning technologies for the PZT/Pt/TiN/Ti structure with a spin on glass (SOG) mask are demonstrated using a high-density electron cyclotron resonance (ECR) plasma and a high substrate temperature above 300° C. A 30%-$Cl_2$/Ar gas was used to etch a lead zirconate titanate (PZT) film. No deposits remained, which resulted in an etched profile of more than 80°. A 40%-$O_2$/$Cl_2$ gas was used to etch a Pt film. The etching was completely stopped at the Ti layer. 30-nm-thick deposits remained on the sidewall. They were removed by Yokoyama et al. after dipping in hydrochloric acid. The etched profile of a Pt film was more than 80°. The Ti/TiN/Ti layer was etched with pure $Cl_2$ gas. The size shift from the SOG mask was less than 0.1 μm. Yokoyama et al. did not detect any interdiffusion between SOG and PZT by transmission electron microscopy and energy dispersive x-ray spectroscopy (TEM-EDX) analysis.

Yoo et al. in an article entitled "Control of Etch Slope During Etching of Pt in Ar/$Cl_2$/$O_2$ Plasmas", Jpn. J. Appl. Phys., Vol. 35 (1996), pages 2501–2504, teaches etching of Pt patterns of the 0.25 μm design rule at 20° C. using a magnetically enhanced reactive ion etcher (MERIE). Yoo et al. found that a major problem of etching with a MERIE was the redeposition of the etch products onto the pattern sidewall, making it difficult to reduce the pattern size. In both cases separately using a photoresist mask and an oxide mask, the redeposits of the etch products onto the sidewall were reduced by the addition of $Cl_2$ to Ar, although the etched slope was lowered to 45°. The redeposits were removed by an HCl cleaning process.

Kotecki in an article entitled "High-K Dielectric Materials for DRAM Capacitors", Semiconductor International, November 1996, pages 109–116, the potential advantages of incorporating high-dielectric materials into a storage capacitor of a dynamic random access memory (DRAM) are described and the requirements of the high dielectric layer are reviewed as they relate to use in a simple stack capacitor structure suitable for the gigabit generation. Kotecki teaches that when considering the use of high-dielectric materials in a stack capacitor structure, the following issues need to be addressed: electrode patterning, high-dielectric material/barrier interaction, electrode/high-dielectric material interaction, surface roughness (e.g., hilocking, etc.), step coverage, high-dielectric material uniformity (e.g., thickness, composition, grain size/orientation, etc.), and barrier (e.g., $O_2$ and Si diffusion, conductivity, contact resistance and interactions, etc.). Various materials and combinations of materials were studied by Kotecki for use with perovskite dielectrics including the noble metals (i.e., Pt, Ir, Pd) and conductive metal oxides (i.e., $IrO_2$ and $RuO_2$). The work function of these materials, their ability to be patterned by dry etching, the stability of the surface with regards to surface roughening and their suitability in a semiconductor fabricator are listed by Kotecki in the following Table I:

TABLE I

Comparison of the Properties of Various Electrode Materials Suitable for Use with Perovskite Dielectrics

| Material Selection | Work Function | Dry Etch | Surface Stability | Deposition Method |
|---|---|---|---|---|
| Pt | 5.6–5.7 | difficult | potential problem | sputtering |
| Ru | 4.7 | easy/dangerous | potential problem | sputtering |
| $RuO_2$/Ru | | easy/dangerous | good | reactive sputtering |
| Ir | 5.0–5.8 | difficult | good | sputtering |
| $IrO_2$/Ir | | difficult | good | reactive sputtering |
| Pd | 5.1–5.6 | difficult | ? | sputtering |

Kotecki further teaches in the article entitled "High-K Dielectric Materials for DRAM Capacitors" that one of the major problems which needs to be overcome with respect to the manufacturing of DRAM chips using capacitors is the problem of electrode patterning. There are minimal volatile species produced during the dry etching of the noble metal electrodes such as Pt, Ru, Pd and Ir. Since the etch mechanism is primarily by physical sputtering, even during a RIE process, fences are typically formed on the sides of the photoresist. To eliminate the problem of fencing, it is possible to etch the fence layer and erode the sides of the photoresist during the etch process which leads to "clean" metal structures but with sloping sidewall angles and a loss of control over critical feature sizes. As the dimension of the feature shrinks to 0.18 μm or below, only limited tapering of the sidewall angle can be tolerated. Kotecki presents in the following Table II some of the high-dielectric materials which have been considered for use in a DRAM capacitor, the various methods which can be used to form the films, and the range of reported permittivites:

TABLE II

A Comparison of Various High-Dielectric Materials and Method for Formation and Dielectric Constants

| Material | Deposition Methods | $\epsilon_T$(thin films) |
|---|---|---|
| $SrTiO_3$ | MOCVD, ECR-CVD, sol-gel, sputtering, PLD | 90–240 |
| $(Ba, Sr)TiO_3$ | MOCVD, ECR-CVD, sol-gel, sputtering, PLD | 160–600 |

TABLE II-continued

A Comparison of Various High-Dielectric Materials
and Method for Formation and Dielectric Constants

| Material | Deposition Methods | $\epsilon_T$(thin films) |
| --- | --- | --- |
| PLT | MOCVD, sol-gel, sputtering, PLD | 400–900 |
| PZT and PLZT | MOCVD, sol-gel, sputtering, PLD | >1000 |

Milkove et al. reported in a paper entitled "New Insight into the Reactive Ion Etching of Fence-Free Patterned Platinum Structures" at the 43rd Symposium of AVS, October 1996, Philadelphia, Pa., that an investigation was undertaken to characterize the time progression of the Pt etch process during the reactive ion etching (RIE) of fence-free patterned structures. The experiment by Milkove et al. consisted of coprocessing two oxidized Si wafers possessing identical 2500 Å thick Pt film layers, but different photoresist (PR) mask thicknesses. Etching was suspended at 20, 40, 60 and 80% of the full etch process in order to cleave off small pieces of wafer for analysis by a scanning electron microscopy (SEM). Using $Cl_2$-based RIE conditions known to produce fence-free etching for 2500 Å thick film layers, Milkove et al. discovered that a severe fence actually coats the PR mask during the first 20% of the etch process. As the etch continues the fence structure evolves, achieving a maximum height and width followed by progressive recession until disappearing completely prior to process endpoint. The data from Milkove et al. shows that the final profile of an etched Pt structure possess a functional dependence on the initial thickness and slope of the PR mask, as well as on the initial thickness of the Pt layer. Milkove et al. further reported in the paper entitled "New Insight Into The Reactive Ion Etching of Fence-free Patterned Platinum Structures" that the observed behavior of the transient fence provides the strongest evidence to date supporting the existence of a chemically assisted physical sputtering component associated with the RIE of Pt films in halogen-based plasmas.

Keil et al. teaches in an article entitled "The Etching of Platinum Electrodes for PZT Based Ferroelectric Devices", Electrochemical Society Proceedings, Vol. 96-12 (1996), pages 515–520, that the technical difficulties of fabricating capacitors employing platinum Pt etching is most often dominated by sputtering processes. While oxygen and/or various gaseous chlorides or fluorides are used to chemically enhance the etch process, the products of both etch mechanisms are usually of low volatility and tend to redeposit on the wafer. After etching, large wall-like structures extend up from the edges of the Pt region. These wall-like structures are frequently referred to as "veils" or "fences" or "rabbit ears" and can reach lengths which are more than double the thickness of the Pt film to which they are attached. The existence of such structures makes useful deposition of the PZT layer impossible. Keil et al. further teaches that even when one is able to attenuate redeposition to the point where only small "nub" like features are present, the high electric fields which will form at such "nubs" enhances the likelihood for dielectric breakdown. Although process conditions can be found which result in either low redeposition or even no redeposition, they most often also give an unacceptably tapered platinum profile angle. Keil et al. observed that redeposition becomes more severe as process conditions are pushed toward those which give increasingly vertical sidewalls. While a post etch wet clean in a solvent bath is frequently used, the heavy redeposition which attends the pursuit of vertical sidewalls regularly renders this approach minimally effective.

The foregoing prior art illustrates that generally a clean vertical dense area profile and CD (critical dimension) control of the etch profiles are critical factors for successful plasma etching of 1-Gbit (and beyond) DRAM ferroelectric devices possessing platinum electrodes. Redeposition and profile control are found to be strongly interlinked. Optimization of both profile angle and redeposition requires a tradeoff between the two. Where as vigorous post etch cleaning (e.g., wet cleaning with acid, mechanical polishing, etc.) can relieve some of the need to achieve a deposition free plasma etch, such post etch cleaning does not possess the accuracy that is desired as the platinum electrode itself is typically eroded and/or deteriorated by currently known post etch cleaning methods.

Therefore, what is needed and what has been invented is a method for etching a noble metal (e.g., platinum, iridium, ruthenium, etc. and oxides and/or alloys of noble metals) electrode layer to produce a high density integrated circuit semiconductor device having noble metal (e.g., platinum, iridium, ruthenium, etc. and oxides and/or alloys of noble metals) electrodes with a high degree (i.e., ≧85°) of noble metal (e.g., platinum or iridium) profile anisotropy. Masking methods and etching sequences are provided to assist for plasma etching of noble metal. What is further needed and what has been invented is a semiconductor device including a plurality of platinum or iridium electrodes having a platinum or iridium profile equal to or greater than about 85° and separated by a distance equal to or less than about 0.35 µm, preferably equal to or less than about 0.3 µm, with each electrode having a critical dimension (e.g., a width) equal to or less than about 0.35 µm, preferably equal to or less than about 0.3 µm.

SUMMARY OF THE INVENTION

The present invention broadly provides a method of etching a platinum layer disposed on a substrate comprising the steps of:
  a) providing a substrate supporting a platinum layer;
  b) heating the substrate (such as with a pedestal supporting the substrate) of step (a) to a temperature greater than about 150° C.; and
  c) etching the platinum layer including employing a high density plasma of an etchants gas comprising a halogen-containing gas (e.g., a halogen such as chlorine) and a noble gas (e.g., argon) to produce the substrate supporting at least one etched platinum layer.

In another embodiment of the present invention, the present invention broadly provides:
  a) providing a substrate supporting an iridium layer;
  b) heating the substrate of step (a) to a temperature greater than about 150° C.; and
  c) etching the iridium layer including employing a high density plasma of an etchants gas comprising a halogen-containing gas, and a noble gas to produce said substrate supporting at least one etched iridium layer. The etchants gas may additionally include a gas selected from the group consisting of $O_2$ and $BCl_3$. Alternatively, the etchants gas may additionally include a gas selected from the group consisting of $O_2$, HCl, HBr, and mixtures thereof. The substrate of step (a) may be heated by heating the pedestal supporting the substrate to a sufficient temperature to cause the substrate to possess a temperature greater than about 150° C.

In the foregoing methods, the platinum layers are preferably a platinum electrode layer and an iridium electrode layer, respectively. The high density plasma of an etchants gas is a plasma of an etchants gas having an ion density greater than about $10^9/cm^3$, preferably greater than about $10^{11}/cm^3$. The etchants gas may also include a gas selected from the group consisting of $BCl_3$, HBr, $SiCl_4$ and mixtures thereof. The platinum layer and the iridium layer may each additionally comprise a mask layer disposed on a selected part of the particular respective layer to selectively protect the particular respective layer during the etching step above. In the embodiment of the present invention for etching iridium, if the mask layer is a hard mask layer comprising Ti and/or TiN, the etchants gas having $Ar/Cl_2/O_2$ chemistry with high $O_2$ concentration produces an iridium to Ti and/or TiN selectivity of greater than about 8 (preferably greater than about 10) during etching of iridium. The platinum layer and the iridium layer may each also additionally comprise a protective layer disposed on the selected part of the particular respective layer between the mask layer and the particular respective layer. The mask layer may be removed during or after the etching step. Similarly, the protective layer may be removed during or after the etching step.

The platinum layer is part of or is contained in a platinum wafer, and the method of etching a platinum layer additionally comprises disposing the platinum wafer including the platinum layer in a high density plasma chamber having a coil inductor and a wafer pedestal; and performing the etching step in the high density plasma chamber under the following process conditions:

| Process | Parameters |
| --- | --- |
| Etchant Gas Flow | 50 to 500 sccm |
| Halogen Gas (e.g., $Cl_2$) | 20% to 95% by vol. |
| Noble Gas (e.g., Ar) | 5% to 80% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Platinum Wafer | 150° to 500° C. |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz |

In another embodiment of the present invention, there is broadly provided a method of etching a platinum electrode layer disposed on a substrate comprising the steps of:

(a) providing a substrate supporting a platinum electrode layer;

(b) heating said substrate of step (a) to a temperature greater than about 150° C.; and (c) etching said platinum electrode layer in a plasma of an etchants gas comprising nitrogen and a halogen (e.g., chlorine) to produce said substrate supporting at least one etched platinum electrode layer. The plasma may be a low density plasma or a high density plasma and the etchants gas may additionally comprise a gas selected from the group consisting of a noble gas (e.g., argon), HBr, $BCl_3$, $SiCl_4$, and mixtures thereof.

In another embodiment of the present invention, the etching step (c) may be performed in a low density (or high density) plasma chamber under the following process conditions:

| Process | Parameters |
| --- | --- |
| Etchant Gas Flow | 50 to 500 sccm |
| Halogen Gas (e.g., Cl) | 40% to 90% by vol. |
| Noble Gas (e.g., Ar) | 0.1% to 40% by vol. |
| Nitrogen gas | 0.1% to 60% by vol. |
| Pressure, mTorr | 0.1 to 500 milliTorr |
| RF Power (watts) of Coil Inductor* | 0 to 5000 watts |
| RF Power (watts) of Wafer Pedestal | 100 to 5000 watts |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz |

*If 0 watts is employed or indicated for the coil inductor, 0 watts indicates that an RIE chamber is being used.

The etched platinum layer includes a platinum profile equal to or greater than about 80°, preferably equal to or greater than about 85°, more preferably equal to or greater than about 87°, most preferably equal to or greater than about 88.5°. In one embodiment of the invention, the etchants gas for the process conditions immediately above may alternatively comprise from about 10% to about 90% by vol. of a halogen (e.g., $Cl_2$), from about 5% to about 80% by vol. of a noble gas (e.g., argon), and from about 4% to about 25% by vol. HBr and/or $BCl_3$. In another embodiment of the invention, the etchants gas may alternatively comprise from about 0.1% to about 60% by volume nitrogen, from about 40% to about 90% by volume of a halogen (e.g., $Cl_2$), from about 0.1% to about 40% by volume of a noble gas (e.g., argon), and from about 1% to about 30% by volume of a gas selected from the group of combining HBr, $BCl_3$, $SiCl_4$, and mixtures thereof.

The iridium layer is part of or is contained in an iridium wafer, and the method of etching an iridium layer additionally comprises disposing the iridium wafer including the iridium layer in a high density plasma chamber having a coil inductor and a wafer pedestal; and performing the etching step (c) in the high density plasma chamber under the following process conditions:

| Process | Parameters |
| --- | --- |
| Etchant Gas Flow | 50 to 500 sccm |
| Halogen Gas (e.g., $Cl_2$) | 10% to 60% by vol. |
| Noble Gas (e.g., Ar) | 30% to about 80% by vol. |
| Oxygen | 5% to 40% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Iridium Etch Rate (Å/min) | 200 to 6000 Å/min |
| RF Frequency of Coil Inductor | 100K to 300 MHz |
| RF Frequency of Wafer Pedestal | 100K to 300 MHz |

The etched iridium layer includes an iridium profile equal to or greater than about 80°, more preferably equal to or greater than about 82°, most preferably equal to or greater than about 85.0°. The etchants gas for the process conditions immediately above may alternatively comprise from about 5% to about 20% by vol. oxygen, from about 10% to about 60% by vol. of a halogen (e.g., $Cl_2$), from about 30% to about 80% by vol. of a noble gas (e.g., argon), and from about 5% to about 20% by vol. HBr and/or HCl.

The present invention also broadly provides a method for producing a capacitance structure including an electrode (i.e., a platinum electrode or an iridium electrode layer) comprising the steps of:

a) providing a substrate supporting a layer (i.e., a platinum electrode layer or an iridium electrode layer), and at least one mask layer disposed on a selected part of said layer;

b) heating the substrate of step (a) to a temperature greater than about 150° C.; and c) etching the layer including employing a plasma of an etchants gas comprising a halogen (e.g., chlorine) and a noble gas (e.g., argon) to produce a capacitance structure having at least one electrode (i.e., the platinum electrode or iridium electrode). The etchants gas may also comprise nitrogen.

The at least one mask layer is removed during or after the etching step (c) immediately above. The layer of step (a) immediately above may additionally comprise a protective layer disposed on the selected part of the layer between the mask layer and the layer. The etched layer (i.e., the etched platinum layer or the etched iridium layer) produced by the etching step (c) immediately above includes a profile (i.e., a platinum profile or an iridium profile) equal to or greater than about 80° (particularly for iridium), preferable equal to or greater than about 85°, more preferably equal to or greater than about 87°, most preferably equal to or greater than about 88.5°. In one embodiment of the invention, the etchants gas of the plasma of step (c) more specifically includes a halogen (e.g., chlorine), a noble gas (e.g., argon), and a gas selected from the group consisting of HBr, $BCl_3$ and mixtures thereof. Alternatively, the etchants gas of the plasma of step (c) includes nitrogen ($N_2$) and a halogen (e.g., chlorine). In another embodiment of the invention, the etchants gas of the plasma of step (c) more specifically includes nitrogen ($N_2$), a halogen (e.g., chlorine), a noble gas (e.g., argon), and a gas selected from the group consisting of HBr, $BCl_3$, $SiCl_4$, and mixtures thereof. The platinum electrode layer is part of or is contained in a platinum electrode wafer, and the method for producing a capacitance structure including a platinum electrode layer additionally comprises disposing, prior to the etching step (c), the platinum electrode wafer in a high density plasma chamber having a coil inductor and a wafer pedestal; and performing the etching step (c) in the high density plasma chamber under the following previously indicated process conditions:

| Process | Parameters |
| --- | --- |
| Etchant Gas Flow | 50 to 500 sccm |
| Halogen Gas (e.g., $Cl_2$) | about 10% to about 90% by vol. |
| Noble Gas (e.g., Ar) | about 5% to about 80% by vol. |
| HBr and/or $BCl_3$ | about 4% to about 25% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Platinum Electrode Wafer | about 150° to about 500° C. |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz |

The produced platinum electrodes are separated by a distance or space having a dimension equal to or less than about 0.35 µm, preferably equal to or less than about 0.3 µm. Each of the platinum electrodes include a dimension having a value equal to or less than about 0.6 µm, preferably equal to or less than about 0.35 µm, more preferably equal to or less than about 0.3 µm. More preferably, each of the platinum electrodes have a width equal to or less than about 0.35 µm, preferably equal to or less than about 0.3 µm, a length equal to or less than about 1.0 µm, preferably equal to or less than about 0.6 µm, and a height equal to or less than about 0.6 µm. The plasma of the etchants gas for etching any of the metals of any of the embodiments of the present invention comprises a high density inductively coupled plasma. The etchants gas preferably comprises a noble gas selected from the group consisting of helium, neon, argon, krypton, xenon, radon, and mixtures thereof. More preferably, the noble gas is selected from the group consisting of helium, neon, argon, and mixtures thereof. Most preferably, the noble gas is argon. As was previously indicated, the etchants gas of the high density inductively coupled plasma most preferably comprises, or preferably consists of or consists essentially of, chlorine, argon, and $BCl_3$ and/or HBr.

In a preferred embodiment of the invention for etching iridium, the etchants gas of the plasma of step (c) more specifically includes oxygen, a halogen (e.g., chlorine), a noble gas (e.g., argon), and a gas selected from the group consisting of HBr, HCl and mixtures thereof. The iridium electrode layer is part of or is contained in an iridium electrode wafer, and the method for producing a capacitance structure including an iridium electrode layer additionally comprises disposing, prior to the etching step (c), the iridium electrode wafer in a high density plasma chamber having a coil inductor and a wafer pedestal; and performing the etching step (c) in the high density plasma chamber under the following previously indicated process conditions:

| Process | Parameters |
| --- | --- |
| Etchant Gas Flow | 50 to 500 sccm |
| Oxygen | about 5% to about 20% by vol. |
| Halogen Gas (e.g., $Cl_2$) | about 10% to about 60% by vol. |
| Noble Gas (e.g., Ar) | about 30% to about 80% by vol. |
| HBr and/or HCl | about 5% to about 20% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Iridium Electrode Wafer | about 150° to about 500° C. |
| Iridium Etch Rate (Å/min) | 200 to 6000 Å/min |
| RF Frequency of Coil Inductor | 100K to 300 MHz |
| RF Frequency of Wafer Pedestal | 100K to 300 MHz |

The plasma of the etchants gas for etching iridium comprises a high density inductively coupled plasma. The etchants gas preferably comprises a noble gas selected from the group consisting of helium, neon, argon, krypton, xenon, radon, and mixtures thereof. More preferably, the noble gas is selected from the group consisting of helium, neon, argon, and mixtures thereof. Most preferably, the noble gas is argon. As was previously indicated, the etchants gas of the high density inductively coupled plasma for etching iridium most preferably comprises, or preferably consists of or consists essentially of, chlorine, argon, and oxygen or $BCl_3$; alternatively, oxygen, chlorine, argon, and HCl and/or HBr.

The present invention further broadly provides a method of manufacturing a semiconductor device comprising the steps of:

a) forming a patterned resist layer, a mask layer and an electrode layer (e.g., a platinum electrode layer or an iridium electrode layer) on a substrate having circuit elements formed thereon;

b) etching a portion of the mask layer including employing a plasma of an etchants gas to break through and to remove the portion of the mask layer from the electrode layer to produce the substrate supporting the patterned resist layer, a residual mask layer, and the electrode layer;

c) removing the resist layer of step (b) to produce the substrate supporting the residual mask layer and the electrode layer;

d) heating the substrate of step (c) to a temperature greater than about 150° C.; and e) etching the electrode layer of step (d) including employing a high density plasma of an etchants gas. In the embodiment of the invention for etching a platinum layer, the etchants gas preferably comprises a halogen gas (e.g., chlorine) and a noble gas (e.g., argon) to produce a semiconductor device having at least one platinum electrode. In the embodiment of the invention for etching an iridium layer, the etchants gas comprises oxygen, a halogen gas (e.g., chlorine) and a noble gas (e.g., argon) to produce a semiconductor device having at least one iridium electrode.

The present invention also further broadly provides a method of etching an electrode layer (e.g. a noble metal) disposed on a substrate comprising the steps of:

a) providing a substrate (e.g., a $SiO_2$ substrate) supporting an electrode layer (e.g., a noble metal including a platinum electrode layer or an iridium electrode layer), a protective layer (e.g., TiN and/or Ti) on the electrode layer, and a mask layer (e.g., BSG oxide, BPSG oxide, PSG oxide, $Si_3N_4$, TEOS, CVD $SiO_2$, and mixtures thereof) on the protective layer, and a patterned resist layer on the mask layer;

b) etching a portion of the mask layer including employing a plasma of an etchants gas to break through and to remove the portion of the mask layer from the protective layer to expose part of the protective layer and to produce the substrate supporting the electrode layer, the protective layer on the electrode layer, a residual mask layer on the electrode layer, and the patterned resist layer on the residual mask layer;

c) removing the patterned resist layer from the residual mask layer of step (b) to produce the substrate supporting the electrode layer, the protective layer on the electrode layer, and the residual mask layer on the protective layer;

d) heating the substrate of step (c) to a temperature greater than about 150° C.;

e) etching the exposed part of the protective layer to expose part of the electrode layer and to produce the substrate supporting the electrode layer, a residual protective layer on the electrode layer, and the residual mask layer on the residual protective layer; and f) etching the exposed part of the electrode layer of step (e) including employing a high density plasma of an etchants gas. If the electrode layer being etched comprises a platinum, the etchants gas comprises a halogen gas (e.g., chlorine) and a noble gas (e.g., argon) to produce the substrate supporting an etched platinum electrode layer having the residual protective layer on the etched platinum layer, and the residual mask layer on the residual protective layer. If the electrode layer being etched includes iridium, the etchants gas comprises oxygen, a halogen gas (e.g., chlorine) and a noble gas (e.g., argon) to produce the substrate supporting an etched iridium electrode layer having the residual protective layer on the etched iridium electrode layer, and the residual mask layer on the residual protective layer.

The patterned resist layer is removed from the residual mask layer before heating the substrate to a temperature greater than about 150° C. because such high temperatures would destroy the resist layer. The residual mask layer may be removed from the electrode layer either before or after heating of the substrate to a temperature greater than about 150° C., and during or after the etching step. The electrode layer (e.g., the noble metal including a platinum electrode layer or an iridium electrode layer) is part of or is contained in a wafer (e.g., the noble metal including a platinum electrode wafer or an iridium electrode wafer). The purpose of the protective layer is to ensure the adhesion between the mask layer and the electrode layer (e.g., the profile of a platinum electrode layer or the profile of an iridium electrode layer), and also to maintain the profile of the layer (e.g., a platinum electrode layer or an iridium electrode layer), especially during the etching process of the present invention. Preferably, the residual protective layers are removed from the etched layer (e.g., etched platinum layer and/or etched iridium layer), after the etching step (e.g., the platinum etching step or the iridium etching step).

In another embodiment of the present invention, one or more barrier layers may be disposed on the substrate to separate the electrode layer (e.g. a noble metal layer) from the substrate. The barrier layer may include TiN and/or Ti and/or BST (barium titanate and/or strontium titanate) and/or $Si_3N_4$. The barrier layer may also include two or more barrier layers such as a SiN-containing layer (e.g., $Si_3N_4$) disposed on the substrate and a barrier protective layer (e.g., TiN and/or Ti) disposed on the SiN-containing layer. Optionally, the electrode layer (e.g. the noble metal layer) may not have a protective layer disposed thereon but may directly support and contact a mask layer, such as a SiN-containing layer (e.g., $Si_3N_4$).

In another embodiment of the present invention there is provided a method of etching a noble metal (Pt, Ir, Ru, Pd etc.) layer disposed on a substrate comprising the steps of:

a) providing a substrate supporting a barrier layer (e.g., TiN, TiSiN, Ti, WN, TaN, TaSiN, Ta), a noble metal (e.g., Pt, Ir, Pd, Ru, etc.) layer on the barrier layer, a protective layer (e.g., TiN, TiSiN, Ti, WN, TaN, TaSiN, Ta) on the noble metal layer, a mask layer, preferably a mask layer having a thickness ranging from about 6000 Å to about 9,000 Å, on the protective layer, and a patterned resist layer on the mask layer;

b) etching a portion of the mask layer including employing a plasma of a mask etchants gas to break through and to remove the portion of the mask layer from the protective layer to expose part of the protective layer and to produce the substrate supporting the barrier layer, the noble metal layer on the barrier layer, the protective layer on the noble metal layer, a residual mask layer on the protective layer, and the patterned resist layer on the residual mask layer;

c) removing the patterned resist layer from the residual mask layer of step (b) to produce the substrate supporting the barrier layer, the noble metal layer on the barrier layer, the protective layer on the noble metal layer, and the residual mask layer on the residual protective layer;

d) etching the exposed part of the protective layer to expose part of the noble metal layer and to produce the substrate supporting the barrier layer, the noble metal layer on the barrier layer, a residual protective layer on the noble metal layer, and the residual mask layer on the residual protective layer;

e) heating the substrate of step (d) to a temperature greater than about 150° C.;

f) etching the exposed part of the noble metal layer of step (d) including employing plasma of an etchants gas selected from the group consisting of a halogen-containing gas, a noble gas, nitrogen, oxygen, and mixtures thereof, to produce the substrate supporting the barrier layer, an etched noble metal layer on the barrier layer, the residual protective layer on the etched noble metal layer, and the residual mask layer on the residual protective layer;

g) removing the residual mask layer from the residual protective layer to produce the substrate supporting the barrier layer, the etched noble metal layer on the barrier layer, and the residual protective layer on the etched noble metal layer; and h) etching a portion of the barrier layer including employing a plasma of a barrier etchants gas to expose part of the substrate to produce the substrate supporting a residual barrier layer, the etched noble metal layer on the residual barrier layer, and the residual protective layer on the etched noble metal layer. The step (f) etching of the noble metal layer of step (d) additionally produces a remaining noble metal layer on the barrier layer. The step (g) removing of the residual mask layer additionally produces the remaining noble metal layer on the barrier layer, and the method additionally comprises etching the remaining noble metal layer on the barrier layer prior to the step (h) etching. The mask layer comprises a compound selected from the group consisting of BSG oxide, PSG oxide, $Si_3N_4$, TEOS, CVD $SiO_2$, a low dielectric constant material with a dielectric constant of less than 3.0, and mixtures thereof. The foregoing method may be conducted without the protective layer. The foregoing method may also be conducted by etching the barrier layer prior to removing the residual mask layer. Thus, after etching step (f) wherein the exposed part of the noble metal layer of step (d) is etched, the method of etching a noble metal layer disposed on a substrate would comprise the following step (g) and step (h): (g) etching a portion of the barrier layer including employing a plasma of a barrier etchants gas to expose part of the substrate to produce the substrate supporting a residual barrier layer, the etched noble metal layer on the residual barrier layer, the residual protective layer on the etched noble metal layer, and the residual mask layer on the residual protective layer; and (h) removing the residual mask layer from the residual protective layer to produce the substrate supporting the residual barrier layer, the etched noble metal layer on the residual barrier layer, and the residual protective layer on the etched noble metal layer.

Thus further, in another embodiment of the present invention there is provided a method of etching a noble metal (Pt, Ir, Ru, Pd etc.) layer disposed on a substrate comprising the steps of:

a) providing a substrate supporting an etch-stop layer (e.g., $Si_3N_4$, $TiO_2$, $RuO_2$, and $IrO_2$), a barrier layer on the etch-stop layer, a noble metal layer on the barrier layer, a protective layer on the noble metal layer, a mask layer, preferably a mask layer having a thickness ranging from about 6000 Å to about 9000 Å, on the protective layer, and a patterned resist layer on the mask layer;

b) etching a portion of the mask layer including employing a plasma of a mask etchants gas to break through and to remove the portion of the mask layer from the protective layer to expose part of the protective layer and to produce the substrate supporting the etch-stop layer, the barrier layer on the etch-stop layer, the noble metal layer on the barrier layer, the protective layer on the noble metal layer, a residual mask layer on the protective layer, and the patterned resist on the residual mask layer;

c) etching the exposed part of the protective layer to expose part of the noble metal layer and to produce the substrate supporting the etch-stop layer, the barrier layer on the etch-stop layer, the noble metal layer on the barrier layer, a residual protective layer on the noble metal layer, the residual mask layer on the residual protective layer, and the patterned resist layer on the residual mask layer;

d) removing the patterned resist layer from the residual mask layer of step (c) to produce the substrate supporting the etch-stop layer, the barrier layer on the etch-stop layer, the noble metal layer on the barrier layer, the residual protective layer on the noble metal layer, and the residual mask layer on the residual protective layer;

e) heating the substrate of step (d) to a temperature greater than about 150° C.;

f) etching the exposed part of the noble metal layer of step (d) including employing a plasma of an etchants gas selected from the group consisting of a halogen-containing gas, a noble gas, nitrogen, oxygen, and mixtures thereof, to expose part of the barrier layer and to produce the substrate supporting the etch-stop layer, the barrier layer on the etch-stop layer, an etched noble metal layer on the barrier layer, the residual protective layer on the etched noble metal layer, and the residual mask layer on the residual protective layer;

g) removing the residual mask layer from the residual protective layer to produce the substrate supporting the etch-stop layer, the barrier layer on the etch-stop layer, the etched noble metal layer on the barrier layer and the residual protective layer on the etched noble metal layer; and h) etching the residual protective layer for removing the residual protective layer from the etched noble metal layer to produce the substrate supporting the etch-stop layer, the barrier layer on the etch-stop layer, and the etched noble metal layer on the barrier layer. The foregoing method may be conducted without the protective layer. The method of etching additionally comprises etching the exposed part of the barrier layer to expose part of the etch-stop layer to produce the substrate supporting the etch-stop layer, a residual barrier layer on the etch-stop layer, and the etched noble metal layer on the residual barrier layer.

In another embodiment of the present invention, there is further provided a method of etching a noble metal (Pt, Ir, Ru, Pd etc.) layer disposed on a substrate comprising the steps of:

a) providing a substrate supporting an etch-stop layer, a barrier layer on the etch-stop layer, a noble metal layer on the barrier layer, a mask layer on the noble metal layer, and a patterned resist layer on the mask layer;

b) etching a portion of the mask layer including a plasma of a mask-etchants gas to break through and to remove the portion of the mask layer from the noble metal layer to expose part of the noble metal layer and to produce the substrate supporting the etch-stop layer, the barrier layer on the etch-stop layer, the noble metal layer on the barrier layer, a residual mask layer on the noble metal layer, and the patterned resist layer on the residual mask layer;

c) removing the patterned resist layer from the residual mask layer of step (b) to produce the substrate supporting the etch-stop layer, the barrier layer on the etch-stop layer, the noble metal layer on the barrier layer, the residual mask layer on the noble metal layer;

d) heating the substrate of step (c) to a temperature greater than about 150° C.;

e) etching the exposed part of the noble metal layer of step (b) including employing a plasma of an etchants gas selected from the group consisting of a halogen-containing gas, a noble gas, $N_2$, $O_2$, and mixtures thereof, to expose part of the barrier layer and to produce the substrate supporting the etch-stop layer, the barrier layer on the etch-stop layer, an etched noble metal layer on the barrier layer, and the residual mask layer on the etched noble metal layer; and f) removing the residual mask layer from the etched noble metal layer to produce the substrate supporting the etch-stop layer, the barrier layer on the etch-stop layer, and the etched noble metal layer on the barrier layer. The method of etching additionally includes etching the exposed part of the barrier layer, preferably prior to the removing step (f), to expose part of the etch-stop layer to produce the substrate supporting the etch-stop layer, a residual barrier layer on the etch-stop layer, and the etched noble metal layer on the residual barrier layer.

Also provided in accordance with an embodiment of the present invention is a method of etching a noble metal layer disposed on a substrate comprising the steps of:

a) providing a substrate supporting a barrier layer, a noble metal layer on the barrier layer, a first mask layer on the noble metal layer, a second mask layer on the first mask layer, and a patterned resist layer on the second mask layer;

b) etching a portion of the second mask layer including employing a plasma of a mask etchants gas to break through and to remove the portion of the second mask layer from the first mask layer to expose part of the first mask layer and to produce the substrate supporting the barrier layer, the noble metal layer on the barrier layer, the first mask layer on the noble metal layer, a residual second mask layer on the first mask layer, and the patterned resist layer on the residual second mask layer;

c) etching the exposed part of the first mask layer to expose part of the noble metal layer and to produce the substrate supporting the barrier layer, the noble metal layer on the barrier layer, a residual first mask layer on the noble metal layer, the residual second mask layer on the residual first mask layer, and the patterned resist layer on the residual second mask layer;

d) removing the patterned resist layer from the residual second mask layer of step (c) to produce the substrate supporting the barrier layer, the noble metal layer on the barrier layer, and the residual first mask layer on the noble metal layer, and the residual second mask layer on the first residual mask layer;

e) heating the substrate of step (d) to a temperature greater than about 150° C.;

f) etching the exposed part of the noble metal layer and said residual second mask layer of step (d) including employing a plasma of an etchants gas selected from the group consisting of a halogen containing gas, a noble gas, nitrogen, oxygen, and mixtures thereof, to produce the substrate supporting the barrier layer, an etched noble metal layer on the barrier layer, and the residual first mask layer on the etched noble metal layer;

g) etching the barrier layer to remove a portion of the barrier layer from the substrate to produce the substrate supporting a residual barrier layer, the etched noble metal layer on the residual barrier layer, and the residual first mask layer on the etched noble metal; and h) removing the residual first mask layer from the etched noble metal layer to produce the substrate supporting the residual barrier layer, and the etched noble metal layer on the residual barrier layer. Preferably, the residual second mask layer in step(f) is removed and/or etched simultaneously with the step(f) etching and/or removal of the exposed part of the noble metal layer. The patterned resist layer may be removed from the residual second mask layer during the etching step (c). The etching step (h) additionally comprises etching into the substrate. The first mask layer comprises a compound selected from the group consisting of $Si_3N_4$, BSG, PSG, BPSG, an organic polymer, a low dielectric constant material having a dielectric constant of less than about 3.0, and mixtures thereof. The second mask layer comprises a compound selected from the group consisting of CVD $SiO_2$, TEOS, $Si_3N_4$, BSG, PSG, BPSG, SiC, and mixtures thereof. The first mask layer has a thickness ranging from about 3000 Å to about 8000 Å, and the second mask layer has a thickness ranging from about 500 Å to about 4000 Å.

As previously indicated, etching of the platinum electrode layer to produce the platinum electrodes of the present invention is preferably performed in a high density plasma chamber. The platinum etching step employs a high density plasma of an etchants gas preferably consisting of, or consisting essentially of, a halogen gas (e.g., chlorine), a noble gas (i.e., argon) and HBr and/or $BCl_3$. The high density plasma chamber possesses a separate control for ion flux and a separate control for ion energy. As previously indicated, the ion density of the high density plasma in the high density plasma chamber is greater than about $10^9/cm^3$.

The high density plasma chamber for the method of manufacturing a semiconductor device and for the method of etching a platinum electrode layer disposed on a substrate includes a coil inductor and a wafer pedestal; and the platinum etching step in both of the methods is performed in the high density plasma chamber under the following previously mentioned process conditions:

| Process | Parameters |
| --- | --- |
| Etchant Gas Flow | 50 to 500 sccm |
| Halogen Gas (e.g., $Cl_2$) | about 10% to about 90% by vol. |
| Noble Gas (e.g., argon) | about 5% to about 80% by vol. |
| HBr and/or $BCl_3$ | about 4% to about 25% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Platinum Electrode Wafer | about 150° to about 500° C. |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz |

In another embodiment of the present invention, the etching step may be performed in a low density (or high density) plasma chamber under the following process conditions:

| Process | Parameters |
| --- | --- |
| Etchant Gas Flow | 35 to 900 sccm |
| Halogen Gas (e.g., $Cl_2$) | 10% to 90% by vol. |
| Noble Gas (e.g., argon) | 0% to 20% by vol. |
| Nitrogen gas | 10% to 80% by vol. |
| HBr and/or $BCl_3$ and/or $SiCl_4$ | 0% to 25% by vol. |
| Pressure, mTorr | 0.1 to 2000 milliTorr |
| RF Power (watts)* of Coil Inductor | 0 to 5000 watts |
| RF Power (watts) of Wafer Pedestal | 100 to 5000 watts |

-continued

| Process | Parameters |
| --- | --- |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz |

*If 0 watts is used for coil inductor, it implies an RIE chamber.

As further previously indicated, etching of the iridium electrode layer to produce the iridium electrodes of the present invention is performed in a high density plasma chamber. The iridium etching step employs a high density plasma or a low density plasma of an etchants gas preferably consisting of, or consisting essentially of, or consisting essentially of, a halogen gas (e.g., chlorine) and a noble gas (i.e., argon), more preferably a halogen gas (e.g., chlorine), a noble gas (i.e., argon) and oxygen or $BCl_3$, or oxygen ($O_2$), a halogen gas (e.g., $Cl_2$), a noble gas (e.g., Ar), and HCl and/or HBr. The high density plasma chamber possesses a separate control for ion flux and a separate control for ion energy. As previously indicated, the ion density of the high density plasma in the high density plasma chamber is greater than about $10^9/cm^3$.

The high density plasma chamber for the method of manufacturing a semiconductor device and for the method of etching an iridium electrode layer disposed on a substrate includes a coil inductor and a wafer pedestal; and the iridium etching step in both of the methods is performed in a high density plasma chamber under the following previously mentioned process conditions:

| Process | Parameters |
| --- | --- |
| Etchant Gas Flow | 50 to 500 sccm |
| Oxygen | 5% to 20% by volume |
| Halogen Gas (e.g., $Cl_2$) | about 10% to about 60% by vol. |
| Noble Gas (e.g., argon) | about 30% to about 80% by vol. |
| HBr and/or HCl | about 5% to about 20% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Iridium Electrode Wafer | about 150° to about 500° C. |
| Iridium Etch Rate (Å/min) | 200 to 6000 Å/min |
| RF Frequency of Coil Inductor | 100K to 300 MHz |
| RF Frequency of Wafer Pedestal | 100K to 300 MHz |

The present invention also provides a method of processing a layer on a substrate comprising the steps of:
a) providing a substrate;
b) disposing the substrate in a reactor chamber comprising a dielectric window including a deposit-receiving surface having a peak-to-valley roughness height with an average height value of greater than about 1000 Å;
c) introducing a processing gas into the reactor chamber of step (b); and
d) introducing processing power into the reactor chamber of step (b) to process a layer on the substrate in a plasma of the processing gas.

The present invention further provides a dielectric member comprising a dielectric structure including a surface finish having a peak-to-valley roughness height with an average height value of greater than about 1000 Å. A pedestal assembly is disposed in the processing zone. The chamber assembly also comprises a processing power source; a processing gas-introducing assembly, engaged to the chamber wall, for introducing a processing gas into the processing zone of the chamber wall; and a processing power-transmitting member connected to the processing power source for transmitting power into the processing zone to aid in sustaining a plasma from a processing gas within the processing zone of the processing chamber wall.

The present invention yet also further broadly provides a semiconductor device, more specifically a capacitance structure, comprising a substrate, and at least two noble metal electrodes (e.g., platinum electrodes or iridium electrodes) supported by the substrate. The electrodes have a profile equal to or greater than about 80°, such as equal to or greater than about 85°, preferably equal to or greater than about 87°, more preferably equal to or greater than about 88.5°. The electrodes are separated by a distance or space having a dimension equal to or less than about 0.35 μm, preferably equal to or less than about 0.3 μm. Each of the electrodes include a dimension having a value equal to or less than about 1.0 μm, preferably equal to or less than about 0.6 μm, more preferably equal to or less than about 0.35 μm, most preferably equal to or less than about 0.3 μm. More preferably, each of the electrodes have a width equal to or less than about 0.35 μm, preferably equal to or less than about 0.3 μm, a length equal to or less than about 1.0 μm, preferably equal to or less than about 0.6 μm, and a height equal to or less than about 0.6 μm.

In another preferred embodiment of the present invention, there is provided a method of etching an iridium (i.e., a noble metal layer) layer disposed on a substrate comprising the steps of:
a) providing a substrate supporting an iridium layer;
b) heating the substrate of step (a) of a temperature greater than about 150° C.; and
c) etching the iridium layer including employing a plasma of an etchants gas (i.e., a low density or high density plasma of an etchants gas) comprising a halogen containing gas (e.g., chlorine) and a noble gas (e.g., argon) to produce the substrate supporting at least one etched iridium layer. In one embodiment of the invention, the etchants gas additionally comprises a gas selected from the group consisting of $O_2$ and $BCl_3$. In another embodiment of the invention, the etchants gas additionally comprises a gas selected from the group consisting of $O_2$, HCl, HBr, and mixtures thereof. The halogen containing gas comprises or consists essentially of chlorine and the noble gas comprises or consists essentially of argon. Optionally, the etchants gas comprises or consists essentially of chlorine, argon and $O_2$. The iridium layer of step (a) additionally comprises a mask layer (e.g., a TiN or Ti mask layer) disposed on a selected part of the iridium layer to selectively protect the iridium layer during the etching step (c).

The present invention also provides a method of etching an iridium electrode layer disposed on a substrate comprising the steps of:
a) providing a substrate supporting an iridium electrode layer, a protective layer on the iridium electrode layer, a Ti mask layer on the protective layer, and a patterned resist layer on the mask layer;
b) etching a portion of the Ti mask layer including employing a plasma of an etchants gas to break through and to remove the portion of the Ti mask layer from the iridium electrode layer to expose part of the protective layer and to produce the substrate supporting the iridium electrode layer, the protective layer on the iridium electrode layer, a residual Ti mask layer on the protective layer, and the patterned resist layer on the residual Ti mask layer;

c) removing the patterned resist layer from the residual Ti mask layer of step (b) to produce the substrate supporting the iridium electrode layer, the protective layer on the iridium electrode layer, and the residual mask layer on the protective layer;

d) heating the substrate of step (c) to a temperature greater than about 150° C.;

e) etching the exposed part of the protective layer to expose part of the iridium electrode layer and to produce the substrate supporting the iridium electrode layer, a residual protective layer on the iridium electrode layer, and the residual mask layer on the residual protective layer; and f) etching the exposed part of the iridium electrode layer of step (e) including employing a plasma (e.g., a high density or low density plasma) of an etchants gas comprising oxygen, chlorine and argon to produce the substrate supporting an etched iridium electrode layer having the residual protective layer on the etched iridium electrode layer, and the residual Ti mask layer on the residual protective layer.

The present invention further also provides a method of etching an iridium electrode layer disposed on a substrate comprising the steps of:

a) providing a substrate supporting an iridium electrode layer, a protective layer on the iridium electrode layer, a mask layer on the protective layer, and a patterned resist layer on the mask layer;

b) etching a portion of the mask layer including employing a plasma of an etchants gas to break through and to remove the portion of the mask layer from the iridium electrode layer to expose part of the protective layer and to produce the substrate supporting the iridium electrode layer, the protective layer on the iridium electrode layer, a residual mask layer on the protective layer, and the patterned resist layer on the residual mask layer;

c) etching the exposed part of the protective layer to expose part of the iridium electrode layer and to produce the substrate supporting the iridium electrode layer, a residual protective layer on the iridium electrode layer, the residual mask layer on the residual protective layer, and the patterned resist layer on the residual mask layer;

d) removing the patterned resist layer from the residual mask layer of step (c) to produce the substrate supporting the iridium electrode layer, the residual protective layer on the iridium electrode layer, and the residual mask layer on the residual protective layer;

e) heating the substrate of step (d) to a temperature greater than about 150° C.; and f) etching the exposed part of the iridium electrode layer of step (d) including employing a high density plasma (e.g., a low density or high density plasma) of an etchants gas comprising chlorine and a noble gas to produce the substrate supporting an etched iridium electrode layer having the residual protective layer on the etched iridium electrode layer, and the residual mask layer on the residual protective layer. The etchants gas of step (f) additionally comprises a gas selected from the group consisting of oxygen, HCl, HBr and mixtures thereof. More specifically the etchants gas comprises, preferably consists of or consists essentially of, oxygen, the halogen (i.e., chlorine), the noble gas (i.e., argon), and a gas selected from the group consisting of HBr, HCl and mixtures thereof. The etchants gas more specifically comprises, or consists of or consists essentially of, from about 5% by volume to about 20% by volume oxygen, from about 10% by volume to about 60% by volume of the halogen gas (i.e., chlorine) and from about 30% by volume to about 80% by volume of the noble gas (i.e., argon) and from about 5% by volume to about 20% by volume of HBr and/or HCl; preferably from about 5% by volume to about 15% by volume oxygen, from about 20% by volume to about 50% by volume of the halogen gas (i.e., chlorine) and from about 40% by volume to about 70% by volume of the noble gas (i.e., argon) and from about 5% by volume to about 15% by volume of HBr and/or HCl; and more preferably from about 5% by volume to about 10% by volume oxygen, from about 20% by volume to about 35% by volume of the halogen gas (i.e., chlorine) and from about 40% by volume to about 60% by volume of the noble gas (i.e., argon) and from about 5% by volume to about 10% by volume of HBr and/or HCl. The etchants gas flow rate ranges from about 50 sccm to about 500 sccm.

When the etchants gases are a mixture of oxygen, the halogen gas(es) (i.e., chlorine), the noble gas(es) (i.e., argon), and HBr and/or $BCl_3$, the process parameters for etching an electrode layer in a suitable inductively coupled plasma reactor fall into the ranges as listed below on the basis of rates of the gases, including oxygen, the halogen gas(es) (i.e., $Cl_2$), the noble gas(ses) (i.e., Ar), and HBr and/or HCl.

| Process | Broad | Preferred | Optimum |
|---|---|---|---|
| Gas Flow, sccm | | | |
| $O_2$ | 10 to 60 | 10 to 40 | 15 to 30 |
| $Cl_2$ | 30 to 100 | 30 to 70 | 50 to 70 |
| Ar | 50 to 250 | 100 to 200 | 100 to 150 |
| HBr and/or HCl | 10 to 60 | 10 to 40 | 15 to 30 |
| Pressure, mT | 0.1 to 300 | 10 to 100 | 10 to 40 |
| RE Power of Coil Inductor (Watts) | 100 to 5000 | 650 to 2000 | 750 to 1000 |
| RF Power of Wafer Pedestal (Watts) | 50 to 3000 | 100 to 1000 | 150 to 600 |
| Temperature of Wafer (° C.) | about 150 to about 500 | 200 to 400 | 250 to 350 |
| Etch Rate (Å/mm) | 200 to 6000 | 500 to 3000 | 500 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

The foregoing provisions along with various ancillary provisions and features which will become apparent to those skilled in the art as the following description proceeds, are attained by the practice of the present invention, a preferred embodiment thereof shown with reference to the accompanying drawings, by way of example only, wherein:

DESCRIPTION OF THE PREFERRED EMBODIMENTS OF THE INVENTION

Figure 1:
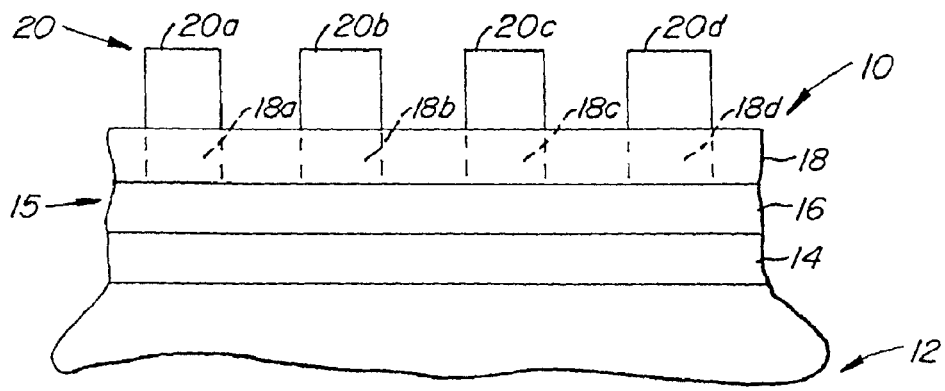
FIG. 1 is a side elevational view of a semiconductor wafer having a semiconductor substrate, a barrier layer disposed on the semiconductor substrate, a platinum electrode layer disposed on the barrier layer, a mask layer disposed on the platinum electrode layer, and a patterned resist disposed on the mask layer.
Figure 25:
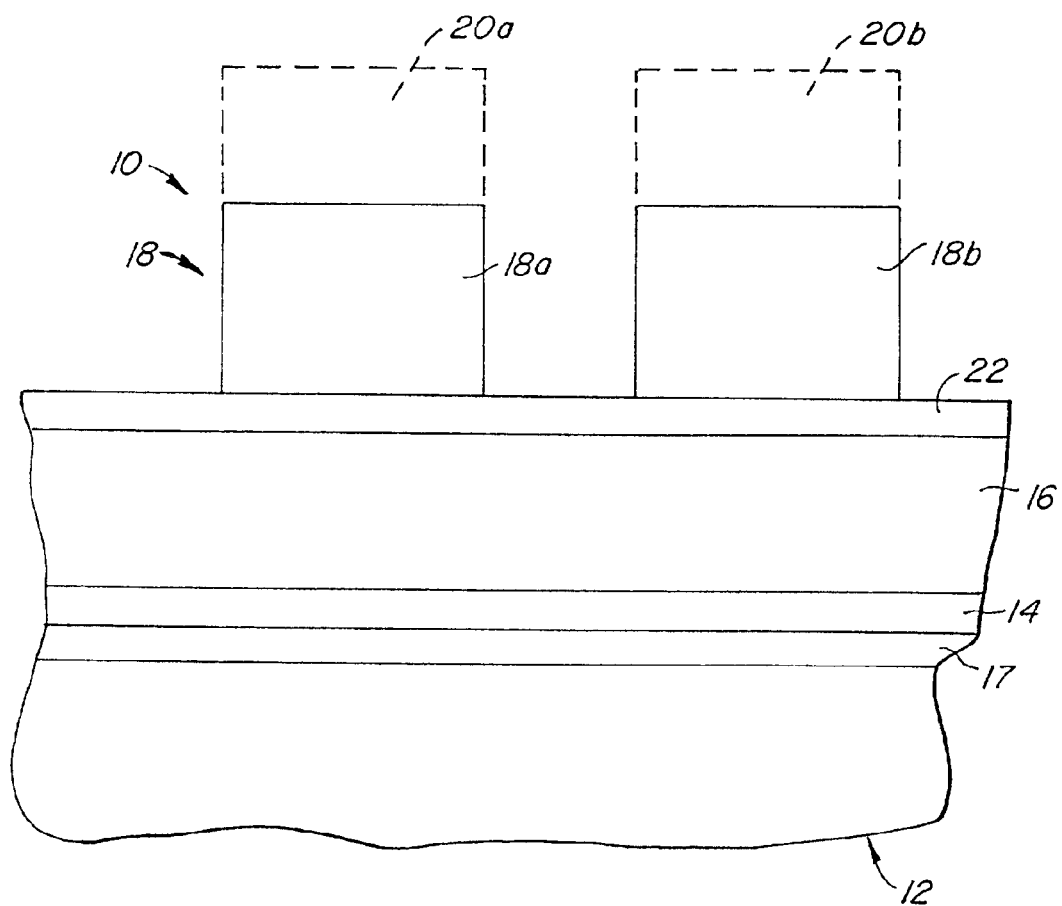
FIG. 25 is a side elevational view of a semiconductor wafer having a semiconductor substrate, an etch-stop layer disposed on the semiconductor substrate, a barrier layer disposed on the etch-stop layer, a platinum electrode layer disposed on the barrier layer, a protective layer disposed on the platinum electrode layer and a patterned mask layer disposed on the protective layer.

Referring in detail now to the drawings wherein similar parts of the present invention are identified by like reference numerals, there is seen in FIG. 1 a wafer, generally illustrated as 10, having a semiconductor substrate, generally illustrated as 12. The semiconductor substrate 12 preferably comprises silicon dioxide ($SiO_2$) and includes regions of circuit elements which do not appear in the drawings, but are well known to those skilled in the art. In another embodiment of the present invention, the semiconductor substrate 12 comprises a compound selected from the group consisting of tetraethylorthosilicate (TEOS), silicon dioxide, and mixtures thereof. A barrier layer 14 is disposed over the semiconductor substrate 12 and a layer (e.g., an electrical conductive layer, such as a noble metal layer [or an oxide or alloy of same] including a platinum layer or an iridium layer, etc.), generally illustrated as 15, is disposed over the barrier layer 14. In another embodiment of the present invention as best shown in FIG. 25, an etch-stop layer 17 is disposed on the semiconductor substrate 12 between the semiconductor substrate 12 and the barrier layer 14. The layer 15 is preferably an electrode layer 16 as shown in FIG. 1. Because the electrode layer 16 is a preferred layer 15, the remaining description of the present invention will use only the term "electrode layer 16" in describing the present invention. However, it is to be understood that wherever "electrode layer 16" is stated hereinafter, it is to also have the equivalence of "layer 15" for purposes of the present invention. It is also to be understood that in one preferred embodiment of the present invention "electrode layer 16" may be a "platinum electrode layer 16" or an "iridium electrode layer 16," unless otherwise indicated. Thus, whenever "platinum electrode layer 16" is stated or mentioned hereinafter for a preferred embodiment of the invention, it is to be understood that the electrode layer 16 includes platinum and the preferred embodiment of the present invention relates to etching platinum to produce the desired features of the present invention as set forth hereinafter. Similarly, whenever "iridium electrode layer 16" is stated or mentioned hereinafter for another preferred embodiment of the present invention, it is to be understood that the electrode layer 16 includes iridium and the preferred embodiment of the present invention relates to etching iridium to produce the desired features of the present invention as set forth hereinafter.

Figure 2:
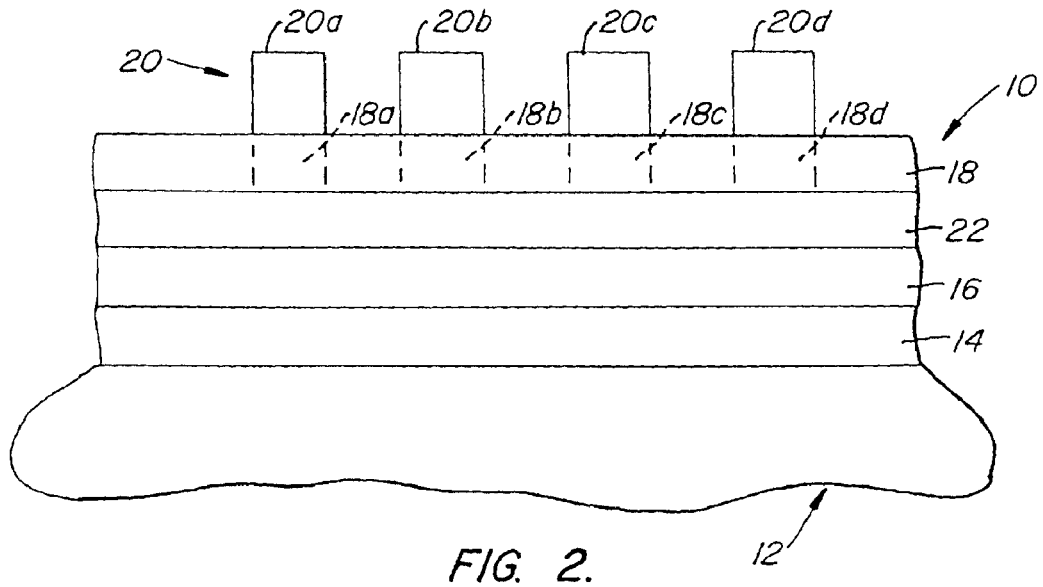
FIG. 2 is a side elevational view of the semiconductor wafer of FIG. 1 additionally including a protective layer disposed on the platinum electrode layer between the mask layer and the platinum electrode layer.

Because the electrode layer 16 easily diffuses or reacts with certain elements (e.g., a poly-Si plug) within the semiconductor substrate 12, the barrier layer 14 is required between the electrode layer 16 and the semiconductor substrate 12. The barrier layer 14 also functions as an adhesive for coupling the semiconductor substrate 12 to the electrode layer 16. A mask 18 is disposed over the electrode layer 16 and a patterned resist (i.e., a photoresist), generally illustrated as 20, is selectively positioned on the mask layer 18 as best shown in FIG. 1. As best shown in FIG. 1, the patterned resist 20 includes a plurality of resist members 20a, 20b, 20c, and 20d. In another preferred embodiment of the invention as shown in FIG. 2, a protective layer 22 is disposed between the electrode layer 16 and the mask layer 18.

The barrier layer 14 may be any suitable layer which is capable of dually functioning as an adhesive and a diffusion barrier to the electrode layer 16. The barrier layer 14 may be of any suitable thickness. Preferably, the barrier layer 14 comprises Ta and/or TaN and/or TaSiN and/or $WN_x$ and/or titanium and/or a titanium alloy, such as TiN and TiSiN, and possesses a thickness ranging from about 50 Angstroms to about 600 Angstroms, more preferably from about 200 Angstroms to about 400 Angstroms, most preferably about 300 Angstroms. In another embodiment of the present invention, the barrier layer 14 comprises BST (i.e., barium titanate ($BaTiO_3$) and strontium titanate ($SrTiO_3$)). Alternatively, the barrier layer 14 may comprise PZT (Pb($Zr_{1-x}Ti_x$)$O_3$) and SBT ($SrBi_2Ti_2O_9$). In this alternate preferred embodiment of the invention, the barrier layer 14 functions as a dielectric for a capacitor. The barrier layer 14 is preferably disposed on the semiconductor substrate 12 by the RF magnetron sputtering method.

The etch-stop layer 17 as best shown in FIG. 25 may be any suitable layer which is capable of functioning as an adhesive, and, optionally, in conjunction with barrier layer 14 being a diffusion barrier to the electrode layer 16. Etch-stop layer 17 may be of any suitable thickness. Preferably, the etch-stop layer 17 comprises a compound selected from the group consisting of silicon nitride ($Si_3N_4$), titanium dioxide ($TiO_2$), ruthenium dioxide ($RuO_2$), iridium dioxide ($IrO_2$), and possesses a thickness ranging from about 50 Angstroms to about 1000 Angstroms, more preferably from about 200 Angstroms to about 700 Angstroms, most preferably from about 300 Angstroms to about 500 Angstroms, e.g., about 400 Angstroms. The etch-stop layer 17 is preferably disposed on the semiconductor substrate 12 by chemical vapor deposition.

The electrode layer 16 may be any suitable one or more noble metal (or oxide or alloy of same), such as platinum or iridium as one preferred electrode material because they are inert to oxidation which tends to occur in the subsequent high temperature processes of depositing the high dielectric constant ferroelectric materials. The electrode layer 16 comprising platinum or iridium is also used as the electrode material because platinum and iridium are good electric conductors. The thickness of the electrode layer 16 would depend upon the end use of the semiconductor or capacitance device which is to contain the electrode layer 16.

Typically, the thickness of the electrode layer 16 ranges from about 500 Angstroms to about 5000 Angstroms, more preferably from about 1000 Angstroms to about 4000 Angstroms, most preferably from about 2000 Angstroms to about 3000 Angstroms, e.g., about 2000 Angstroms. The electrode layer 16 is preferably disposed on the barrier layer 14 by the RF magnetron sputtering method.

The mask layer 18 may be any suitable insulation or metallic material that is capable of being etched in accordance with the procedure described hereinafter such that all traces of the mask layer 18 are essentially removed from the surface platinum electrode layer 16 except that portion (identified as "18a," "18b," "18c," and "18d" below) of the mask layer 18 remaining under the patterned resist 20. The mask layer 18 may also be of any suitable thickness. Preferably, the mask layer 18 comprises silicon dioxide ($SiO_2$) and/or silicon nitride ($Si_3N_4$) or any other suitable dielectric material. The thickness of the mask layer 18 would depend on constituency of the mask layer 18, as well as the constituency of the layer 15 or electrode layer 16. A preferred thickness for the mask layer 18 ranges from about 1,000 Angstroms to about 15,000 Angstroms, more preferably from about 3,000 Angstroms to about 12,000 Angstroms, most preferably from about 6,000 Angstroms to about 9,000 Angstroms, e.g., about 7,000 Angstroms. The ratio of the thickness of the mask layer 18 to the thickness of the layer 15, or the electrode layer 16, ranges from about 0.2 to about 5.0, preferably from about 0.5 to about 4.0, more preferably from about 1.0 to about 3.0. In another embodiment of the present invention, the mask layer 18 comprises a compound selected from the group consisting of organic polymers, chemical vapor deposited (CVD) $SiO_2$, doped CVD $SiO_2$ tetraethyorthosilicate (TEOS), CVD $Si_3N_4$ and mixtures thereof. The organic polymer is a high temperature polymer capable of standing up to 400° C., such as amorphous carbon, polyamide, parylene and aromatic hydrocarbons. A suitable organic polymer has been determined to be an organic polymer sold by Dow Chemical Co. of Midland, Mich., under the registered trademark SiLK®. The doped CVD $SiO_2$ is a CVD $SiO_2$ film having doping gases added to the CVD reactant gases, such as adding phosphorus dopant to form phosphosilicate glass (PSG), adding boron dopant to form borosilicate glass (BSG), or adding both phosphorus and boron dopants to form borophosphosilicate (BGSG). The mask layer 18 is preferably disposed on the platinum electrode layer 16 by chemical vapor deposition.

In another embodiment of the present invention, the mask layer 18 comprises Ti and/or TiN, preferably TiN. As will be further explained below, it has been discovered that etching of an iridium electrode layer 16 superimposed with a mask layer 18 comprising TiN, and in a high density plasma of an etchants gas comprising oxygen, a halogen gas (e.g., $Cl_2$), and a noble gas (e.g., argon), etched iridium electrodes are produced having an iridium profile where the angle α of the associated sidewalls with respect to a horizontal plane is equal to greater than about 80 degrees. A clean iridium surface is produced after removal of the mask layer 18 with no fence or veil formation. It has been further discovered that during etching of the iridium electrode layer 16 in a high density plasma of the etchants gas having a gas chemistry of $O_2$/halogen gas(es)/noble gas(es), with the iridium electrode layer 16 supporting the mask layer 18 comprising TiN, the etch selectivity of iridium to the TiN is greater than about 8.0, preferably greater than about 10.0. It is to be understood that the spirit and scope of the present invention includes etching of a platinum electrode layer 16, or any other noble metal electrode layer 16, while supporting a mask layer 18 comprising TiN, with the etching of the platinum electrode layer 16 being conducted in a high density plasma of an etchants gas comprising oxygen, a halogen gas (e.g., $Cl_2$), and a noble gas (e.g., argon). The thickness for the mask layer 18 for this embodiment of the invention ranges from about 500 Angstroms to about 9000 Angstroms, preferably from about 2000 Angstroms to about 7000 Angstroms, more preferably about 3000 Angstroms. The ratio of the thickness of the mask layer 18 to the thickness of the layer 15, or the electrode layer 16 (e.g. iridium or platinum electrode layer 16), ranges from about 0.2 to about 5.0, preferably from about 0.5 to about 4.0, more preferably from about 1.0 to about 3.0. The mask layer 18 is preferably disposed on the electrode layer 16 by chemical vapor deposition.

The patterned resist 20 (i.e., the photoresist 20, including resist members 20a, 20b, 20c and 20d) may be any suitable layer of material(s) that is capable of protecting any underlying material (e.g., the mask layer 18) from being etched during the etching process of the present invention. Suitable materials for the patterned resist 20 include resist systems consisting of novolac resin and a photoactive dissolution inhibitor (all based on Süiss's discovery). Other suitable materials for the resist 20 are listed in an article from the July 1996 edition of Solid State Technology entitled "Deep-UV Resists: Evolution and Status" by Hiroshi Ito. The patterned resist 20 may have any suitable thickness; preferably, the thickness of the patterned resist 20 ranges from about 0.3 $\mu$m to about 1.40 $\mu$m, more preferably from about 0.5 m to about 1.2 $\mu$m, most preferably about 0.8 $\mu$m. The patterned resist 20 is preferably disposed on the mask layer 18 by the spin coating method.

The protective layer 22 in the embodiment of the invention depicted in FIG. 2 is for protecting the corners (identified as "16g" below) of an etched electrode layer (generally identified as "16e" below) during the overetching process of the present invention. Another purpose of the protective layer 22 is for providing good adhesion to the mask layer 18 and the electrode layer 16. The protective layer 22 may comprise any suitable materials or chemicals, such as titanium and/or titanium nitride etc., and may be conveniently disposed on the surface of the electrode layer 16, such as by the RF magnetron sputtering method. The thickness of the protective layer 22 may be any suitable thickness, preferably ranging from about 50 Angstroms to about 1000 Angstroms, more preferably ranging from about 100 Angstroms to about 600 Angstroms, most preferably from about 100 Angstroms to about 400 Angstroms, e.g., about 300 Angstroms.

Figure 5:
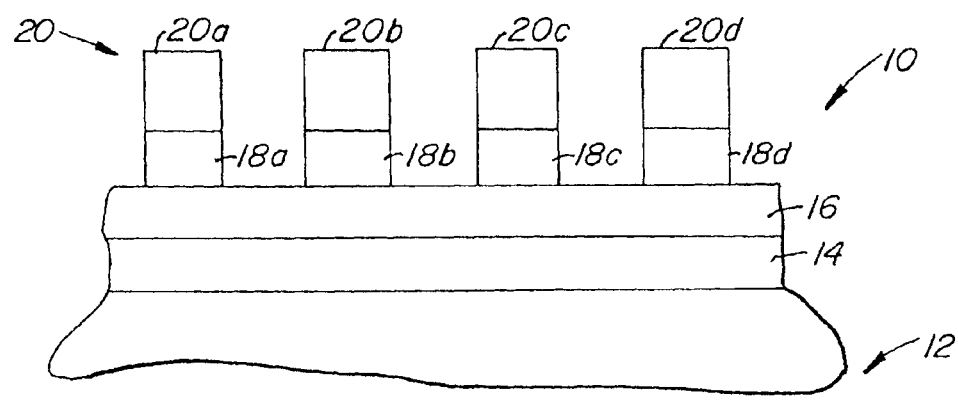
FIG. 5 is a side elevational view of the semiconductor wafer of FIG. 1 after etching and removing a portion of the mask layer from the surface of the platinum electrode layer to expose the platinum electrode layer.
Figure 6:
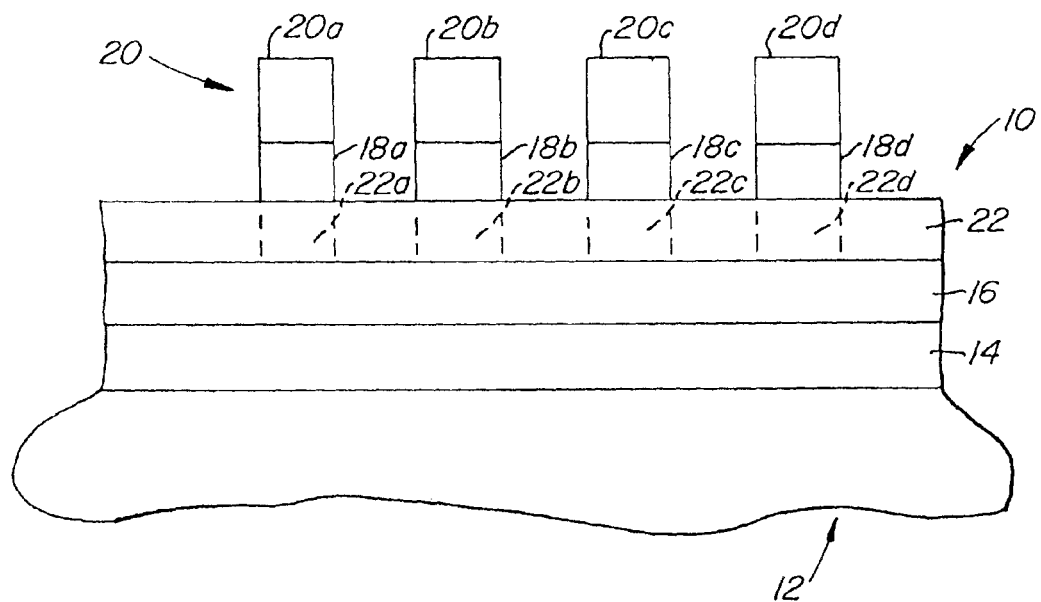
FIG. 6 is a side elevational view of the semiconductor wafer of FIG. 2 after etching and removing a portion of the mask layer from the surface of the protective layer to expose the protective layer.

In order to form or produce a semiconductor or capacitance device from the multilayered structure of FIG. 1 or FIG. 2 or FIG. 25, the multilayered structure is initially placed in a suitable plasma processing apparatus to break through and remove or etch away from the surface of the electrode layer 16 the mask layer 18, except those mask layers 18a, 18b, 18c and 18d that are respectively below the resist members 20a, 20b, 20c and 20d, as best shown in FIG. 5, or as best shown in FIG. 6 if the embodiment of the invention depicted in FIG. 2 or FIG. 25 is being employed.

Figure 3:
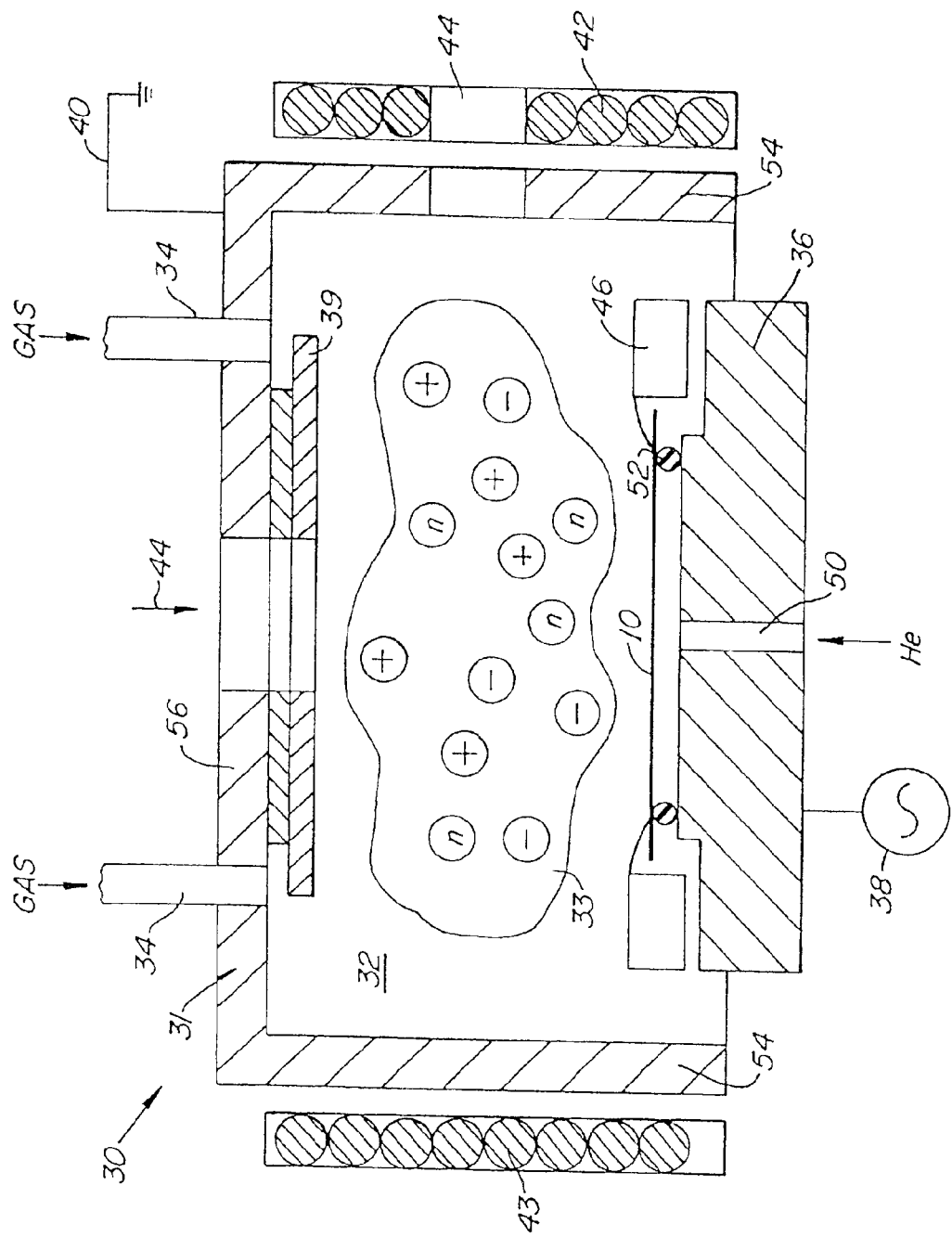
FIG. 3 is a vertical sectional view of a prior art plasma processing apparatus including a plasma etching reactor with an electromagnetic unit for enhancing a plasma.

A suitable prior art plasma processing apparatus is shown in FIG. 3 and described in U.S. Pat. No. 5,188,704 to Babie et al, fully incorporated herein by reference thereto as if repeated verbatim immediately hereinafter. The plasma process apparatus of FIG. 3 comprises a plasma reactor, generally illustrated as 30 and including walls, generally illustrated as 31 for forming and housing a reactor chamber 32 wherein a plasma 33 of neutral (n) particles, positive (+)

particles, and negative (−) particles are found. Walls 31 include cylindrical wall 54 and cover 56. Plasma processing gases are introduced via inlets 34 into reactor chamber 32. Plasma etching gases are introduced into chamber 32 through inlets 44—44. A water cooled cathode 36 is connected to an RF power supply 38 at 13.56 MHz. An anode 39 is connected to the walls 31 which are grounded by line 40. Helium gas is supplied through passageway 50 through cathode 36 to the space beneath wafer 10 which is supported periphally by lip seal 52 so that the helium gas cools the wafer 10. The wafer 10 is supported by a wafer support 46 that includes a plurality of clamps (not shown) which hold down the upper surface of wafer 10 at its periphery, as is well known to those skilled in the art. A pair of helmholtz configured electromagnetic coils 42 and 43 provide north and south poles within the chamber 32 and are disposed at opposite ends of the lateral cylindrical wall 54 and the walls 31. The electromagnetic coils 42 and 43 provide a transverse magnetic field with the north and south poles at the left and right providing a horizontal magnetic field axis parallel to the surface of the wafer 10. The transverse magnetic field is applied to slow the vertical velocity of the electrons which are accelerated radially by the magnetic field as they move towards the wafer 10. Accordingly, the quantity of electrons in the plasma 33 is increased by means of the transverse magnetic field and the plasma 33 is enhanced as is well known to these skilled in the art.

The electromagnetic coils 42 and 43 which provide the magnetic field are independently controlled to produce a field intensity orientation which is uniform. The field can be stepped angularly around the wafer 10 by rotating the energization of the electromagnetic coils 42 and 43, sequentially. The transverse magnetic field provided by the electromagnetic coils 42 and 43 is directed parallel to the surface of the wafer 10 being treated by the plasma 33, and the cathode 36 of the plasma reactor 30 increases ionization efficiently of the electrons in the plasma 33. This provides the ability to decrease the potential drop across the sheath of the cathode 36 and to increase the ion current flux present on the surface of the wafer 10, thereby permitting higher rates of etching without requiring higher ion energies to achieve the result otherwise.

Figure 4:
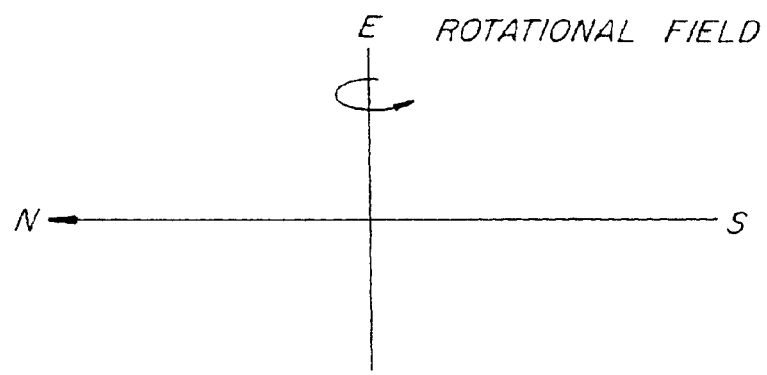
FIG. 4 is a diagram of a flux produced by a magnetic field and illustrated as rotating around a center axis.

The preferred magnetic source employed to achieve magnetically enhanced reactive ion etcher (MERIE) used in practicing the present invention is a variable rotational field provided by the electromagnetic coils 42 and 43 arranged in a Helmholtz configuration. The electromagnetic coils 42 and 43 are driven by 3-phase AC currents. The magnetic field with Flux B is parallel to the wafer 10, and perpendicular to the electrical field as shown in FIG. 4. Referring to FIG. 4, the vector of the magnetic field H which produces flux B is rotating around the center axis of the electrical field by varying the phases of current flowing through the electromagnetic coils 42 and 43 at a typical rotational frequency of 0.01 to 1 Hz, particularly at 0.5 Hz. The strength of the magnetic flux B typically varies from 0 Gauss to about 150 Gauss and is determined by the quantities of the currents supplied to the electromagnetic coils 42 and 43. While FIG. 3 illustrates one plasma processing apparatus that is suitable for removing the mask layer 18 (except mask layers 18a, 18b, 18c and 18d), it is to be understood that other plasma etchers may be employed, such as electron cyclotron resonance (ECR), helicon resonance or inductively coupled plasma (ICP), triode etchers, etc.

The plasma 33 may employ any suitable etchants gas to break through (i.e., to clean and etch away) the mask layer 18 except those mask layers 18a, 18b, 18c and 18d that are respectively below the resist members 20a, 20b, 20c and 20d, as best shown in FIGS. 5 and 6. For example, if the mask layer 18 contains silicon oxide, suitable etchants gas(es) may be selected from the group consisting of fluorine-containing gases (e.g., $CHF_3$, $SF_6$, $C_2F_6$, $NF_3$, etc.), bromine-containing gases (e.g., HBr, etc.), chlorine-containing gases (e.g., $CHCl_3$, etc.), rare or noble gases (e.g., argon, etc.), and mixtures thereof. Preferably, and in one embodiment of the present invention, the etchants does not include an oxidant, such as oxygen, since the purpose of this step is to remove the mask layer 18 (except those mask layers 18a, 18b, 18c and 18d which are respectively protected by resist members 20a, 20b, 20c and 20d) and not to remove the patterned resist 20. More preferably, the etchants gas comprises from about 20% by volume to about 40% by volume $CHF_3$ and from about 60% by volume to about 80% by volume argon. The preferred reactor conditions for a suitable plasma processing apparatus (such as the plasma processing apparatus of FIG. 3) in removing the mask layer 18 (except mask layers 18a, 18b, 18c and 18d) are as follows:

| | |
|---|---|
| Pressure | 10–150 mTorr |
| RF Power | 500–1500 watts |
| Rotational Magnetic Field | 25–70 Gauss |
| Temperature of Wafer | 25–100° C. |
| Mask Layer 18 Etch Rate | 2000–10,000 Angstroms/min |

The selectivity of mask layer 18 to patterned resist 20 is better than 3:1, depending on the materials employed for the mask layer 18 and the patterned resist 20.

More generally, the process parameters for removing the mask layer 18 in a suitable plasma process apparatus (such as the plasma processing apparatus of FIG. 3) fall into ranges as listed in the following Table III and based on flow rates of the gases $CHF_3$ and Ar also listed in the following Table III:

TABLE III

| Process | Broad | Preferred |
|---|---|---|
| Gas Flow, sccm | | |
| $CHF_3$ | 10 to 50 (20 to 40% by vol.) | 20 to 40 |
| Ar | 50 to 90 (60 to 80% by vol.) | 60 to 80 |
| Pressure, mT- | 10 to 250 | 10 to 150 |
| 13.56 MHz RF Power (Watts) | 500 to 2500 | 500 to 1500 |
| Temperature (° C.) of Wafer | 10 to 120 | 25 to 100 |
| Magnetic Field Gauss | 10 to 120 | 25 to 70 |

In another preferred embodiment of the invention, when the mask layer 18 comprises Ti and/or TiN (preferably TiN), suitable etchants gas(es) to break through (i.e., to clean and etch away) the Ti/TiN-containing mask layer 18 except for those mask layers 18a, 18b, 18c and 18d that are respectively below the resist numbers 20a, 20b, 20c and 20d, as best shown FIGS. 5 and 6, may be selected from the group consisting of a noble gas (e.g., argon), a halogen (e.g., $Cl_2$), and a gas selected from the group consisting of HBr, $BCl_3$, and mixtures thereof. Preferably, the etchants gas comprises from about 10% by volume to about 30% by volume argon, from about 20% by volume to about 60% by volume chlorine, and from about 20% by volume to about 60% by volume HBr and/or $BCl_3$. The preferred reactor conditions for a suitable plasma processing apparatus (such as the plasma processing apparatus of FIG. 3) in removing the mask layer 18 (except mask layer 18a, 18b, 18c and 18d) comprising Ti and/or TiN are as follows:

| | |
|---|---|
| Pressure | 10–150 mTorr |
| RF Power | 500–1500 watts |
| Rotational Magnetic Field | 25–70 Gauss |
| Temperature of Wafer | 25–100° C. |
| Mask Layer 18 Etch Rate | 2000–10,000 Angstroms/min |

The selectivity of the Ti/TiN-containing mask layer 18 to patterned resist 20 is better than 3:1, depending on the materials employed for the patterned resist 20.

More generally, the process parameters for removing the Ti/TiN-containing mask layer 18 in a suitable plasma process apparatus (such as the plasma processing apparatus of FIG. 3) fall into ranges as listed in the following Table IV and based on flow rates of the gases argon, chlorine and HBr and/or $BCl_3$ also listed in the following Table IV:

TABLE IV

| Process | Broad | Preferred |
|---|---|---|
| Gas Flow. sccm | | |
| Argon | 10 to 50 (10 to 30% by vol.) | 30 to 40 |
| Chlorine | 30 to 100 (20 to 60% by vol.) | 60 to 80 |
| HBr and/or $BCl_3$ | 30 to 100 (20 to 60% by vol.) | 50 to 70 |
| Pressure, mT | 10 to 250 | 10 to 150 |
| 13.56 Mhz RF Power (Watts) | 500 to 2500 | 500 to 1500 |
| Temperature (° C.) of Wafer | 10 to 120 | 25 to 100 |
| Magnetic Field Gauss | 10 to 120 | 25 to 70 |

For the embodiment of the invention depicted in FIG. 2 wherein the protective layer 22 is disposed on the electrode layer 16 between the mask layer 18 and the electrode layer 16, the protective layer 22 has to be removed or etched after removal of the mask layer 18 in order to expose the platinum electrode layer 16. The protective layer 22 may be etched and removed by any suitable manner and/or with any suitable plasma processing apparatus (such as with the plasma processing apparatus of FIG. 3) including the plasma 33 employing a suitable etchants gas to break through and etch away the protective layer 22 except those protective layers 22a, 22b, 22c and 22d (see FIGS. 6 and 8) immediately below mask layers 18a, 18b, 18c and 18d, respectively. For example, if TiN is used as the protective layer 22, suitable etchants gas(es) may be selected from the group consisting of $Cl_2$, HBr, $BCl_3$, noble gases (e.g., Ar), and mixtures thereof. Preferably and in one embodiment of the present invention, the etchants gas for breaking through and etching away the protective layer 22, except protective layers 22a, 22b, 22c and 22d, comprises from about 20% by volume to about 60% by volume $Cl_2$, from about 20% by volume to about 60% by volume HBr and/or $BCl_3$, and from about 10% by volume to about 30% by volume of a noble gas which is preferably Ar. Suitable reactor conditions for a suitable plasma processing apparatus (such as the plasma processing apparatus of FIG. 3) to remove the protective layer 22 (except protective layers 22a, 22b, 22c and 22d) may be the same as those previously stated reactor conditions for the removal of the mask layer 18 (except mask layers 18a, 18b, 18c and 18d). It is to be understood that other plasma etchers may be employed to remove the protective layer 20, such as ECR, ICP, Helicon Resonance, etc. As will be further explained below, the protective layers 22a, 22b, 22c and 22d are for protecting the corners (identified as "16g" below) of an etched electrode layer (generally identified as "16e" below) during the etching process of the present invention. It is believed that the protective layers 22a, 22b, 22c and 22d not only protect the corners of an etched platinum electrode layer during the etching process, but also assist in maintaining an existing profile and/or improves a profile (e.g., an etched platinum or iridium profile).

In another embodiment of the present invention, the protective layer 22 (except protective layers 22a, 22b, 22c and 22d) may be etched and removed by the high temperatures and etchants gases employed in the noble metal-etching process (e.g., platinum-etching process) of the present invention. More specifically and as will be further explained below, because the electrode layer 16 (e.g., platinum electrode layer 16) is preferably etched under the following process conditions in a high density plasma chamber containing a high density inductively coupled plasma:

| Process | Parameters |
|---|---|
| Etchant Gas flow | 50 to 500 sccm |
| Halogen Gas (e.g., $Cl_2$) | 20% to 95% by vol. |
| Noble Gas (e.g., Ar) | 5% to 80% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Wafer | about 150 to about 500° C. |
| Layer 16 Etch Rate (Å/min) | 200 to 6000 Å/min |
| RF Frequency of Coil Inductor | 100 K to 300 Mhz |
| RF Frequency of Wafer Pedestal | 100 K to 300 Mhz | the protective layer 22 may be etched and removed under the same foregoing conditions. Thus, the same apparatus and process conditions may be employed to etch and remove selective parts of the protective layer 22, as well as to etch the electrode layer 16. In another preferred embodiment of the present invention and as will be also further explained below, the protective layer 22 and the electrode layer 16 (e.g., platinum electrode layer 16) may be removed and etched respectively in a high density plasma chamber containing a high density inductively coupled plasma under the following process conditions:

| Process | Parameters |
|---|---|
| Etchant Gas flow | 50 to 500 sccm |
| Halogen Gas (e.g., $Cl_2$) | 10% to 90% by vol. |
| Noble Gas (e.g., Ar) | 5% to 80% by vol. |
| HBr and/or $BCl_3$ | 4% to 25% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Wafer | about 150 to 500° C. |
| Layer 16 Etch Rate (Å/min) | 200 to 6000 Å/min |
| RF Frequency of Coil Inductor | 100 K to 300 MHz |
| RF Frequency of Wafer Pedestal | 100 K to 300 Mhz |

In another embodiment of the present invention for etching an iridium electrode layer 16, the protective layer 22

(except protective layers 22a, 22b, 22c and 22d) may be etched by the high temperatures and etchants gases employed in the iridium-etching process of the present invention. More specifically and as will be further explained below, because the iridium electrode layer 16 is preferably etched under the following process conditions in a high density plasma chamber containing a high density inductively coupled plasma:

| Process | Parameters |
| --- | --- |
| Etchant Gas flow | 50 to 500 sccm |
| Halogen Gas (e.g., $Cl_2$) | 10% to 60% by vol. |
| Noble Gas (e.g., Ar) | 30% to 80% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Iridium Electrode Wafer | about 150 to about 500° C. |
| Iridium Etch Rate (Å/min) | 200 to 6000 Å/min |
| RF Frequency of Coil Inductor | 100 to 300 MHz |
| RF Frequency of Wafer Pedestal | 100 K to 300 MHz |

The protective layer 22 may be etched and removed under the same foregoing conditions. Thus, the same apparatus and process conditions may be employed to etch and remove selective parts of the protective layer 22, as well as to etch the iridium electrode layer 16. In another preferred embodiment of the present invention and as will be also further explained below, the protective layer 22 and the iridium electrode layer 16 may be removed and etched respectively in a high density plasma chamber containing a high density inductively coupled plasma under the following process conditions:

| Process | Parameters |
| --- | --- |
| Etchant Gas flow | 50 to 500 sccm |
| Oxygen | 5% to 20% by vol. |
| Halogen Gas (e.g., $Cl_2$) | 10% to 60% by vol. |
| Noble Gas (e.g., Ar) | 30% to 80% by vol. |
| HBr and/or HCl | 5% to 20% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Iridium Electrode Wafer | about 150 to 500° C. |
| Iridium Etch Rate (Å/min) | 200 to 6000 Å/min |
| RF Frequency of Coil Inductor | 100 K to 300 MHz |
| RF Frequency of Wafer Pedestal | 100 K to 300 MHz |

After selective parts of the mask layer 18 have been etched away from the surface of the electrode layer 16 to expose the latter and such that the only remnants of the mask layer 18 are the mask layers 18a, 18b, 18c and 18d situated immediately below the resist members 20a, 20b, 20c, and 20d, respectively, the resist members 20a, 20b, 20c and 20d are to be removed. The resist members 20a, 20b, 20c and 20d may be removed at any suitable time, preferably before the etching of the electrode layer 16 and before the heating of the semiconductor substrate 12 to a temperature greater than about 150° C. The same would hold true with respect to the embodiment of the invention illustrated in FIGS. 2, 6 and 8 in that after selective parts of the protective layer 22 have been etched away from the surface of the electrode layer 16 to expose the latter and such that the only remnants of the protective layer 22 are the protective layers 22a, 22b, 22c and 22d situated respectively immediately below the mask layers 18a, 18b, 18c and 18d, the resist members 20a, 20b, 20c and 20d are to be removed. However, with respect to this embodiment of the present invention, the resist members 20a, 20b, 20c and 20d may be removed before the etching away of selective parts of the protective layer 22. Alternatively, the resist members 20a, 20b, 20c and 20d may be removed after (or simultaneously during) the removal of selective parts of the protective layer 22 and before the heating of the semiconductor substrate 12 to a temperature greater than about 150° C. for purposes of etching the electrode layer 16. Typically, at least a portion of the resist members 20a, 20b, 20c and 20d would be removed while selective parts of the protective layer 22 are being etched away to expose the electrode layer 16 that is not superimposed by the protective layers 22a, 22b, 22c and 22d.

The resist members 20a, 20b, 20c and 20d may be removed in any suitable manner such as by using oxygen plasma ashing which is well known to those skilled in the art. The resist members 20a, 20b, 20c and 20d may be respectively stripped from the mask layers 18a, 18b, 18c and 18d with any suitable plasma processing apparatus, such as the plasma processing apparatus shown in FIG. 3 and employing a plasma containing an etchants gas comprising oxygen. The resist members 20a, 20b, 20c and 20d have been respectively removed from the mask layers 18a, 18b, 18c and 18d in an advanced strip passivation (ASP) chamber of a plasma processing apparatus sold under the trademark metal etch MxP Centura to Applied Materials, Inc. 3050 Bowers Avenue, Santa Clara, Calif. 95054-3299. In stripping the resist members 20a, 20b, 20c and 20d from the mask layers 18a, 18b, 18c and 18d, respectively, the ASP chamber may employ microwave downstream $O_2/N_2$ plasma with the following recipe: 120 seconds, 250° C., 1400 W, 3000 cc $O_2$, 300 cc $N_2$ and 2 Torr.

Figure 7:
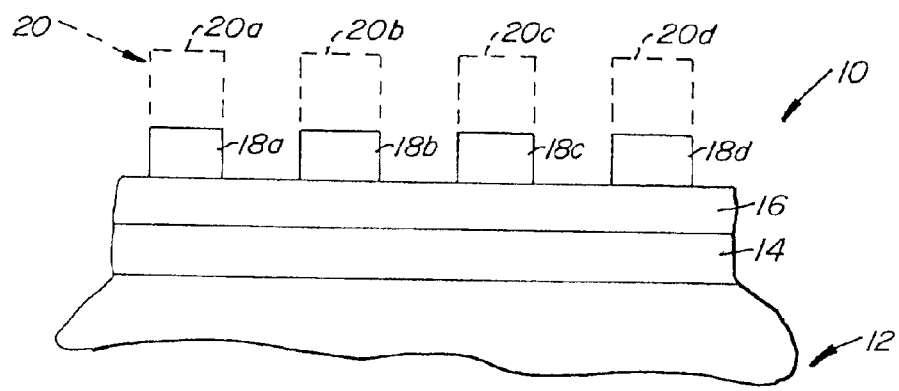
FIG. 7 is a side elevational view of the semiconductor wafer of FIG. 5 after the patterned resist layer has been removed from a portion of the mask layer with the removed patterned resist layer being represented as broken lines.
Figure 8:
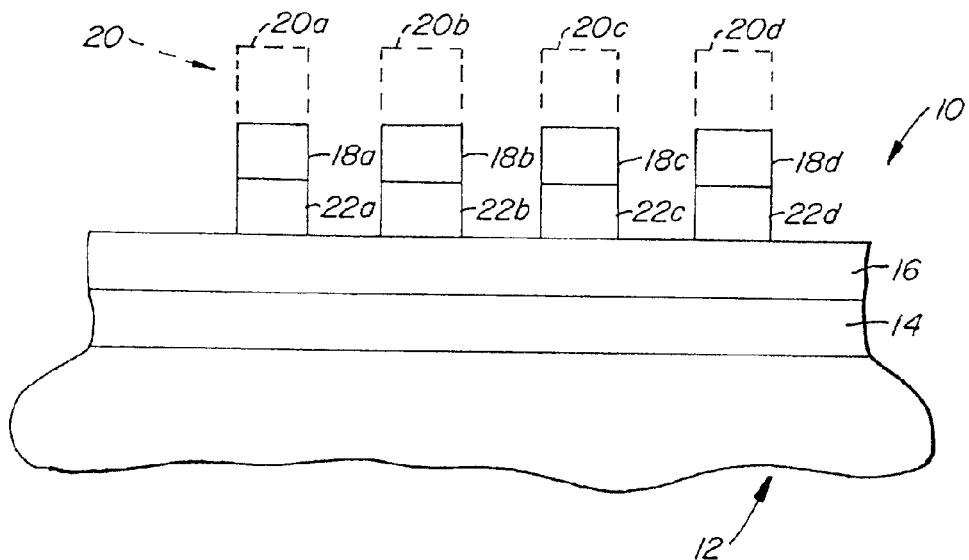
FIG. 8 is a side elevational view of the semiconductor wafer of FIG. 6 after etching and removing a portion of the protective layer off of the surface of the platinum layer, and after removing the patterned resist layer from a portion of the mask layer with the removed patterned resist layer being represented as broken lines.

After the electrode layer 16 has been exposed as represented in FIGS. 7 and 8, it is etched to develop a submicron pattern with a profile. As will be further stated below, before the electrode layer 16 is etched, the semiconductor substrate 12 supporting the electrode layer 16 is heated to a temperature greater than about 150° C., preferably greater than about 150° C. up to about 500° C., more preferably from about 200° C. to about 400° C., most preferably from about 250° C. to about 350° C. The semiconductor substrate 12 is heated by the pedestal which supports the wafer 10 during the etching process (e.g., the noble metal etching process).

The electrode layer 16 may be etched in any suitable plasma processing apparatus, such as in the reactive ion etching (RIE) plasma processing apparatus sold under the trademark AME8100 Etch™, or under the trademark Precision Etch 5000™, or under the trademark Precision Etch 8300™, all trademarks owned by Applied Materials Inc., 3050 Bowers Avenue, Santa Clara, Calif. 95054-3299. Another suitable plasma processing apparatus for etching the electrode layer 16 is that plasma processing apparatus sold under the trademark Metal Etch DPS Centura™ also owned by Applied Materials, Inc. It is also to be understood that other plasma etchers may be employed, such as ECR, ICP, Helicon Resonance, etc.

Figure 36:
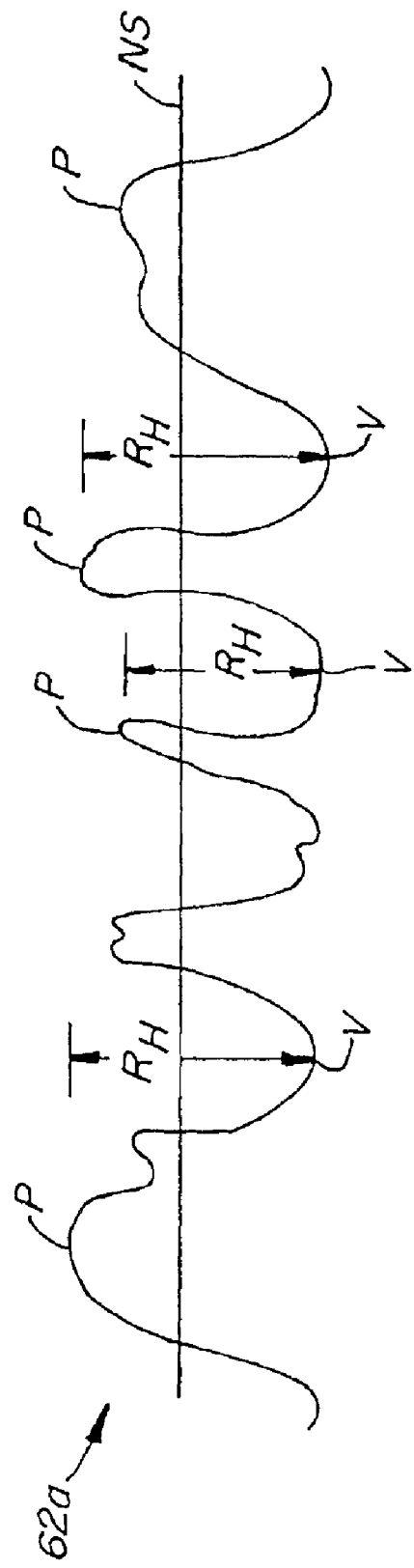
FIG. 36 is a partial side elevational view of a surface finish of a deposit-receiving surface of a dielectric member (i.e., a dielectric window or the dome-shaped dielectric ceiling)

Most of the foregoing suitable plasma processing apparatuses employ a dielectric member. In a preferred embodiment of the present invention and in order to decrease the electrical conductivity of any process-by-product deposits as will be further explained below, the dielectric member has an inside surface which functions as a deposit-receiving surface where noble metal by-products, such as platinum by-products, form during plasma etching. The inside deposit-receiving surface of the dielectric member includes a surface finish having a peak-to valley roughness height with an average height value of more than about 1000 Å; more preferably, an average height value of more than about 1800 Å, such as ranging from about 1800 Å to about 4000 Å; most preferably, an average height value of more than about 4000 Å, such as ranging from about 4000 Å to about 8000 Å. Roughness may be defined as relatively finely spaced surface irregularities. On surfaces produced by machining and abrading operations, the irregularities produced by the cutting action of tool edges and abrasive grains and by the feed of the machine tool are roughness. Roughness deviations are measured perpendicular to a nominal surface NS (see FIG. 36). As best shown in FIG. 36, roughness height $R_H$ is measured from a peak P to a valley V. As further best shown in FIG. 36, the nominal surface NS is the surface that would result if the peaks P were leveled off to fill the valleys V. For the present invention, the roughness height $R_H$ (sometimes designated in the art as $R_A$) values are average height values resulting from calculating the arithmetical average of all $R_H$ values on a deposit-receiving surface of a dielectric member obtained with a suitable instrument for measuring roughness of a surface. A suitable instrument for measuring an average $R_H$ value on the deposit-receiving surface may be obtained commercially from WYKO Corporation, Tucson, Ariz. under model No. PZ-06-SC-SF, which is a non-contact optical surface profiler that employs phase-shifting interferometry (PSI) modes for measuring smooth surfaces and vertical-scanning interferometry (PSI) modes for measuring rough surfaces and steps. Suitable procedures for calculating an average $R_H$ value on the deposit-receiving surface is described in a technical manual entitled *WYKO Surface Profilers Technical Reference Manual*, published by WYKO Corporation, and fully incorporated herein by reference thereto. A preferred procedure for finishing the deposit-receiving surface to obtain desirable average roughness height values includes bead blasting with 36-grid alumina.

As previously indicated and in accordance with the present invention, wafers 10, such as semiconductor substrates 12, are processed within a plasma processing chamber, preferably such as by plasma etching for patterning integrated circuit (IC) metal interconnect devices. It is to be understood that while plasma etching is one of the preferred plasma processes for the embodiment of the invention employing a dielectric member (or window) including an inside surface (i.e., a deposit-receiving surface) having a surface finish having a peak-to-valley roughness height with an average height value of more than about 1000 Å, the spirit and scope of this embodiment of the invention includes other forms of processing substrates, such as chemical vapor deposition and physical vapor deposition. As further previously indicated, during plasma processing of wafers 10, processing power (e.g., RF power, magnetron power, microwave power, etc.) passes through a dielectric member, which includes a dielectric window of a nonconductive material such as a ceramic dome, etc., and becomes coupled to a plasma of the proceeding gas. If the plasma process is plasma etching, metal etching of metals (e.g., platinum, copper, aluminum, titanium, ruthenium, iridium, etc.) is conducted while being supported by substrates. Also during the plasma process, a deposit of materials occurs on an inside surface of the dielectric member, as disclosed in copending patent application Ser. No. 08/920,283, filed Aug. 26, 1997, and fully incorporated herein by reference thereto. The deposit is located between the plasma and the power source.

If the plasma process for this embodiment of the present invention is plasma etching, the deposit results from etching a metal layer on the substrate; and, thus, the deposit could be electrically conductive, and includes, by way of example only, metal, metal oxide(s), metal nitride(s), etc. The metal corresponds to the metal which is being etched within the process chamber and includes, also by way of example only, platinum, copper, aluminum, titanium, ruthenium, iridium, etc. When the deposit is electrically conductive and is between the plasma and the power source, a decay in processing power transmission occurs and continues until the electrically conductive deposit reaches a certain thickness (i.e., skin depth), such as from about 0.001 in. to about 0.5 in., whereafter the processing power transmission becomes very low or even nil. The deposit, therefore, behaves as a Faraday shield to reduce the efficiency of processing power transmission into the plasma of the processing gas within the process chamber. When processing power transmission through the dielectric member and into the process chamber commences to decline, the processing (e.g., the etch rate) of the metal layer supported by the substrate starts to decline. In order to maintain a generally more stable processing power transmission through the dielectric member and into the process chamber, and thus maintain and/or extend the time for stable processing of metal layers (e.g., the etch rate on metal layers) supported by substrates, the inside deposit-receiving surface of the dielectric member includes, as was more specifically discussed above, a surface finish having a peak-to-valley roughness height with an average height value of more than about 1000 Å. By employing such a surface finish on the dielectric member or ceiling, a larger surface area is provided for receiving the by-products from the plasma process, which would decrease the thickness or skin depth of a given volume of by-products. For any given volume of by-product deposits, the smaller the surface area supporting the by-product deposits, the thicker or greater is the skin depth, and vice versa. As the thickness or skin depth of a given volume of by-products from the plasma process increases, the more electrically conductive the by-product deposits become.

A suitable plasma processing apparatus for etching the electrode layer 16 (e.g., a platinum electrode layer 16) employs a plasma of an etchants gas, which is capable of producing good profiles (e.g., profiles, such as platinum or iridium profiles, equal to or greater than about 85 degrees, preferably equal to or greater than about 87 degrees, more preferably equal to or greater than about 88.5 degrees). The etchants gas broadly comprises a halogen containing gas, such as a halogen gas (e.g., fluorine, chlorine, bromine, iodine, and astatine) and a noble gas such as helium, neon, argon, krypton, xenon, and radon. Preferably, the etchants gas comprises or consists of or consists essentially of a halogen (preferably chlorine) and a noble gas selected from the group consisting of helium, neon, and argon. The noble gas is preferably argon. The etchants gas more specifically comprises, or consists of or consists essentially of, preferably from about 20% by volume to about 95% by volume of the halogen gas (i.e., chlorine) and from about 5% by volume to about 80% by volume of the noble gas (i.e., argon); more preferably from about 40% by volume to about 80% by volume of the halogen gas (i.e., chlorine) and from about 20% by volume to about 60% by volume of the noble gas (i.e., argon); most preferably from about 55% by volume to about 65% by volume of the halogen gas (i.e., chlorine) and from about 35% by volume to about 45% by volume of the noble gas (i.e., argon).

The etchants gas may also broadly comprise oxygen, a halogen containing gas, such as a halogen gas (e.g., fluorine, chlorine, bromine, iodine, and astatine), and a noble gas such as helium, neon, argon, krypton, xenon, and radon. Preferably, the etchants gas comprises, or consists of or consists essentially of, a halogen (preferably chlorine) and a noble gas selected from the group consisting of helium, neon and argon. The noble gas is preferably argon. The etchants gas more specifically comprises, or consists of or consists essentially of, preferably from about 5% by volume to about 40% by volume oxygen, from about 10% by volume to about 60% by volume of the halogen gas (i.e., chlorine), and from about 30% by volume to about 80% by volume of the noble gas (i.e., argon); more preferably from about 10% by volume to about 30% by volume oxygen, from about 20% by volume to about 50% by volume of the halogen gas (i.e., chlorine), and from about 40% by volume to about 70% of the noble gas (i.e., argon); most preferably from about 10% by volume to about 20% by volume oxygen, from about 20% by volume to about 30% by volume halogen gas (i.e., chlorine), and from about 50% by volume to about 70% by volume of noble gas (i.e., argon).

In another preferred embodiment of the invention, the etchants gas comprises, preferably consists of or consists essentially of, the halogen (i.e., chlorine), the noble gas (i.e., argon), and a gas selected from the group consisting of HBr, BCl$_3$ and mixtures thereof. The etchants gas more specifically comprises, or consists of or consists essentially of, from about 10% by volume to about 90% by volume of the halogen gas (i.e., chlorine) and from about 5% by volume to about 80% by volume of the noble gas (i.e., argon) and from about 4% by volume to about 25% by volume of HBr and/or BCl$_3$; preferably from about 40% by volume to about 70% by volume of the halogen gas (i.e., chlorine) and from about 25% by volume to about 55% by volume of the noble gas (i.e., argon) and from about 5% by volume to about 20% by volume of HBr and/or BCl$_3$; and more preferably from about 50% by volume to about 60% by volume of the halogen gas (i.e., chlorine) and from about 35% by volume to about 45% by volume of the noble gas (i.e., argon) and from about 5% by volume to about 15% by volume of HBr and/or BCl$_3$. The etchants gas flow rate ranges from about 50 sccm to about 500 sccm. HBr and/or BCl$_3$ are for removal of residue (e.g. platinum or iridium residue) during etching of the electrode layer 16 (e.g., the platinum or iridium electrode layer). Plasmas containing argon are known to have a high energetic ion concentration and are often used for physical sputtering. The sputtering effect due to the ions is a function of the accelerating potential which exist between the plasma and the sample.

In a further preferred embodiment of the invention, the etchants gas comprises, preferably consists of or consists essentially of, oxygen, the halogen (i.e., chlorine), the noble gas (i.e., argon), and a gas selected from the group consisting of HBr, HCl and mixtures thereof. The etchants gas more specifically comprises, or consists of or consists essentially of, from about 5% by volume to about 20% by volume oxygen, from about 10% by volume to about 60% by volume of the halogen gas (i.e., chlorine) and from about 30% by volume to about 80% by volume of the noble gas (i.e., argon) and from about 5% by volume to about 20% by volume of HBr and/or HCl; preferably from about 5% by volume to about 15% by volume oxygen, from about 20% by volume to about 50% by volume of the halogen gas (i.e., chlorine) and from about 40% by volume to about 70% by volume of the noble gas (i.e., argon) and from about 5% by volume to about 15% by volume of HBr and/or HCl; and more preferably from about 5% by volume to about 10% by volume oxygen, from about 20% by volume to about 35% by volume of the halogen gas (i.e., chlorine) and from about 40% by volume to about 60% by volume of the noble gas (i.e., argon) and from about 5% by volume to about 10% by volume of HBr and/or HCl. The etchants gas flow rate ranges from about 50 sccm to about 500 sccm.

In also another preferred embodiment of the invention, the etchants gas broadly comprises nitrogen, a halogen (e.g., fluorine, chlorine, bromine, iodine, and astatine) and a noble gas such as helium, neon, argon, krypton, xenon, and radon. Preferably, the etchants gas comprises or consists of or consists essentially of nitrogen, a halogen (preferably chlorine) and a noble gas selected from group consisting of helium, neon, and argon. The noble gas is preferably argon. The etchants gas more specifically comprises, or consists of or consists essentially of, preferably from about 0.1% by volume to about 60% by volume nitrogen, from about 40% by volume to about 90% by volume of the halogen gas (i.e., chlorine), and from about 0.1% by volume to about 40% by volume of the noble gas (i.e., argon); more preferably from about 5% by volume to about 40% by volume nitrogen, from about 50% by volume to about 80% by volume of the halogen gas (i.e., chlorine), and from about 5% by volume to about 30% by volume of the noble gas (i.e., argon); most preferably from about 10% by volume to about 30% by volume nitrogen, from about 60% by volume to about 70% by volume of the halogen gas (i.e., chlorine), and from about 10% by volume to about 20% by volume of the noble gas (i.e., argon). For this embodiment of the invention, the plasma of the etchants gas may be a high density plasma or a low-density plasma having a density of less than about $10^{11}/cm^3$, preferably less than about $10^9/cm^3$.

In yet another preferred embodiment of the invention, the etchants gas comprises, preferably consists of or consists essentially of, nitrogen, the halogen (i.e., chlorine), the noble gas (i.e., argon), and a gas selected from the group consisting of HBr, BCl$_3$, SiCl$_4$, and mixtures thereof. The etchants gas more specifically comprises, or consists of or consists essentially of, from about 0.1% by volume to about 60% by volume nitrogen, from about 40% by volume to about 90% by volume of the halogen gas (i.e., chlorine), and from about 0.1% by volume to about 40% by volume of the noble gas (i.e., argon), and from about 1% by volume to about 30% by volume of HBr and/or BCl$_3$ and/or SiCl$_4$; preferably from about 5% by volume to about 40% by volume nitrogen, from about 50% by volume to about 80% by volume of the halogen gas (i.e., chlorine), and from about 5% by volume to about 30% by volume of the noble gas (i.e., argon), and from about 5% by volume to about 20% by volume of HBr and/or BCl$_3$ and/or SiCl$_4$; and more preferably from about 10% by volume to about 30% by volume nitrogen, from about 60% by volume to about 70% by volume of the halogen gas (i.e., chlorine), and from about 10% by volume to about 20% by volume of the noble gas (i.e., argon), and from about 1% by volume to about 10% by volume of HBr and/or BCl$_3$ and/or SiCl$_4$. For this embodiment of the invention, the plasma of the etchants gas may be a high density plasma or a low density plasma having a density of less than about $10^{11}/cm^3$, preferably less than about $10^9/cm^3$.

Alternatively, the etchants gas comprises or consists of or consists essentially of nitrogen and a halogen (preferably chlorine). The etchants gas more specifically comprises, or consists of or consists essentially of, preferably from about 10% by volume to about 90% by volume nitrogen and from about 10% by volume to about 90% by volume of the halogen gas (i.e., chlorine); more preferably from about 20% by volume to about 60% by volume nitrogen and from about 40% by volume to about, 80% by volume of the halogen gas (i.e., chlorine); most preferably from about 30% by volume to about 40% by volume nitrogen, and from about 60% by volume to about 70% by volume of the halogen gas (i.e., chlorine). For this embodiment of the invention, the plasma of the etchants gas may be a high density plasma or a low-density plasma having a density of less than about $10^{11}/cm^3$, preferably less than about $10^9/cm^3$.

The reactor conditions for a suitable plasma processing apparatus, such as the plasma processing apparatus of FIG. 3, in etching the electrode layer 16 (e.g., platinum electrode layer 16) are as follows:

| | |
|---|---|
| Pressure | 0.1~300 mTorr |
| RF Power | 100–5000 watts |
| Rotational Magnetic Field | 20~100 Gauss |
| Temperature of Wafer | about 150–about 500° C. |
| Layer 16 Etch Rate | 200–6000 Angstroms/min |

The selectivity of electrode layer 16 to mask 18 is better than 2:1, depending on the materials employed for the mask layer 18.

More generally, the process parameters for etching the electrode 16 in a suitable plasma processing apparatus, such as the plasma processing apparatus of FIG. 3, fall into ranges as listed in the following Table V and based on the flow rate of etchants gas as also listed in Table V below:

TABLE V

| Process | Broad | Preferred | Optimum |
|---|---|---|---|
| Gas Flow, sccm | | | |
| Etchant Gas | 35 to 500 | 75 to 250 | 100 to 200 |
| Pressure, mT | 20 to 2000 | 30 to 300 | 50 to 150 |
| 13.56 MHz RF Power (Watts) | 50 to 3000 | 500 to 2000 | 700 to 1200 |
| Temperature (° C.) of Wafer | 150 to 500 | 200 to 400 | 250 to 350 |
| Magnetic Field Gauss | 0 to 140 | 20 to 100 | 60 to 80 |

Figure 9:
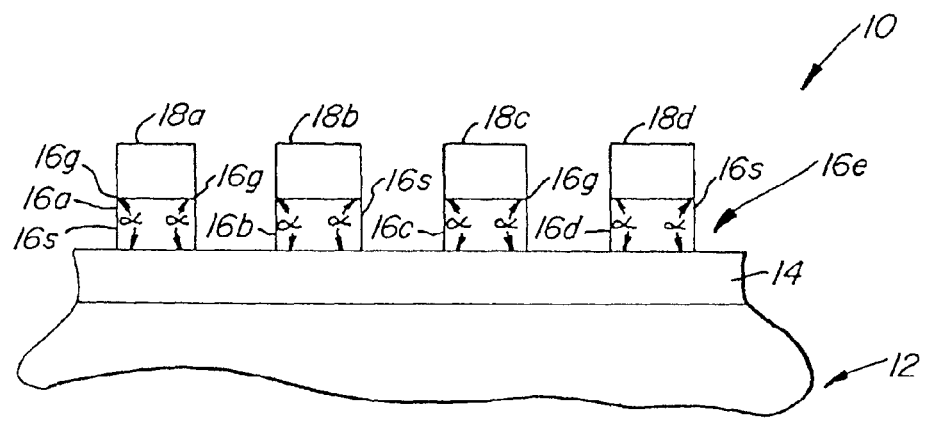
FIG. 9 is a side elevational view of the semiconductor wafer of FIG. 7 after the platinum electrode layer has been etched to produce an etched platinum electrode layer.
Figure 10:
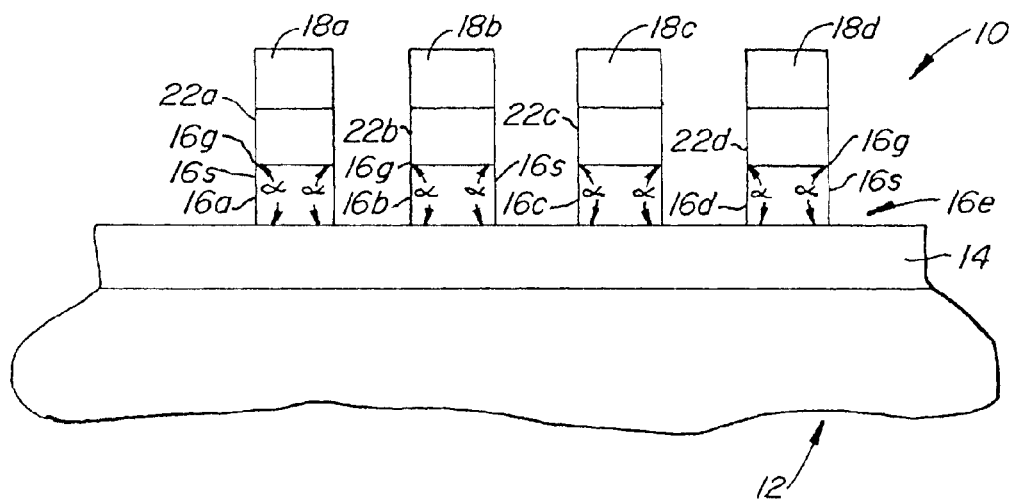
FIG. 10 is a side elevational view of the semiconductor wafer of FIG. 8 after the platinum electrode layer has been etched to produce an etched platinum electrode layer.

As previously indicated, a preferred etchants gas for etching the electrode layer 16 (e.g., the platinum electrode layer 16) is a mixture of chlorine and argon, or a mixture of chlorine, argon and HBr and/or $BCl_3$. Another preferred etchants gas for etching the electrode layer 16 is a mixture of oxygen, chlorine and argon, or a mixture of oxygen, chlorine, argon and HBr and/or HCl. If the etchants gas is a mixture of chlorine and argon (i.e., from about 20% by volume to about 95% by volume chlorine and from about 5% by volume to about 80% by volume argon), or a mixture of chlorine, argon and HBr and/or $BCl_3$ (i.e., from about 10% by volume to about 90% by volume chlorine and from about 5% by volume to about 80% by volume argon and from about 4% by volume to about 25% by volume HBr and/or $BCl_3$), and if the semiconductor substrate 12 is heated to a temperature greater than about 150° C., preferably to a temperature ranging from about 150° C. to about 500° C., the plasma processing apparatus for etching the electrode layer 16 (e.g., the platinum electrode layer 16 or the iridium electrode layer 16) etches the electrode layer 16 in a high density plasma of the etchants gas at a high etch rate (e.g., an etch rate higher than 700 Å/min for iridium, and an etch rate higher than 1000 Å/min for platinum) and produces an etched electrode layer, generally illustrated as 16e (as best shown in FIGS. 9 and 10). The etched electrode layer 16e (e.g., etched platinum electrode layer 16e or etched platinum electrode layer 16e) includes etched electrode layers 16a, 16b, 16c and 16d (e.g., etched platinum or iridium layers) having corners 16g and sidewalls 16s and an excellent profile (e.g., an excellent platinum or iridium profile); that is, a profile where the angle ∝ of the sidewalls 16s (as also best shown in FIGS. 9 and 10) with respect to a horizontal plane is equal to or greater than about 80 degrees (e.g., especially equal to or greater than 80 degrees for iridium), such as equal to or greater than about 85 degrees (e.g., especially equal to or greater than 85 degrees for platinum), preferably equal to or greater than about 87°, and more preferably equal to or greater than about 88.5°. The produced electrodes (e.g., produced platinum electrodes) are separated by a distance or space having a dimension equal to or less than about 0.35 μm, preferably equal to or less than about 0.3 μm. Each of the electrodes (e.g., produced platinum electrodes) include a dimension having a value equal to or less than about 1.0 μm, preferably equal to or less than about 0.6 μm, more preferably equal to or less than about 0.35 μm, most preferably equal to or less than about 0.3 μm. More preferably, each of the electrodes (e.g., produced platinum electrodes) have a width equal to or less than about 1.0 μm, preferably equal to or less than about 0.6 μm, and a height equal to or less than about 0.6 μm.

It has also been discovered that the etched electrode layer 16e (i.e., etched electrode layers 16a, 16b, 16c and 16d) has essentially no wall-like structures extending up from the edges of the platinum region. These wall-like structures are frequently referred to as "veils" or "fences" or "rabbit ears." Therefore, the method of the present invention produces etched electrode layers 16a, 16b, 16c and 16d which are essentially veil-less. Because the produced etched electrode layers 16a, 16b, 16c and 16d are essentially veil-less and have no "fences" or "rabbit ears," they are ideally suited for receiving a dielectric BST or PZT or SBT layer and functioning as electrodes in a semiconductor device (i.e., a capacitance structure).

The high density plasma of the present invention may be defined as a plasma of the etchant gas of the present invention having an ion density greater than about $10^9/cm^3$, preferably greater than about $10^{11}/cm^3$. The source of the high density plasma may be any suitable high density source, such as electron cyclotron resonance (ECR), helicon resonance or inductively coupled plasma (ICP)-type sources. All three are in use on production equipment today. The main difference is that ECR and helicon sources employ an external magnetic field to shape and contain the plasma, while ICP sources do not.

The high density plasma for the present invention is more preferably produced or provided by inductively coupling a plasma in a decoupled plasma source etch chamber, such as that sold under the trademark DPS™ owned by Applied Materials, Inc. which decouples or separates the ion flux to the wafer 10 and the ion acceleration energy. The design of the etch chamber provides fully independent control of ion density of an enlarged process window. This is accomplished by producing plasma via an inductive source. While a cathode within the etch chamber is still biased with RF electric fields to determine the ion acceleration energy, a second RF source (i.e., an inductive source) determines the ion flux. This second RF source is not capacitive (i.e., it does not use electric fields like the cathode) since a large sheath voltage would be produced, interfering with the cathode bias and effectively coupling the ion energy and ion flux.

The inductive plasma source couples RF power through a dielectric window rather than an electrode. The power is coupled via RF magnetic fields (not electric fields) from RF current in a coil. These RF magnetic fields penetrate into the plasma and induce RF electric fields (therefore the term "inductive source") which ionize and sustain the plasma. The induced electric fields do not produce large sheath voltages like a capacitive electrode and therefore the inductive source predominantly influences ion flux. The cathode bias power plays little part in determining ion flux since most of the RF power (typically an order of magnitude less than the source power) is used in accelerating ions. The combination of an inductive plasma source and a capacitive wafer bias allows independent control of the ion flux and ion energy reaching the wafer 10 in the etch chamber, such as the DPS™ brand etch chamber.

Figure 17:
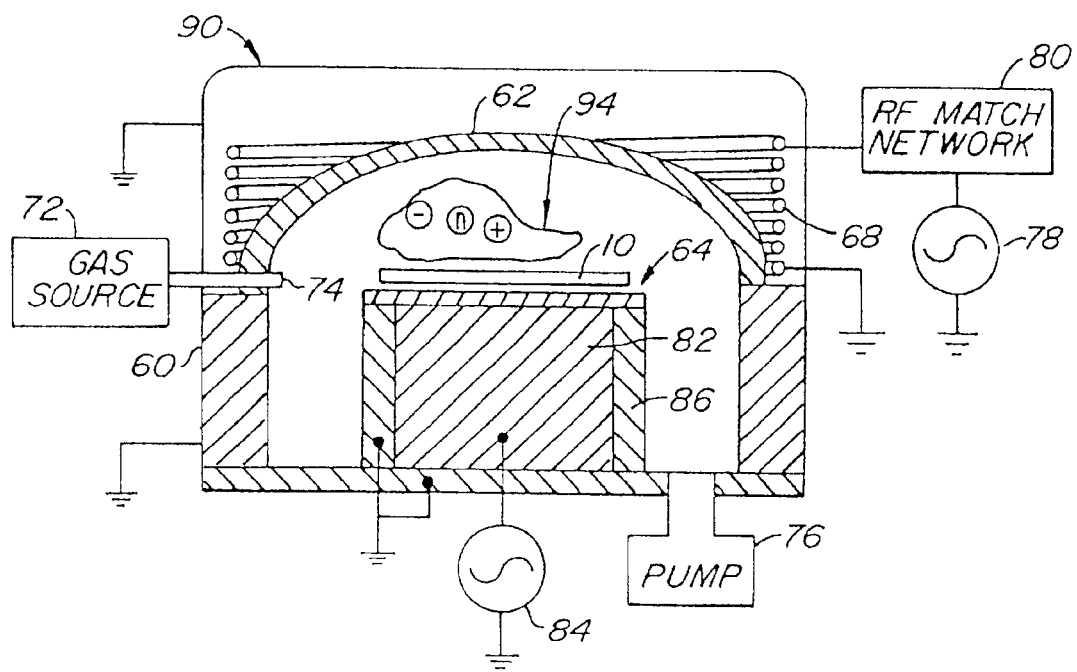
FIG. 17 is a simplified cut-away view of an inductively coupled RF plasma reactor which may be employed in etching the platinum electrode layer to produce a semiconductor device.
Figure 18:
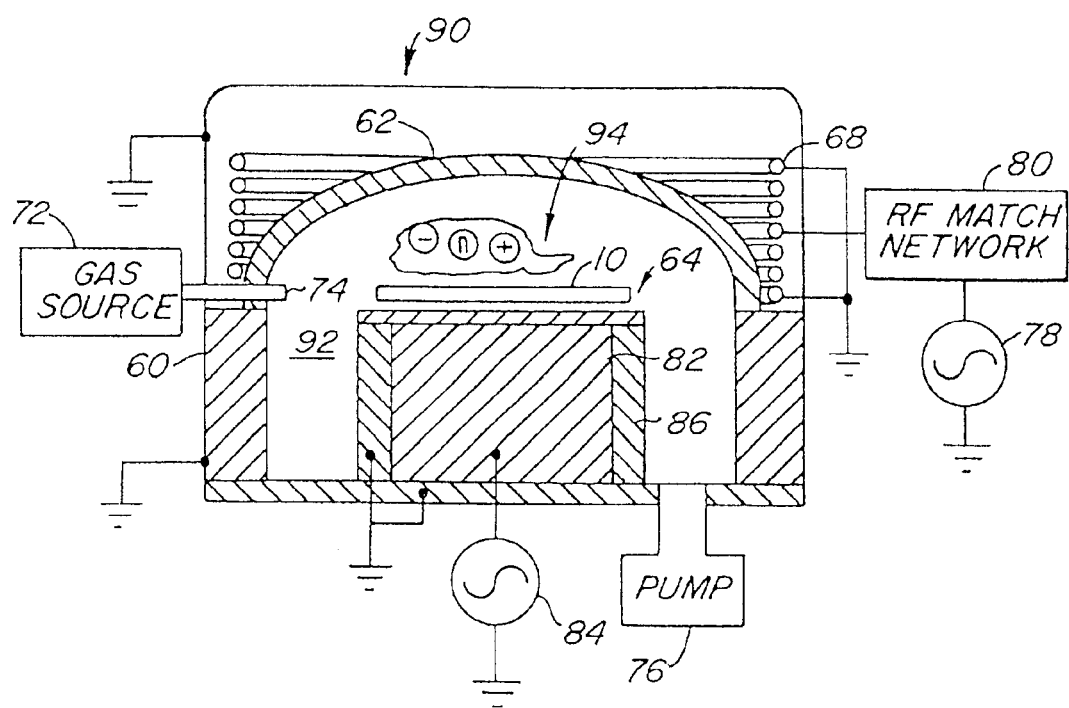
FIG. 18 is a simplified cut-away view of another inductively coupled RF plasma reactor which may be employed in etching the platinum electrode layer to produce a semiconductor device.

DPS™ brand etch chambers for producing the high density plasma of the present invention for etching the electrode layer 16 to produce the etched electrode layers 16a, 16b, 16c and 16d may be any of the DPS™ brand etch chambers of the inductively coupled plasma reactor disclosed in U.S. Pat. No. 5,753,044, entitled "RF PLASMA REACTOR WITH HYBRID CONDUCTOR AND MULTI-RADIUS DOME CEILING" and assigned to the present assignee and fully incorporated herein by reference thereto as if repeated verbatim immediately hereinafter. Referring now to FIGS. 17 and 18 for two (2) embodiments of an inductively coupled plasma reactor from U.S. Pat. No. 5,753,044 there is seen an inductively coupled RF plasma reactor generally illustrated as 90 having a reactor chamber, generally illustrated as 92, wherein a high density plasma 94 of neutral (n) particles, positive (+) particles, and negative (−) particles are found. The reactor chamber 92 has a grounded conductive cylindrical sidewall 60 and a dielectric ceiling 62 having an inside concave surface 62a which would receive deposits of by-products from plasma processing of wafers 10. The inductively coupled RF plasma reactor 90 further comprises a wafer pedestal 64 for supporting the (semiconductor) wafer 10 in the center of the chamber 92, a cylindrical inductor coil 68 surrounding an upper portion of the chamber 92 beginning near the plane of the top of the wafer 10 or wafer pedestal 64 and extending upwardly therefrom toward the top of the chamber 92, an etching gas source 72 and gas inlet 74 for furnishing an etching gas into the interior of the chamber 92, and a pump 76 for controlling the pressure in the chamber 92. The coil inductor 68 is energized by a plasma source power supply or RF generator 78 through a conventional active RF match network 80, the top winding of the coil inductor 68 being "hot" and the bottom winding being grounded. The wafer pedestal 64 includes an interior conductive portion 82 connected to the bias RF power supply or generator 84 and an exterior grounded conductor 86 (insulated from the interior conductive portion 82). Thus, the plasma source power applied to the coil inductor 68 by the RF generator 78 and the DC bias RF power applied to the wafer pedestal 64 by generator 84 are separately controlled RF supplies. Separating the bias and source power supplies facilitates independent control of ion density and ion energy, in accordance with well-known techniques. To produce high density plasma 94 as an inductively coupled plasma, the coil inductor 68 is adjacent to the chamber 92 and is connected to the RF source power supply or the RF generator 78. The coil inductor 68 provides the RF power which ignites and sustains the high ion density of the high density plasma 94.

The geometry of the coil inductor 68 can in large part determine spatial distribution of the plasma ion density of the high density plasma 94 within the reactor chamber 92.

Uniformity of the plasma density spatial distribution of the high density plasma 94 across the wafer 10 is improved (relative to conical or hemispherical ceilings) by shaping the ceiling 62 in a multi-radius dome and individually determining or adjusting each one of the multiple radii of the ceiling 62. The multiple-radius dome shape in the particular embodiment of FIG. 17 somewhat flattens the curvature of the ceiling 62 around the center portion of the ceiling 62, the peripheral portion of the ceiling 62 having a steeper curvature.

As illustrated in FIG. 18 the coil inductor 68 may be coupled to the RF power source 78, 80 in a mirror coil configuration that is known to those skilled in the art. In the mirror coil configuration of FIG. 18, the RF source 78, 80 is connected to the center winding of the coil inductor 68 while the top and bottom ends of the coil inductor 68 are both grounded. The mirror coil configuration has the advantage of reducing the maximum potential on the coil inductor 68.

It has been discovered that by employing a high density plasma, such as the high density plasma 94 illustrated in FIGS. 17 and 18, for etching the electrode layer 16 (e.g., a platinum electrode layer 16 or an iridium electrode layer 16), and by heating the semiconductor substrate 12 to a temperature greater than about 150° C. before conducting the etching operation under process parameters which are stated below, a semiconductor device is produced with electrodes (e.g., noble metal electrodes such as platinum electrodes or iridium) having a profile with an angular value which is equal to or greater than about 80 degrees (e.g., equal to greater than about 80 degrees for iridium), preferably equal to or greater than about 85 degrees (e.g., equal to or greater than 85 degrees for platinum), more preferably equal to or greater than about 87 degrees, most preferably equal to or greater than about 88.5 degrees. The electrodes are essentially veil-less; that is, they have no "fences" or "rabbit ears." The electrodes are preferably separated by a distance or space having a dimension equal to or less than about 0.35 μm, preferably equal to or less than about 0.3 μm. Each of the electrodes include a dimension having a value equal to or less than about 1.0 μm, preferably equal to or less than about 0.6 μm, more preferably equal to or less than about 0.35 μm, most preferably equal to or less than about 0.3 μm. More preferably, each of the electrodes have a width equal to or less than about 0.35 μm, more preferably equal to or less than about 0.3 μm, a length equal to or less than about 1.0 μm, more preferably equal to or less than about 0.6 μm, and a height equal to or less than about 0.6 μm.

The preferred reactor conditions for a suitable inductively coupled RF plasma reactor, such as the inductively coupled RF plasma reactor 90 in FIGS. 17 and 18, in etching the electrode layer 16 (e.g., platinum electrode layer 16) are as follows:

| | |
|---|---|
| Pressure | 0.1 to 300 mTorr |
| RF Power to Coil Inductor | 100 to 5000 watts |
| RF Power to Wafer Pedestal | 50 to 3000 watts |
| RF Frequency in Coil Inductor | 100K to 300 MHz |
| RF Frequency in Wafer Pedestal | 100K to 300 MHz |
| Temperature of Wafer | 150 to 500° C. |
| Layer 16 Etch Rate | 200 to 6000 Angstrom/min |

More generally, the process parameters for etching the electrode layer 16 (e.g., platinum electrode layer 16) in a suitable inductively coupled plasma reactor, such as the inductively coupled plasma reactor 90 in FIGS. 17 and 18, fall into ranges as listed on the basis of flow rates of the gases, including the halogen gas(es) (i.e., $Cl_2$) and the noble gas(es) (i.e., argon), as listed in Table VI below.

TABLE VI

| Process | Broad | Preferred | Optimum |
|---|---|---|---|
| Gas Flow, sccm | | | |
| $Cl_2$ | 30 to 400 | 50 to 250 | 60 to 150 |
| Ar | 20 to 300 | 30 to 200 | 40 to 100 |
| Pressure, mT | 0.1 to 300 | 10 to 100 | 10 to 40 |
| RF Power of Coil Inductor (Watts) | 100 to 5000 | 650 to 2000 | 900 to 1500 |
| RF Power of Wafer Pedestal (Watts) | 50 to 3000 | 100 to 1000 | 150 to 400 |
| Temperature of Wafer (° C.) | about 150 to about 500 | 200 to 400 | 250 to 350 |
| Layer 16 Etch Rate (Å/min) | 200 to 6000 | 500 to 3000 | 1000 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

Also generally, the process parameters for etching the electrode layer 16 (e.g. an iridium electrode layer 16) in a suitable inductively coupled plasma reactor, such as the inductively coupled plasma reactor 90 in FIGS. 17 and 18, fall into ranges as listed on the basis of flow rates of the gases, including oxygen, the halogen gas(es) (i.e., $Cl_2$), and the noble gas(es) (i.e., argon), as listed in Table VII below.

TABLE VII

| Process | Broad | Preferred | Optimum |
|---|---|---|---|
| Gas Flow, sccm | | | |
| $O_2$ | 10 to 60 | 10 to 40 | 15 to 30 |
| $Cl_2$ | 30 to 100 | 30 to 70 | 50 to 70 |
| Ar | 50 to 250 | 100 to 200 | 100 to 150 |
| Pressure, mT | 0.1 to 300 | 10 to 100 | 10 to 40 |
| RF Power of Coil Inductor (Watts) | 100 to 5000 | 650 to 2000 | 900 to 1500 |
| RF Power of Wafer Pedestal (Watts) | 50 to 3000 | 100 to 1000 | 150 to 600 |
| Temperature of Wafer (° C.) | about 150 to about 500 | 200 to 400 | 250 to 350 |
| Etch Rate (Å/min) | 200 to 6000 | 500 to 3000 | 500 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

Also, more generally further, and when the etchant gases are a mixture of the halogen gas(es) (i.e., chlorine), the noble gas(es) (i.e., argon), and HBr and/or $BCl_3$, the process parameters for etching the electrode layer 16 (e.g., platinum electrode layer 16) in a suitable inductively coupled plasma reactor, such as the inductively coupled plasma reactor 90 in FIGS. 17 and 18, fall into the ranges as listed on the basis of flow rates of the gases, including the halogen gas(es) (i.e., $Cl_2$) and the noble gas(es) (i.e., Ar) and HBr and/or $BCl_3$, as listed in Table VIII below:

TABLE VIII

| Process | Broad | Preferred | Optimum |
|---|---|---|---|
| Gas Flow, sccm | | | |
| $Cl_2$ | 30 to 400 | 50 to 250 | 60 to 150 |
| Ar | 20 to 300 | 30 to 200 | 40 to 100 |
| HBr and/or $BCl_3$ | 5 to 70 | 5 to 40 | 5 to 20 |
| Pressure, mT | 0.1 to 300 | 10 to 100 | 10 to 40 |
| RF Power of Coil Inductor (Watts) | 100 to 5000 | 650 to 2000 | 750 to 1000 |
| RF Power of Wafer Pedestal (Watts) | 50 to 3000 | 100 to 1000 | 150 to 400 |
| Temperature of Wafer (° C.) | about 150 to about 500 | 200 to 400 | 250 to 350 |
| Layer 16 Etch Rate (Å/min) | 200 to 6000 | 500 to 3000 | 1000 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

Also more generally further, and when the etchant gases are a mixture of oxygen, the halogen gas(es) (i.e., chlorine), the noble gas(es) (i.e., argon), and HBr and/or $BCl_3$, the process parameters for etching electrode layer 16 (e.g., iridium electrode layer 16) in a suitable inductively coupled plasma reactor, such as the inductively coupled plasma reactor 90 in FIGS. 17 and 18, fall into the ranges as listed on the basis of rates of the gases, including oxygen, the halogen gas(es) (i.e., $Cl_2$), the noble gas(ses) (i.e., Ar), and HBr and/or HCl, as listed in Table IX below:

TABLE IX

| Process | Broad | Preferred | Optimum |
|---|---|---|---|
| Gas Flow, sccm | | | |
| $O_2$ | 10 to 60 | 10 to 40 | 15 to 30 |
| $Cl_2$ | 30 to 100 | 30 to 70 | 50 to 70 |
| Ar | 50 to 250 | 100 to 200 | 100 to 150 |
| HBr and/or HCl | 10 to 60 | 10 to 40 | 15 to 30 |
| Pressure, Mt | 0.1 to 300 | 10 to 100 | 10 to 40 |
| RF Power of Coil Inductor (Watts) | 100 to 5000 | 650 to 2000 | 750 to 1000 |
| RF Power of Wafer Pedestal (Watts) | 50 to 3000 | 100 to 1000 | 150 to 600 |
| Temperature of Wafer (° C.) | about 150 to about 500 | 200 to 400 | 250 to 350 |
| Etch Rate (Å/min) | 200 to 6000 | 500 to 3000 | 500 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

Therefore, the foregoing process conditions are preferably based on flow rates of etchant gas(es) having a flow rate value ranging from about 5 to about 500 sccm. It will be appreciated by those skilled in the art that the process parameters of the Tables, previously mentioned and mentioned hereinafter, may vary in accordance with the size of the wafer 10. As was previously mentioned, the etchant gas comprises or consists of or consists essentially of a halogen (preferably chlorine) and a noble gas selected from the group consisting of helium, neon, and argon. In another preferred embodiment of the invention, the etchant gas comprises, or consists of or consists essentially of, oxygen, a halogen (preferably chlorine) and a noble gas selected from the group consisting of helium, neon, and argon. The noble gas is preferably argon. As was also previously mentioned, the etchant gas more specifically comprises or consists of or consists essentially of from about 20% by volume to about 95% by volume of the halogen gas (i.e., chlorine) and from about 5% by volume to about 80% by volume of the noble gas (i.e., argon); preferably from about 40% by volume to about 80% by volume of the halogen gas (i.e., chlorine) and from about 20% by volume to about 60% by volume of the noble gas (i.e., argon); more preferably from about 55% by volume to about 65% by volume of the halogen gas (i.e., chlorine) and from about 35% by volume to about 45% by volume of the noble gas (i.e., argon). As was further previously mentioned, the etchant gas more specifically comprises, or consists of or consists essentially of, from about 5% by volume to about 40% by volume oxygen, from about 10% by volume to about 60% by volume of the halogen gas (i.e., chlorine) and from about 30% by volume to about 80% by volume of the noble gas (i.e., argon); preferably from about 10% by volume to about 30% by volume oxygen, from about 20% by volume to about 50% by volume of the halogen gas (i.e., chlorine) and from about 40% by volume to about 70% by volume of the noble gas (i.e., argon); more preferably from about 10% by volume to about 20% by volume oxygen, from about 20% by volume to about 30% by volume of the halogen gas (i.e., chlorine) and from about 50% by volume to about 70% by volume of the noble gas (i.e., argon).

In yet another preferred embodiment of the invention and as was previously mentioned, the etchant gas comprises, preferably consists of or consists essentially of, the halogen (i.e., chlorine), the noble gas (i.e., argon), and a gas selected from the group that consists of HBr, BCl$_3$ and mixtures thereof. In also yet another preferred embodiment of the invention and as was previously mentioned, the etchant gas comprises, preferably consists of or consists essentially of, oxygen, the halogen (i.e., chlorine), the noble gas (i.e., argon), and a gas selected from the group that consists of HBr, BCl$_3$ and mixtures thereof. The etchant gas more specifically comprises, or consists of or consists essentially of from about 10% by volume to about 90% by volume of the halogen gas (i.e., chlorine) and from about 5% by volume to about 80% by volume of the noble gas (i.e., argon) and from about 4% by volume to about 25% by volume of HBr and/or BCl$_3$; preferably from about 40% by volume to about 70% by volume of the halogen gas (i.e., chlorine) and from about 25% by volume to about 55% by volume of the noble gas (i.e., argon) and from about 5% by volume to about 20% by volume of HBr and/or BCl$_3$; and more preferably from about 50% by volume to about 60% by volume of the halogen gas (i.e., chlorine) and from about 35% by volume to about 45% by volume of the noble gas (i.e., argon) and from about 5% by volume to about 15% by volume of HBr and/or BCl$_3$. As was also yet further previously mentioned, the etchant gas more specifically comprises, or consists of or consists essentially of, from about 5% by volume to about 20% by volume oxygen, from about 10% by volume to about 60% by volume of the halogen gas (i.e., chlorine) and from about 30% by volume to about 80% by volume of the noble gas (i.e., argon) and from about 5% by volume to about 20% by volume of HBr and/or HCl; preferably from about 5% by volume to about 15% by volume oxygen, from about 20% by volume to about 50% by volume of the halogen gas (i.e., chlorine), from about 40% by volume to about 70% by volume of the noble gas (i.e., argon) and from about 5% by volume to about 15% by volume of HBr and/or HCl; and more preferably from about 5% by volume to about 10% by volume oxygen, from about 20% by volume to about 35% by volume of the halogen gas (i.e., chlorine) and from about 40% by volume to about 60% by volume of the noble gas (i.e., argon) and from about 5 by volume to about 10% by volume of HBr and/or HCl. Thus, the foregoing process conditions stated in previously mentioned Tables may be based on such etchant gas constituency and on such percent (%) by volume value(s).

In the preferred embodiment of the present invention where the mask layers 18a, 18b, 18c and 18d comprise Ti and/or TiN, preferably TiN$_1$, and the electrode layer 16 is an iridium electrode layer 16, the process parameters for etching the iridium electrode layer 16 in a suitable inductively coupled plasma reactor fall into ranges as listed on the basis of flow rates of the gases, including oxygen, the halogen gas(es), (i.e., Cl$_2$), and the noble gas(es) (i.e., argon), as listed in Table X below.

TABLE X

| Process | Broad | Preferred | Optimum |
|---|---|---|---|
| Gas Flow, sccm | | | |
| O$_2$ | 10 to 60 | 10 to 40 | 15 to 30 |
| Cl$_2$ | 30 to 100 | 30 to 70 | 50 to 70 |
| Ar | 50 to 250 | 100 to 200 | 100 to 150 |
| Pressure, mT | 0.1 to 300 | 10 to 100 | 10 to 40 |
| RF Power of Coil Inductor (Watts) | 100 to 5000 | 650 to 2000 | 750 to 1000 |
| RF Power of Wafer Pedestal (Watts) | 50 to 3000 | 100 to 1000 | 150 to 600 |
| Temperature of Wafer (° C.) | about 150 to about 500 | 200 to 400 | 250 to 350 |
| Iridium (Ir) Etch Rate (Å/min) | 200 to 6000 | 500 to 3000 | 500 to 2000 |
| Selectivity of Ir to Ti or TiN of Mask Layers | 0.2 to 50 | 1 to 20 | 6 to 10 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHZ | 400K to 13.5 MHz |

When the etchant gases are a mixture of oxygen, the halogen gas(es) (i.e., chlorine), the noble gas(es) (i.e., argon), and HBr and/or HCl, the process parameters for etching iridium electrode layer 16 supporting a Ti/TiN mask layer 18 in a suitable inductively coupled plasma reactor fall into the ranges as listed on the basis of rates of the gases, including oxygen, the halogen gas(es) (i.e., Cl$_2$), the noble gas(ses) (i.e., Ar), and HBr and/or HCl, as listed in Table XI below:

TABLE XI

| Process | Broad | Preferred | Optimum |
|---|---|---|---|
| Gas Flow, sccm | | | |
| O$_2$ | 10 to 60 | 10 to 40 | 15 to 30 |
| Cl$_2$ | 30 to 100 | 30 to 70 | 50 to 70 |
| Ar | 50 to 250 | 100 to 200 | 100 to 150 |
| HBr and/or HCl | 10 to 60 | 10 to 40 | 15 to 30 |
| Pressure, mT | 0.1 to 300 | 10 to 100 | 10 to 40 |
| RF Power of Coil Inductor (Watts) | 100 to 5000 | 650 to 2000 | 750 to 1000 |
| RF Power of Wafer Pedestal (Watts) | 50 to 3000 | 100 to 1000 | 150 to 600 |
| Temperature of Wafer (° C.) | about 150 to about 500 | 200 to 400 | 250 to 350 |
| Iridium Etch Rate (Å/min) | 200 to 6000 | 500 to 3000 | 500 to 2000 |
| Selectivity of Ir to Ti or TiN of Mask Layers | 0.2 to 50 | 1 to 20 | 6 to 10 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

More generally further, the process parameters for etching in a low density (or high density) plasma the electrode layer 16 (e.g., platinum electrode layer 16) in a suitable inductively coupled plasma reactor fall into ranges as listed on the basis of flow rates of the gases, including nitrogen ($N_2$), the halogen gas(es) (i.e., $Cl_2$), and the noble gas(es) (i.e., argon), as listed in Table XII below.

TABLE XII

| Process | Broad | Preferred | Optimum |
|---|---|---|---|
| Gas Flow, sccm | | | |
| $N_2$ | 5 to 200 | 10 to 150 | 10 to 50 |
| $Cl_2$ | 30 to 400 | 50 to 300 | 100 to 200 |
| Ar | 0 to 200 | 10 to 100 | 10 to 50 |
| Pressure, mT | 0.1 to 300 | 10 to 100 | 10 to 50 |
| RF Power of Coil Inductor (Watts) | 100 to 5000 | 500 to 3000 | 750 to 1500 |
| RF Power of Wafer Pedestal (Watts) | 50 to 3000 | 100 to 1000 | 150 to 400 |
| Temperature of Wafer (° C.) | about 150 to about 500 | 200 to 400 | 250 to 350 |
| Layer 16 Etch Rate (Å/min) | 200 to 6000 | 500 to 3000 | 1000 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

If a reactive ion etch (RIE) plasma processing apparatus is employed for etching the electrode layer 16 (e.g., platinum electrode layer 16) in a low density plasma of the etchant gas(es), the process parameters for etching fall into ranges as listed on the basis of flow rates of the gases, including nitrogen ($N_2$), the halogen gas(es) (i.e., $Cl_2$), and the noble gas(es) (i.e., argon), as listed in Table XIII below.

TABLE XIII

| Process | Broad | Preferred | Optimum |
|---|---|---|---|
| Gas Flow, sccm | | | |
| $N_2$ | 5 to 200 | 30 to 200 | 60 to 120 |
| $Cl_2$ | 30 to 400 | 50 to 300 | 100 to 200 |
| Ar | 0 to 200 | 10 to 100 | 10 to 50 |
| Pressure, mT | 0.1 to 2000 | 50 to 400 | 100 to 200 |
| RF Power of Wafer Pedestal (Watts) | 100 to 5000 | 300 to 2500 | 500 to 1200 |
| Temperature of Wafer (° C.) | about 150 to about 500 | 200 to 400 | 250 to 350 |
| Layer 16 Etch Rate (Å/min) | 200 to 6000 | 500 to 3000 | 1000 to 2000 |
| RF Frequency of Wafer Pedestal | 100K to 300 MHz | 400K to 20 MHz | 400K to 13.5 MHz |

Alternatively, if a reactive ion etch (RIE) plasma processing apparatus is employed for etching the electrode layer 16 (e.g., platinum electrode layer 16) in a low density plasma of the etchant gas(es), the process parameters for etching fall into ranges as listed on the basis of flow rates of the gases, including nitrogen ($N_2$) and the halogen gas(es) (i.e., $Cl_2$), as listed in Table XIV below.

TABLE XIV

| Process | Broad | Preferred | Optimum |
|---|---|---|---|
| Gas Flow, sccm | | | |
| $N_2$ | 5 to 300 | 40 to 200 | 70 to 90 |
| $Cl_2$ | 30 to 600 | 100 to 400 | 150 to 200 |
| Pressure, mT | 0.1 to 2000 | 50 to 400 | 100 to 200 |
| RF Power of Wafer Pedestal (Watts) | 100 to 5000 | 300 to 2500 | 500 to 1200 |
| Temperature of Wafer (° C.) | about 150 to about 500 | 200 to 400 | 250 to 350 |
| Layer 16 Etch Rate (Å/min) | 200 to 6000 | 500 to 3000 | 1000 to 2000 |
| RF Frequency of Wafer Pedestal | 100K to 300 MHz | 400K to 20 MHz | 400K to 13.5 MHz |

Also more generally further, and when the etchant gases are a mixture of nitrogen ($N_2$), the halogen gas(es) (i.e., chlorine), the noble gas(es) (i.e., argon), and HBr and/or $BCl_3$ and/or $SiCl_4$, the process parameters for etching in a low density (or high density) plasma the electrode layer 16 (e.g., platinum electrode layer 16) in a suitable inductively coupled plasma reactor fall into the ranges as listed on the basis of flow rates of the gases, including nitrogen ($N_2$), the halogen gas(es) (i.e., $Cl_2$), the noble gas(es) (i.e., Ar), and HBr and/or $BCl_3$ and/or $SiCl_4$, as listed in Table XV below:

TABLE XV

| Process | Broad | Preferred | Optimum |
|---|---|---|---|
| Gas Flow, sccm | | | |
| $N_2$ | 5 to 200 | 10 to 150 | 10 to 50 |
| $Cl_2$ | 30 to 400 | 50 to 300 | 100 to 200 |
| Ar | 0 to 200 | 10 to 100 | 10 to 50 |
| HBr and/or $BCl_3$ and/or $SiCl_4$ | 1 to 70 | 5 to 40 | 5 to 20 |
| Pressure, mT | 0.1 to 300 | 10 to 100 | 10 to 50 |
| RF Power of Coil Inductor (Watts) | 100 to 5000 | 500 to 3000 | 750 to 1500 |
| RF Power of Wafer Pedestal (Watts) | 50 to 3000 | 100 to 1000 | 150 to 400 |
| Temperature of Wafer (° C.) | about 150 to about 500 | 200 to 400 | 250 to 350 |
| Layer 16 Etch Rate (Å/min) | 200 to 6000 | 500 to 3000 | 1000 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 Mhz |

If a reactive ion etch (RIE) plasma processing apparatus is employed for etching the electrode layer 16 (e.g., platinum electrode layer 16) in a low density plasma of the etchant gas(es), the process parameters for etching fall into ranges as listed on the basis of flow rates of the gases, including nitrogen ($N_2$), the halogen gas(es) (i.e., $Cl_2$), and the noble gas(es) (i.e., Ar), and HBr and/or $BCl_3$ and/or $SiCl_4$, as listed in Table XVI below:

TABLE XVI

| Process | Broad | Preferred | Optimum |
|---|---|---|---|
| Gas Flow, sccm | | | |
| $N_2$ | 5 to 300 | 30 to 200 | 60 to 120 |
| $Cl_2$ | 30 to 400 | 50 to 300 | 100 to 200 |
| Ar | 0 to 200 | 10 to 100 | 10 to 50 |
| HBr and/or $BCl_3$ and/or $SiCl_4$ | 1 to 70 | 5 to 40 | 5 to 20 |
| Pressure, mT | 0.1 to 2000 | 50 to 400 | 100 to 200 |
| RF Power of Wafer Pedestal (Watts) | 100 to 5000 | 300 to 2500 | 500 to 1200 |
| Temperature of Wafer (C. °) | about 150 to about 500 | 200 to 400 | 250 to 350 |
| Layer 16 Etch Rate (Å/min) | 200 to 6000 | 500 to 3000 | 1000 to 2000 |

TABLE XVI-continued

| Process | Broad | Preferred | Optimum |
|---|---|---|---|
| RF Frequency of Wafer Pedestal | 100K to 300 MHz | 400K to 20 MHz | 400K to 13.5 MHz |

Therefore, for this preferred embodiment of the present invention, the foregoing process conditions are preferably based on flow rates of etchant gas(es) having a flow rate value ranging from about 5 to about 500 sccm. As was previously mentioned, the etchant gas comprises or consists of or consists essentially of nitrogen, a halogen (preferably chlorine) and a noble gas selected from the group consisting of helium, neon, and argon. The noble gas is preferably argon. As was also previously mentioned, the etchant gas more specifically comprises, or consists of or consists essentially of, preferably from about 0.1% by volume to about 60% by volume nitrogen, from about 40% by volume to about 90% by volume of the halogen gas (i.e., chlorine), and from about 0.1% by volume to about 40% by volume of the noble gas (i.e., argon); more preferably from about 5% by volume to about 40% by volume nitrogen, from about 50% by volume to about 80% by volume of the halogen gas (i.e., chlorine), and from about 5% by volume to about 30% by volume of the noble gas (i.e., argon); most preferably from about 10% by volume to about 30% by volume nitrogen, from about 60% by volume to about 70% by volume of the halogen gas (i.e., chlorine), and from about 10% by volume to about 20% by volume of the noble gas (i.e., argon). Alternatively, the etchant gas comprises or consists of or consists essentially of a nitrogen and halogen (preferably chlorine). The etchant gas more specifically comprises, or consists of or consists essentially of, preferably from about 10% by volume to about 90% by volume nitrogen and from about 10% by volume to about 90% by volume of the halogen gas (i.e., chlorine); more preferably from about 20% by volume to about 60% by volume nitrogen and from about 40% by volume to about 80% by volume of the halogen gas (i.e., chlorine); most preferably from about 30% by volume to about 40% by volume nitrogen and from about 60% by volume to about 70% by volume of the halogen gas (i.e., chlorine). In another preferred embodiment of the invention and was also previously mentioned, the etchant gas comprises, preferably consists of or consists essentially of, nitrogen, the halogen (i.e., chlorine), the noble gas (i.e., argon), and a gas selected from the group consisting of HBr, BCl$_3$, SiCl$_4$, and mixtures thereof. As was further also previously mentioned, the etchant gas more specifically comprises, or consists of or consists essentially of, from about 0.1% by volume to about 60% by volume nitrogen, from about 40% by volume to about 90% by volume of the halogen gas (i.e., chlorine), and from about 0.1% by volume to about 40% by volume of the noble gas (i.e., argon), and from about 1% by volume to about 30% by volume of HBr and/or BCl$_3$ and/or SiCl$_4$; preferably from about 5% by volume to about 40% by volume nitrogen, from about 50% by volume to about 80% by volume of the halogen gas (i.e., chlorine), and from about 5% by volume to about 30% by volume of the noble gas (i.e., argon), and from about 5% by volume to about 20% by volume of HBr and/or BCl$_3$ and/or SiCl$_4$; and more preferably from about 10% by volume to about 30% by volume nitrogen, from about 60% by volume to about 70% by volume of the halogen gas (i.e., chlorine), and from about 10% by volume to about 20% by volume of the noble gas (i.e., argon), and from about 1% by volume to about 10% by volume of HBr and/or BCl$_3$ and/or SiCl$_4$.

Thus, the foregoing process conditions stated in the previously mentioned Tables may be based on such etchant gas constituency and on such percent (%) by volume value(s).

It has also been discovered that noble metal etch by-products (e.g., platinum etch byproducts) may become less conductive electrically, and the stability of RF power transmission through the dielectric window becomes more stable, by operating the platinum etch process in a high Cl$_2$/Ar ratio and a high pressure regime. The Cl$_2$/Ar ratio may be any suitable elevated or high gas volume ratio, preferably a Cl$_2$/Ar volume ratio of greater than 2(>2):1, more preferably greater than 4(>4):1. The high pressure may be any suitable elevated or high pressure, preferably greater than 10 mTorr (>10 mTorr), more preferably greater than 24 mTorr (>24). More generally, when the etchant gases are a mixture of the halogen gas(es) (i.e., chlorine) and the noble gas(es) (i.e., argon), the process parameters for etching the electrode layer 16 (e.g., platinum electrode layer 16) in a suitable inductively coupled plasma reactor for reducing the electrical conductivity of layer 16 by-products fall into the ranges as listed on the basis of flow rates of the gases, including the halogen gas(es) (i.e., Cl$_2$) and the noble gas(es) (i.e., Ar), as listed in Table XVII below:

TABLE XVII

| Process | Broad | Preferred | Optimum |
|---|---|---|---|
| Gas Flow, sccm | | | |
| Halogen (e.g., Cl$_2$) | 30 to 400 | 50 to 250 | 100 to 150 |
| Noble gas (e.g., Ar) | 20 to 300 | 20 to 100 | 20 to 30 |
| Cl$_2$/Ar vol. ratio | 1 to 20 | 2 to 10 | 4 to 6 |
| Pressure, mT | 0.1 to 300 | 10 to 100 | 10 to 50 |
| RF Power of Coil Inductor (Waifs) | 100 to 5000 | 500 to 3000 | 750 to 1500 |
| RF Power of Wafer Pedestal (Waifs) | 50 to 3000 | 100 to 1000 | 150 to 400 |
| Temperature of Wafer (° C.) | about 150 to about 500 | 200 to 400 | 250 to 350 |
| Layer 16 Etch Rate (Å/min) | 200 to 6000 | 500 to 3000 | 1000 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

The foregoing process conditions stated in Table XVII above may be based on the following etchant gas constituency for reducing the electrical conductivity of noble metal by-products (e.g., platinum etch by-products): preferably from about 50% to about 96% by volume of the halogen gas(es) (i.e., chlorine) and from about 4% to about 50% by volume of the noble gas(es) (i.e., argon); more preferably from about 60% to about 90% by volume of the halogen gas(es) (i.e., chlorine) and from about 10% to about 40% by volume of the noble gas(es) (i.e., argon); most preferably from about 70% to about 85% by volume of the halogen gas(es) (i.e., chlorine) and from about 15% to about 30% by volume of the noble gas(es).

Figure 11:
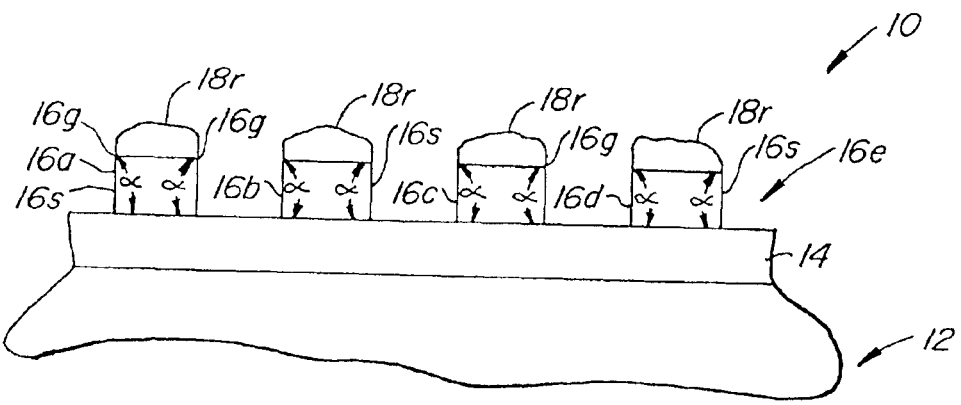
FIG. 11 is a side elevational view of the semiconductor wafer of FIG. 7 after the platinum electrode layer has been etched to produce an etched platinum electrode layer with a residual mask layer on top thereof.
Figure 12:
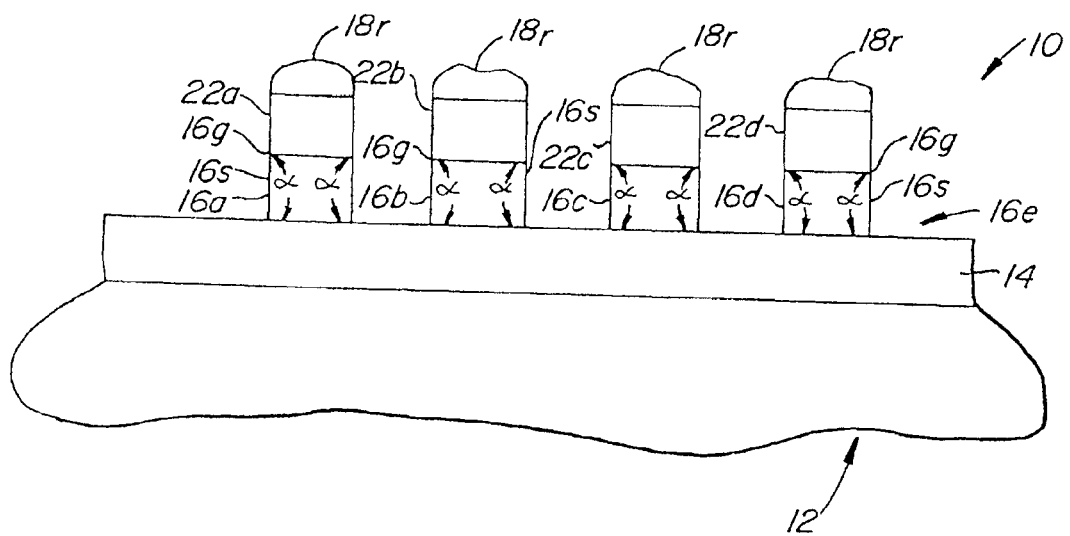
FIG. 12 is a side elevational view of the semiconductor wafer of FIG. 8 after the platinum electrode layer has been etched to produce an etched platinum electrode layer with a residual mask layer on top of the residual protective layer.

For the embodiment of the invention illustrated in FIGS. 2, 6, 8 and 10, the protective layers 22a, 22b, 22c and 22d protect the corners 16g of the etched electrode layers 16a, 16b, 16c and 16d during the etching process. Typically and as best shown in FIGS. 11 and 12, some of the mask layers 18a, 18b, 18c and 18d would be etched during the etching process, leaving residual mask layers 18r on top of etched electrode layers 16a, 16b, 16c and 16d, or on top of the protective layers 22a, 22b, 22c and 22d. The protective layers 22a, 22b, 22c and 22d, respectively, insure that the corners 16g of the etched electrode layers 16a, 16b, 16c and 16d are protected during etching, especially in the event that the etching process removes essentially all of the mask layers 18a, 18b, 18c and 18d. Maintaining the corners 16g of the etched electrode layers 16a, 16b, 16c and 16d protects the quality of the profile formed during etching of the electrode layer 16 to produce the etched electrode layers 16a, 16b, 16c and 16d.

After the electrode layer 16 has been etched to produce the electrode layers 16a, 16b, 16c and 16d, the residual mask layers 18r (if not completely removed during the etching process) typically remain on top of the veil-less etched electrode layers 16a, 16b, 16c and 16d, or on top of the protective layers 22a, 22b, 22c and 22d which are respectively supported by the essentially veil-less etched electrode layers 16a, 16b, 16c and 16d, all as best shown in FIGS. 11 and 12. The residual mask layers 18r are to be removed by any suitable means and/or in any suitable manner, such as by $CHF_3$/Ar plasma. Likewise for the embodiment of the invention depicted in FIG. 12, the protective layers 22a, 22b, 22c and 22d are to be removed after removal of the residual mask layers 18r from the protective layers 22a, 22b, 22c and 22d. The protective layers 22a, 22b, 22c and 22d may be removed by any suitable means and/or in any suitable manner. For example, when the protective layers 22a, 22b, 22c and 22d comprise TiN removal is by Ar/$Cl_2$ plasma in a DPS™ brand chamber of the Metal Etch DPS Centura™ brand plasma processing apparatus under the following apparatus and process conditions as listed in Table XVIII below.

TABLE XVIII

| Process | Broad | Preferred | Optimum |
|---|---|---|---|
| Gas Flow, sccm | | | |
| $Cl_2$ | 20 to 150 | 30 to 120 | 40 to 100 |
| Ar | 20 to 100 | 30 to 80 | 40 to 60 |
| Pressure, mT | 0.5 to 40 | 4 to 30 | 7 to 14 |
| RF Power of Coil Inductor (Watts) | 500 to 3000 | 500 to 2000 | 800 to 1200 |
| RF Power of Wafer Pedestal (Watts) | 50 to 500 | 50 to 300 | 50 to 150 |
| Temperature of Wafer (° C.) | 20 to 500 | 20 to 150 | 80 to 130 |
| TiN Etch Rate (Å/min) | 500 to 5000 | 1000 to 3500 | 1500 to 2500 |
| RF Frequency of Coil Inductor | 100K to 300 MHz | 400K to 20 MHz | 2 to 13.5 MHz |
| RF Frequency of Wafer Inductor | 100K to 300 MHz | 400K to 20 MHz | 400K to 13.5 MHz |

Figure 13:
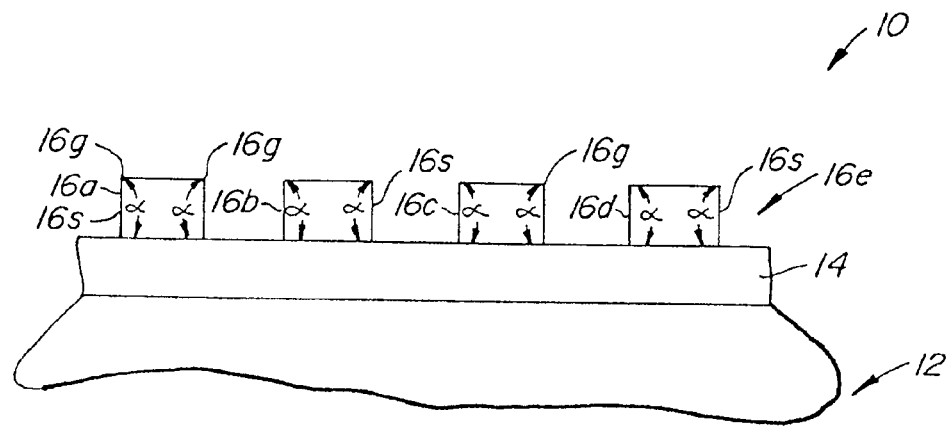
FIG. 13 is a side elevational view of the semiconductor wafer of FIG. 11 with the residual mask layer removed from the surface of the etched platinum electrode layer.
Figure 14:
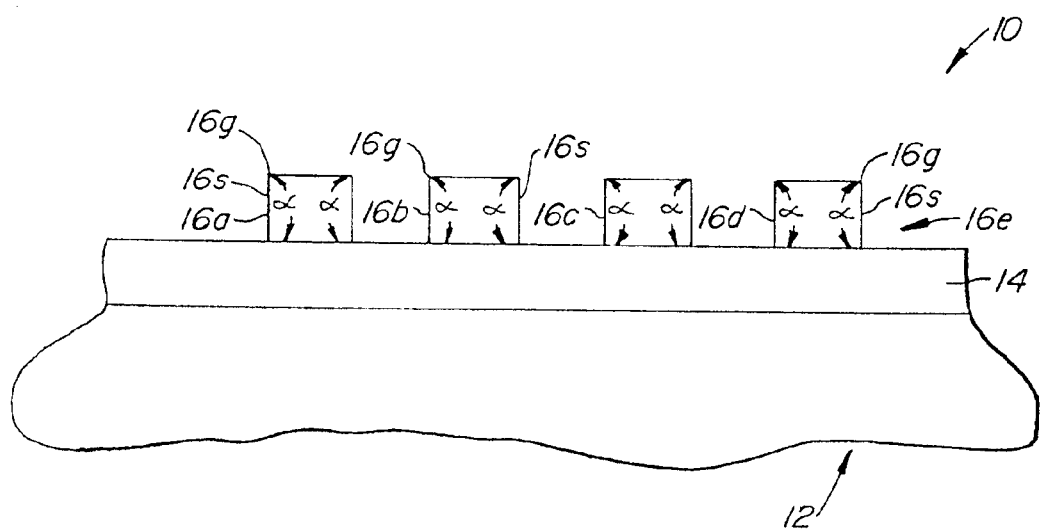
FIG. 14 is a side elevational view of the semiconductor wafer of FIG. 12 with the residual mask layer and the residual protective layer removed from the surface of the etched platinum electrode layer.
Figure 15:
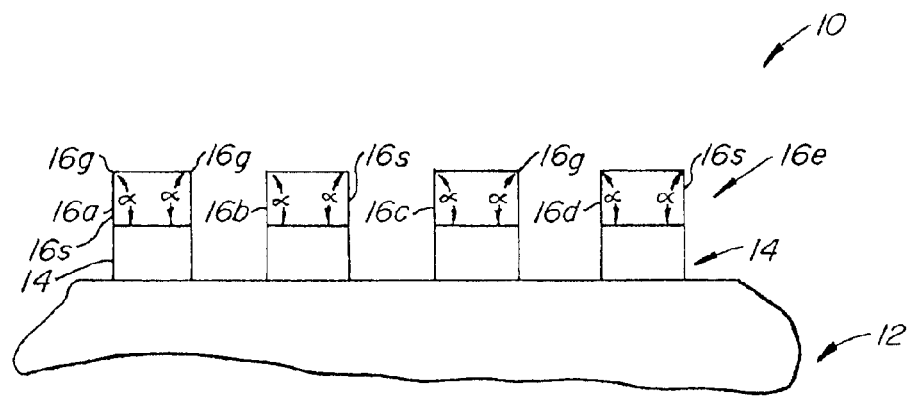
FIG. 15 is a side elevational view of semiconductor wafer of FIG. 11 after the residual mask layer has been removed from the surface of the etched platinum electrode layer and with the barrier layer having been etched.
Figure 16:
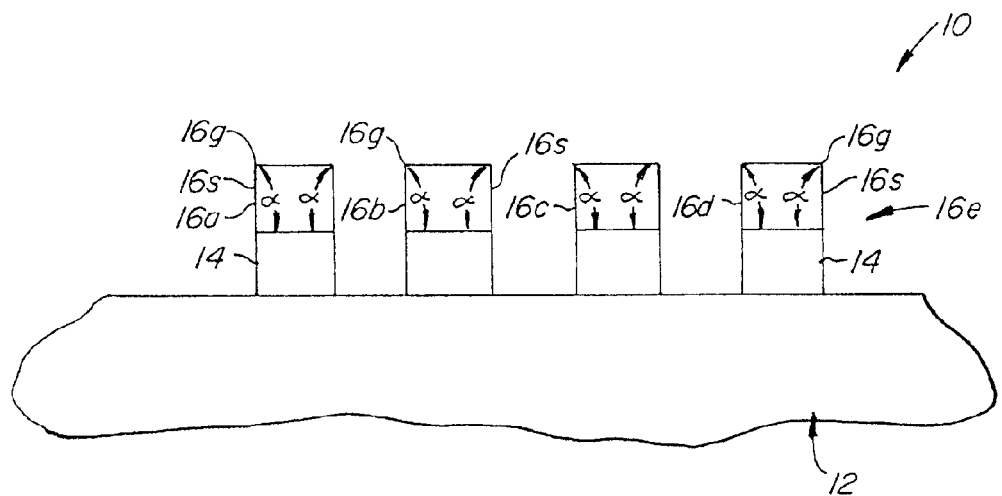
FIG. 16 is a side elevational view of semiconductor wafer of FIG. 12 after the residual mask layer and the residual protective layer have been removed from the surface of the etched platinum electrode layer and with the barrier layer having been etched.

After removal of residual mask layers 18r, or the residual mask layers 18r and the protective layers 22a, 22b, 22c and 22d for the embodiment of the invention illustrated in FIG. 12, the veil-less etched electrode layered structure of FIG. 13 or FIG. 14 remains. It should be noted, as best shown in FIGS. 15 and 16, respectively, that the barrier layer 14 could be etched simultaneously during or after removal of the residual mask layers 18r (see FIG. 15), or etched simultaneously during or after removal of the residual mask layers 18r and the protective layers 22a, 22b, 22c and 22d (see FIG. 16).

It is to be understood that the patterned resist 20 (i.e., resist members 20a, 20b, 20c and 20d) for the embodiment of the invention depicted in FIG. 1, or the patterned resist 20 (i.e., resist numbers 20a, 20b, 20c and 20d) and/or the mask layers 18a, 18b, 18c and 18d for the embodiment of the invention depicted in FIG. 2, may be removed at any suitable time, preferably before the etching of the electrode layer 16. Similarly, the protective layers 22a, 22b, 22c and 22d and/or mask layers 18a, 18b, 18c and 18d for the embodiment of the invention depicted in FIG. 2, may also be removed at any suitable time, such as during the etching process or after the etching process.

In another preferred embodiment of the present invention, the wafer 10 of FIG. 2 is provided with the semiconductor substrate 12, the barrier layer 14 (e.g., TiN, TiSiN, Ti, WN, TaN, TaSiN, Ta, etc.) and the protective layer 22 comprising a compound selected from the group consisting of TiN, TiSiN, Ti, WN, TaN, TaSiN, Ta, and mixtures thereof, and the mask layer 18 selected from the group consisting of CVD $SiO_2$, TEOS, $Si_3N_4$, BSG, PSG, BPSG, a low dielectric constant material with a low dielectric constant of less than about 3.0, and mixtures thereof. The electrode layer 16 is a noble metal such as Pt, Ir, Pd, and Ru, or any oxide or alloy of a noble metal. This multilayered structure is initially placed in a suitable plasma processing apparatus to selectively break through and etch away from the surface of the electrode layer 16, the mask layer 18 except those mask layers 18a, 18b, 18c and 18d that are respectively below the resist members 20a, 20b, 20c and 20d as best shown in FIG. 6. The plasma for any suitable plasma processing apparatus may employ any suitable etchant gas.

Figure 26:
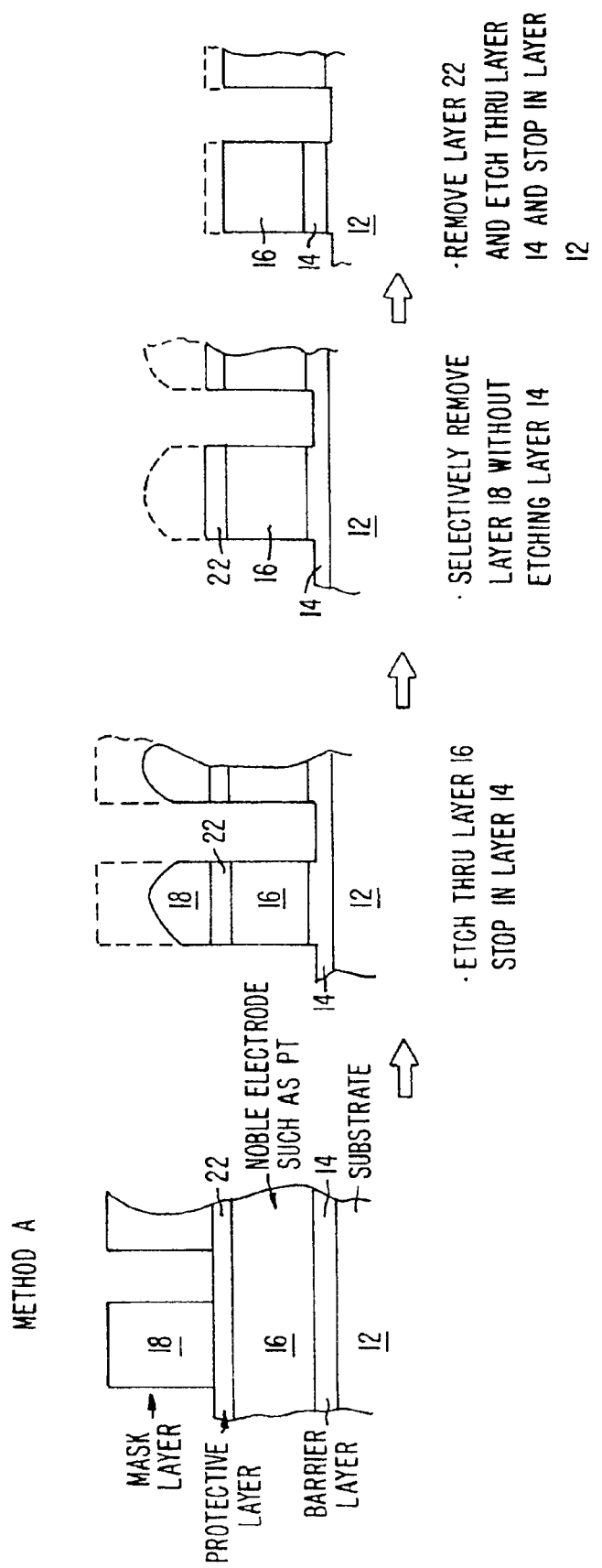
FIG. 26 is a schematic diagram illustrating masking and etching sequences for another embodiment of the invention.

After the mask layers 18a, 18b, 18c and 18d have been produced as shown in FIG. 6, the resist members 20a, 20b, 20c and 20d are removed in accordance with any of the previously mentioned procedures such that masking and etching sequence of FIG. 26 may be conducted. As best shown in FIG. 26, after removal of the resist 20 (i.e., resist members 20a, 20b, 20c and 20d, the protective layer 22 and the electrode layer 16 are etched. Preferably, etching continues into the barrier layer 14. Stated alternatively, etching stops in the barrier layer 14. Subsequently, the mask layers 18a, 18b, 18c and 18d are selectively removed, preferably without etching the barrier layer 14. The protective layers 22a, 22b, 22c and 22d are then removed, and the remaining part of the barrier layer 14 is thereafter etched with the etching process stopping in the substrate 12.

Continuing to refer to FIG. 26 for a more particular explanation of the masking and etching sequence for this preferred embodiment of the invention, the protective layer 22 may be selectively etched in accordance with any of the previously mentioned procedures such as with a $Cl_2$/HBr and/or $BCl_3$/Ar gas chemistry in the same plasma processing apparatus that selectively etched the mask layer 18. Alternatively, and as was previously mentioned, the protective layer 22 may be selectively etched in the same chamber and under the same conditions for etching the electrode layer 16, i.e., in a high density plasma chamber containing a high density inductively coupled plasma. Etching of the protective layer 22 produced protective layers 22a, 22b, 22c and 22d. If the protective layer 22 is etched in accordance with the same procedure(s) for etching the electrode layer 16, the resist members 20a, 20b, 20c and 20d are initially removed before etching because they cannot be exposed to the high temperature (i.e., >150° C.) processing conditions for etching the electrode layer 16.

Subsequent to selectively etching the protective layer 22, the exposed parts of the electrode layer 16 are etched in accordance with any of the methods (e.g., the temperature of the wafer 10 is greater than about 150° C.) and any of the etchant gases of any of the embodiments of the present invention to produce electrode layers 16a, 16b, 16c and 16d and expose selective parts of the barrier layer 14. The electrode layer 16 may be etched not only in a high density plasma but also in a low density plasma. The mask layers 18a, 18b, 18c and 18d are then removed in any suitable plasma processing apparatus employing a plasma of any suitable etchant gas.

After removal of the mask layers 18a, 18b, 18c and 18d, the protective layers 22a, 22b, 22c and 22d are then removed in accordance with any suitable procedure and process conditions. Subsequently, and as best shown in FIG. 26, the barrier layer 14 is then etched through and the etching process ceases in the substrate 12. The foregoing sequences may be performed on the semiconductor wafer 10 of FIG. 1 (i.e., a wafer without the protective layer 22). All reactors and process conditions for conducting the foregoing mask and etching sequence may be any suitable reactors and process conditions.

Figure 27:
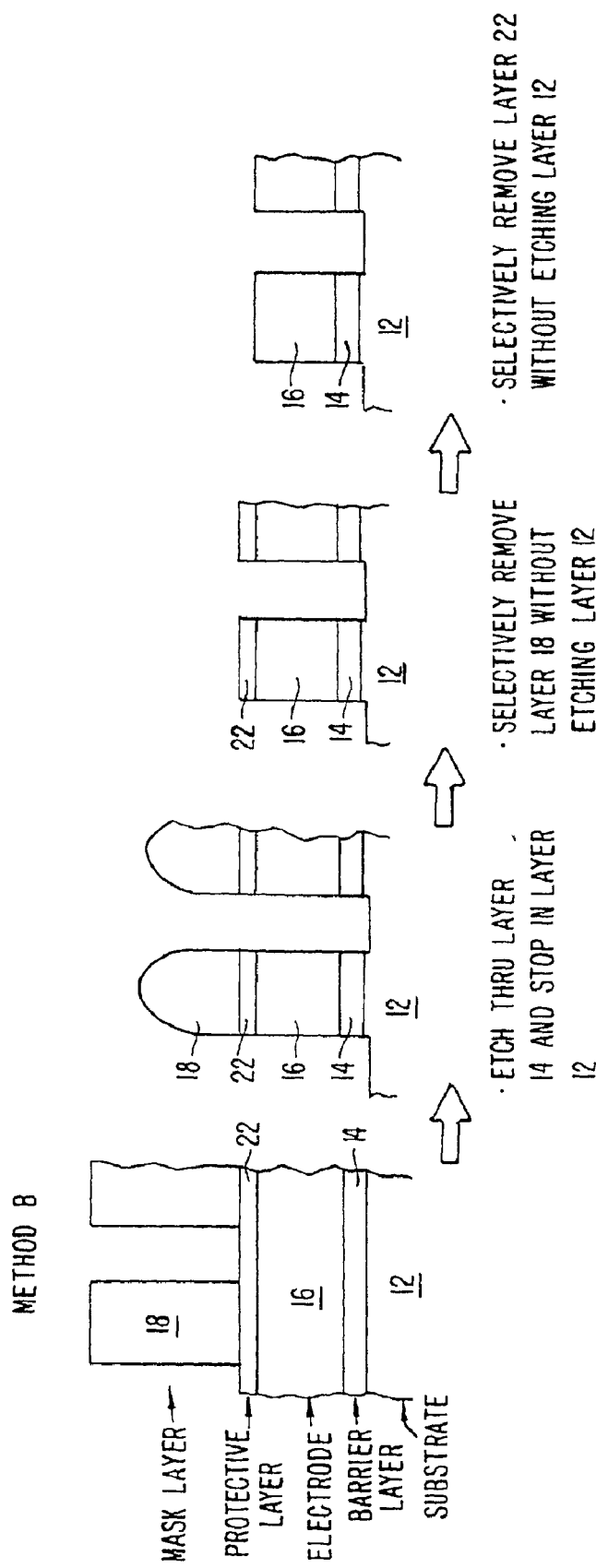
FIG. 27 is a schematic diagram illustrating masking and etching sequences for a further embodiment of the invention.

Referring now to FIG. 27 for another embodiment of the present invention, the etching sequence is the same as for FIG. 26 except instead of etch-stopping in the barrier layer 14 before removal of the mask layer 18, etching continues into the substrate 12. After etching into the substrate 12, the mask layer 18 and the protective layer 22 are respectively removed, preferably without etching any further into the substrate 12. The barrier layer 14 and the protective layer 22 may be any one of the same compounds for the barrier layer 14 and the protective layer 22 for the embodiment of the invention illustrated in FIG. 26. The mask layer 18 is preferably selected from the group consisting of $Si_3N_4$, BSG, PSG, BPSG, a low dielectric constant (k) material with a dielectric constant less than about 3.0, and mixtures thereof. All reactors and process conditions for conducting the foregoing sequences may be any suitable reactors and process conditions, including the conditions where the temperature of the substrate 12 is greater than about 150° C. and where the etchant gases may be any of the etchant gases of any of the embodiments of the present invention. The foregoing sequences may be performed on the semiconductor wafer 10 of FIG. 1 (i.e., a wafer without the protective layer 22).

Figure 28:
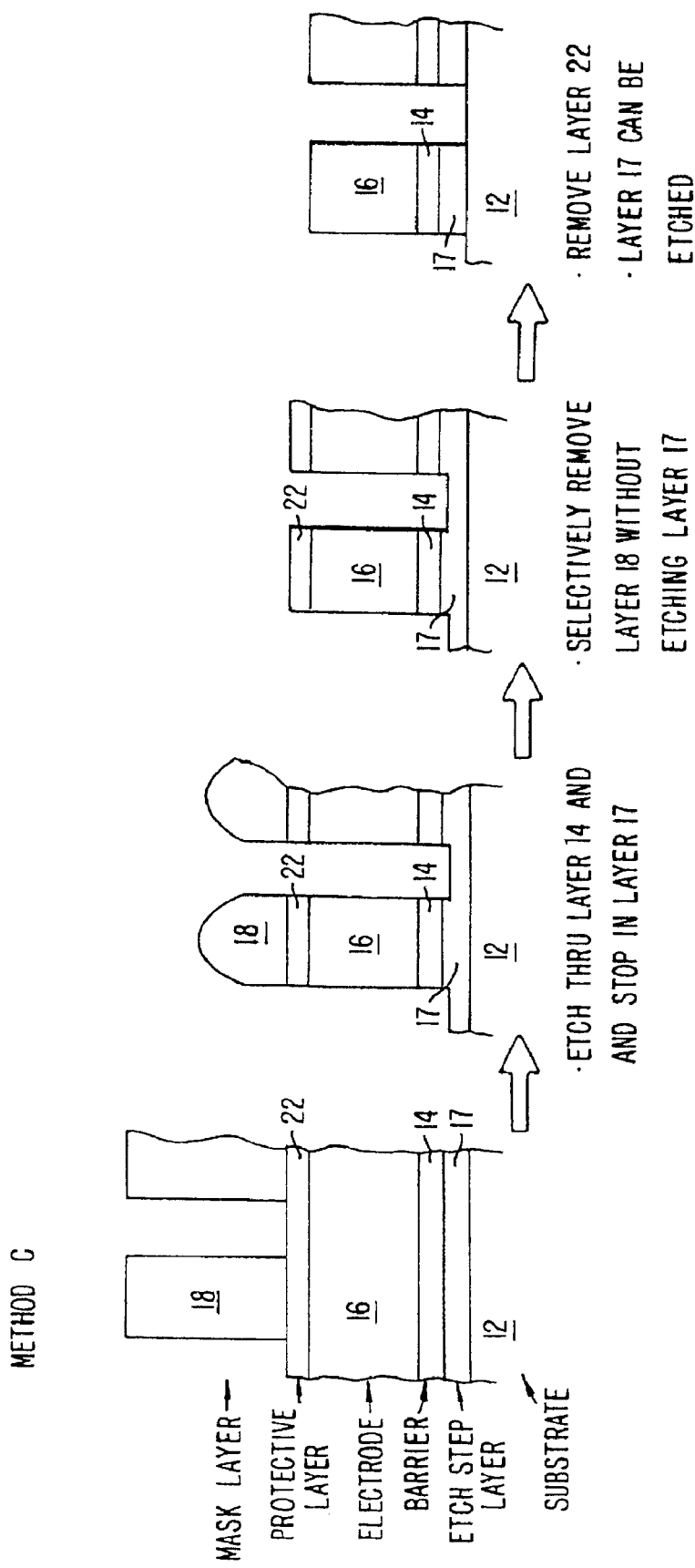
FIG. 28 is a schematic diagram illustrating masking and etching sequences for yet another embodiment of the invention.

Referring now to FIG. 28 for another embodiment of the present invention, there is seen the semiconductor wafer 10 of FIG. 25 having the etch-stop layer 17 (e.g., $Si_3N_4$, $TiO_2$, $RuO_2$, $IrO_2$). The etching sequence comprises respectively etching through the protective layer 22, the electrode layer 16, and the barrier layer 14. The etching sequence stops in the etch-stop layer 17. Subsequently, the mask layer 18 is selectively removed, preferably without etching the etch-stop layer 17, and then the protective layer 22 is removed. The etch-stop layer 17 may be left intact or etched down to the substrate 12. The barrier layer 14 and the protective layer 22 may be any one of the same compounds for the barrier layer 14 and the protective layer 22 for the embodiment of the invention in FIG. 26. For this embodiment of the invention, the mask layer 18 is preferably selected from the group consisting of CVD $SiO_2$, TEOS, BSG, PSG, BPSG, a low dielectric constant material with a dielectric constant of less than about 3.0 and mixtures thereof. All reactors and process conditions for conducting the foregoing sequences may be any suitable reactors and process conditions, including the conditions where the temperature of the substrate 12 is greater than about 150° C. and where the etchant gases may be any of the etchant gases of any of the embodiments of the present invention. The foregoing sequences may be performed on the semiconductor wafer 10 without the protective layer 22.

Figure 29:
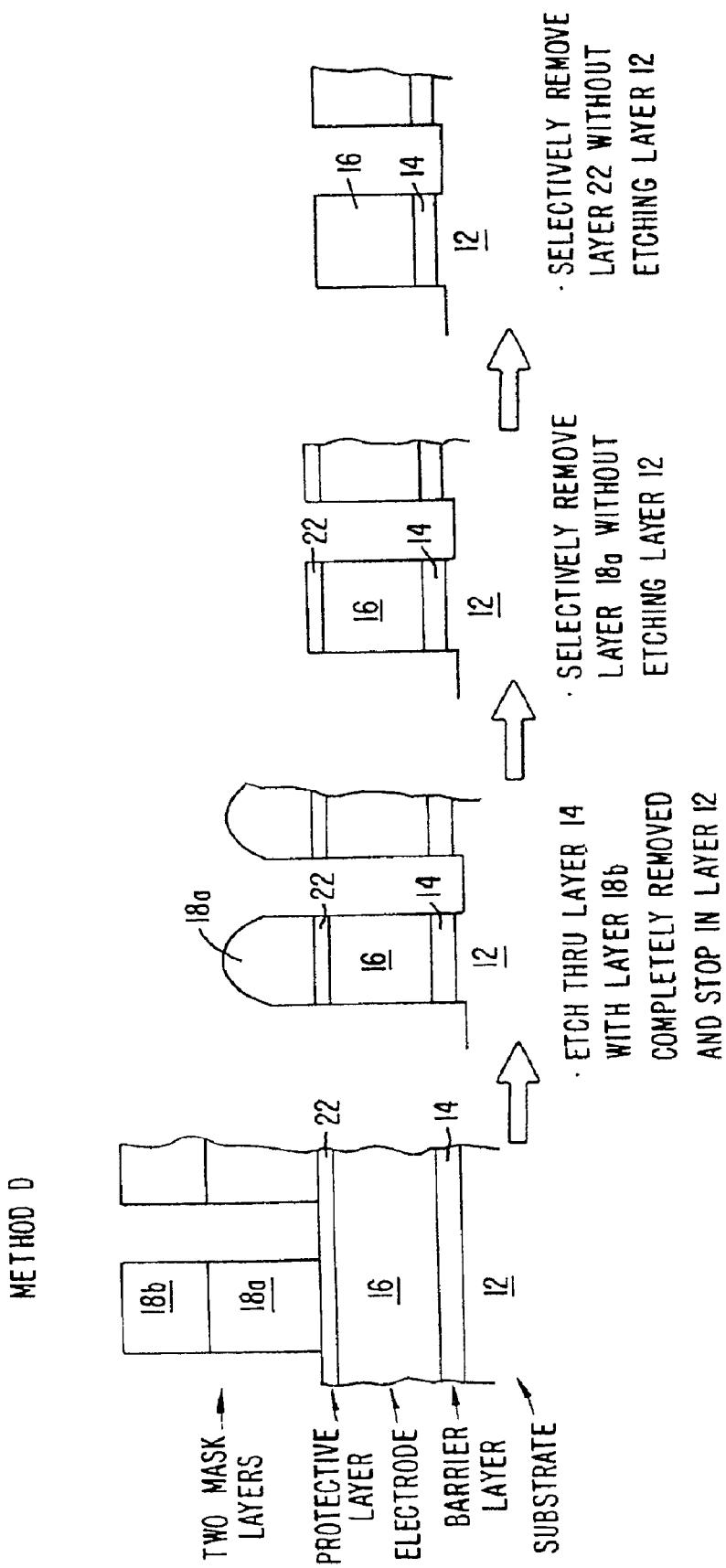
FIG. 29 is a schematic diagram illustrating masking and etching sequences for yet a further embodiment of the invention.

In another preferred embodiment of the invention as best shown in FIG. 29, there is seen the semiconductor wafer 10 having mask layer 18a and mask layer 18b. The ratio of the combined thicknesses of mask layer 18a and mask layer 18b (i.e., thickness of mask layer 18a plus thickness of mask layer 18b) to the thickness of the electrode layer 16 ranges from about 0.2 to about 5.0, preferably from about 0.5 to about 4.0, more preferably from about 1.0 to about 3.0. Stated alternatively, the ratio (thickness of mask layer 18a plus thickness of mask layer 18b)/thickness of electrode layer 16 ranges from about 0.2 to about 5.0, preferably from about 0.5 to about 4.0, more preferably from about 1.0 to about 3.0. Mask layer 18a is preferably composed of a compound selected from the group consisting of $Si_3N_4$, BSG, PSG, BPSG, an organic polymer, a low dielectric constant material with a dielectric constant of less than about 3.0 and mixtures thereof. A suitable organic polymer has been determined to be an organic polymer sold by Dow Chemical Co. of Midland, Mich., under the registered trademark SiLK®. Mask layer 18b is preferably composed of a compound selected from the group consisting of CVD $SiO_2$, TEOS, $Si_3N_4$, BSG, PSG, BPSG, and SiC. The barrier layer 14 and the protective layer 22 may be any one of the same compounds for the barrier layer 14 and the protective layer 22 for the embodiment of the invention in FIG. 26. Mask layer 18b is initially removed, or optionally left in place, and the etch sequence includes: respectively etching through the protective layer 22, the electrode layer 16, and the barrier layer 14. The etch sequence terminates in the substrate 12. Subsequently, mask layer 18b, or both mask layers 18a and 18b, are selectively removed, preferably without etching the substrate 12. Protective layer 22 is selectively removed from the etched electrode layer 22, preferably without etching substrate 12. The foregoing sequences may be performed on the semiconductor wafer 10 without the protective layer 22. All reactors and process conditions for conducting the foregoing sequences for this embodiment of the invention may be any suitable reactor and process conditions, including the conditions where the temperature of the substrate 12 is greater than about 150° C. and where the etchant gases may be any of the etchant gases of any of the embodiments of the present invention.

Thus, by the practice of the preferred embodiment of the inventions in FIGS. 26–29, there is provided masking and etch sequences. The respective layer thickness(es) and composition(s) for the individual layers are given in the following Table XIX. It is to be understood that whenever "electrode layer 16" is mentioned for any of the embodiments of the present invention, "electrode layer 16" would include the combination of one or more layer(s) with each layer respectively comprising a noble metal and/or an oxide(s) of one or more noble metal and/or an alloy(s) of one or more noble metal(s). Thus, by way of example only, "electrode layer 16" could comprise the combination of a layer of platinum, a layer of ruthenium disposed on the layer of platinum, and a layer of iridium oxide disposed on the layer of ruthenium. It is to be similarly understood that whenever "thickness of electrode layer 16" is mentioned for any of the embodiments of the present invention, the "thickness of electrode layer 16" would include the summation of the respective thicknesses of all layer(s) that form the "electrode layer 16." Thus, by way of example only, if "electrode layer 16" comprises the combination of a layer of platinum having a thickness of 300 Å, a layer of iridium having a thickness of 500 Å, and a layer of iridium dioxide having a thickness of 200 Å, the thickness of the electrode layer 16 would be 1000 Å (i.e., 300 Å+500 Å+200 Å).

TABLE XIX

| Reference Numerals of Layers | Layer Thickness (Å) | | | Preferred Type of Material for Layers By Way of Example Only | | | |
|---|---|---|---|---|---|---|---|
| | Broad | Preferred | Optimum | Method of FIG. 26 | Method of FIG. 27 | Method of FIG. 28 | Method of FIG. 29 |
| 17 | 50 to 1000 | 200 to 700 | 300 to 500 | N/A | N/A | $Si_3N_4$, $TiO_2$ $RuO_2$, $IrO_2$ | N/A |
| 14 | 50 to 1000 | 100 to 500 | 100 to 300 | TiN, TiSiN, Ti, WN, TaN, TaSiN, Ta | TiN, TiSiN, Ti, WN, TaN, TaSiN, Ta | TiN, TiSiN, Ti, WN, TaN, TaSiN, Ta | TiN, TiSiN, Ti, WN, TaN, TaSiN, Ta |
| 16 | 500 to 5000 | 1000 to 4000 | 2000 to 3000 | Pt, Ir, Ru | Pt, Ir, Ru | Pt, Ir, Ru | Pt, Ir, Ru |
| 22 | 0 to 1000 | 100 to 600 | 100 to 400 | TiN, TiSiN, Ti, WN, TaN, TaSiN, Ta | TiN, TiSiN, Ti, WN, TaN, TaSiN, Ta | TiN, TiSiN, Ti, WN, TaN, TaSiN, Ta | TiN, TiSiN, Ti, WN, TaN, TaSiN, Ta |
| 18 | 1000 to 15000 | 3000 to 12000 | 6,000 to 9000 | CVD $SiO_2$, TEOS, $Si_3N_4$, BSG, BPSG, low dielectric constant material with dielectric constant less than 3.0 | $Si_3N_4$, BSG, PSG, BPSG, low dielectric constant material with dielectric constant less than 3.0 | CVD $SiO_2$, TEOS, BSG, PSG, BPSG, low dielectric constant (k) material with dielectric constant less than 3.0 | N/A |
| 18a | 900 to 10,500 | 1500 to 9500 | 3000 to 8000 | N/A | N/A | N/A | $Si_3N_4$, BSG, PSG, BPSG, organic polymers, low dielectric constant material with dielectric constant less than 3.0 |
| 18b | 100 to 6000 | 300 to 5000 | 500 to 4000 | N/A | N/A | N/A | CVD $SiO_2$, TEOS, BSG, PSG, BPSG, SiC |

The invention will be illustrated by the following set forth example which is being given to set forth the presently known best mode and by way of illustration only and not by way of any limitation. All parameters such as concentrations, mixing proportions, temperatures, pressure, rates, compounds, etc., submitted in this example are not to be construed to unduly limit the scope of the invention.

EXAMPLE I

A test semiconductor wafer was formulated with the following film stack:

0.8 μm patterned PR (photoresist)/5000 Å Oxide/1000 Å Ti/1000 Å Pt/300 Å TiN

The feature size of the patterned PR test semiconductor wafer was 0.3 μm block and 0.25 μm spacing. The oxide mask (i.e., the mask layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening the oxide mask comprised about 68% by volume Ar and about 32% by volume $CHF_3$. The reactor and process conditions were as follows:

| Reactor Conditions | |
|---|---|
| Pressure | 60 mTorr |
| RF Power | 850 watts |
| Rotational Magnetic Field | 40 Gauss |
| Temperature of Test Wafer | 100° C. |
| Oxide Mask Etch Rate | 3000 Å/min |
| Process Conditions Based on the Flow Rate of Ar and $CHF_3$ | |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The Ti protective layer was etched with Ar, $Cl_2$ and $BCl_3$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |
| Process Conditions Based on the Flow Rate of Ar and Cl$_2$ and BCl$_3$ | |
| Ar | 40 sccm |
| Cl$_2$ | 30 sccm |
| BCl$_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |

The platinum layer of the test semiconductor wafer was then etched with Ar and Cl$_2$ as the etchant gas and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 150 watts |
| Temperature of Test Wafer | 260° C. |
| Platinum Etch Rate | 1500 Å/min |
| Process Conditions Based on the Flow Rate of Ar and Cl$_2$ | |
| Ar | 40 sccm |
| Cl$_2$ | 60 sccm |
| Pressure, mTorr | 12 mTorr |
| RF Power to Coil Inductor | 900 watts |
| RF Power to Wafer Pedestal | 150 watts |
| Temperature (° C.) of Test Wafer | 260° C. |
| Pt Etch Rate (Å/min) | 1500 Å/min |
| Selectivity of Pt/Oxide Mask | 1:1 |

Figure 19:
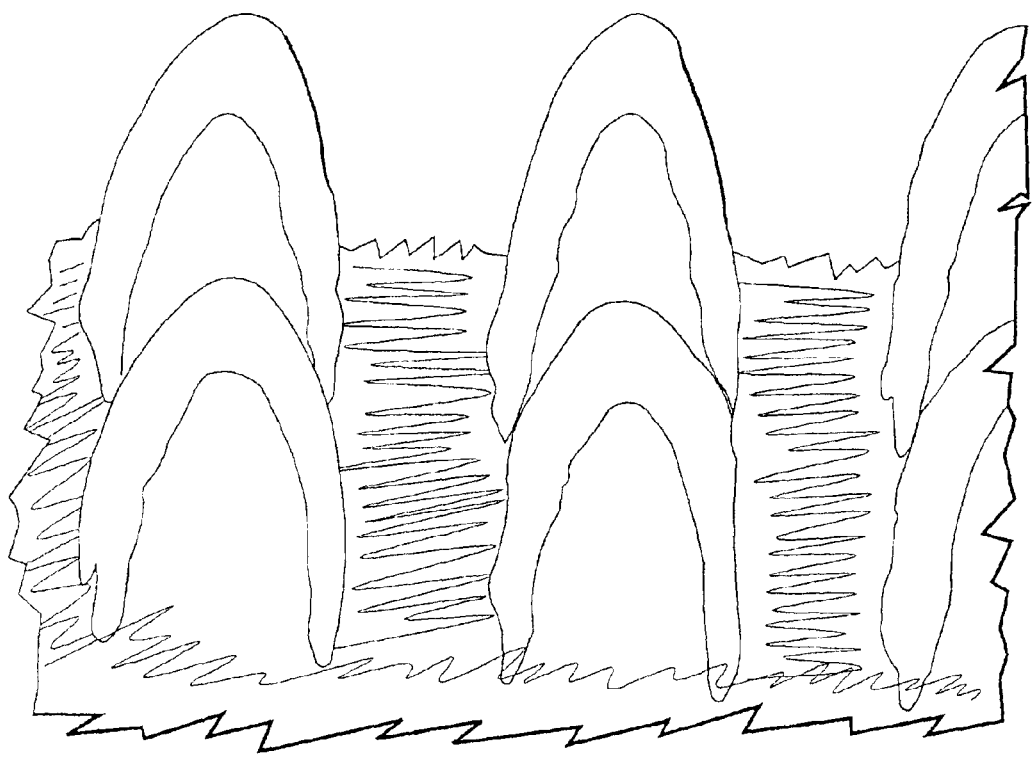
FIG. 19 is a picture showing an elevational view of a test semiconductor wafer for Example I after the platinum electrode layer was etched in accordance with the process conditions listed in Example I.

The resulting etched platinum layer of the test semiconductor wafer is shown in FIG. 19 wherein a platinum profile of about 87 degrees is shown.

Figure 20:
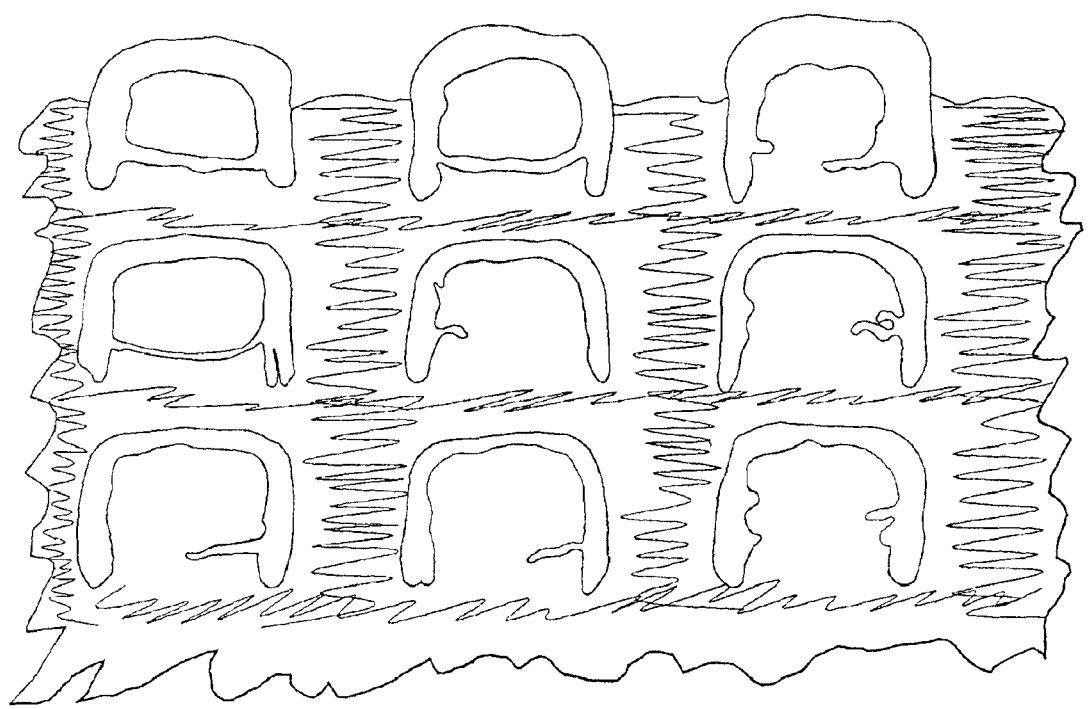
FIG. 20 is a picture showing an elevational view of the test semiconductor wafer of FIG. 19 after the oxide mask was removed.
Figure 21:
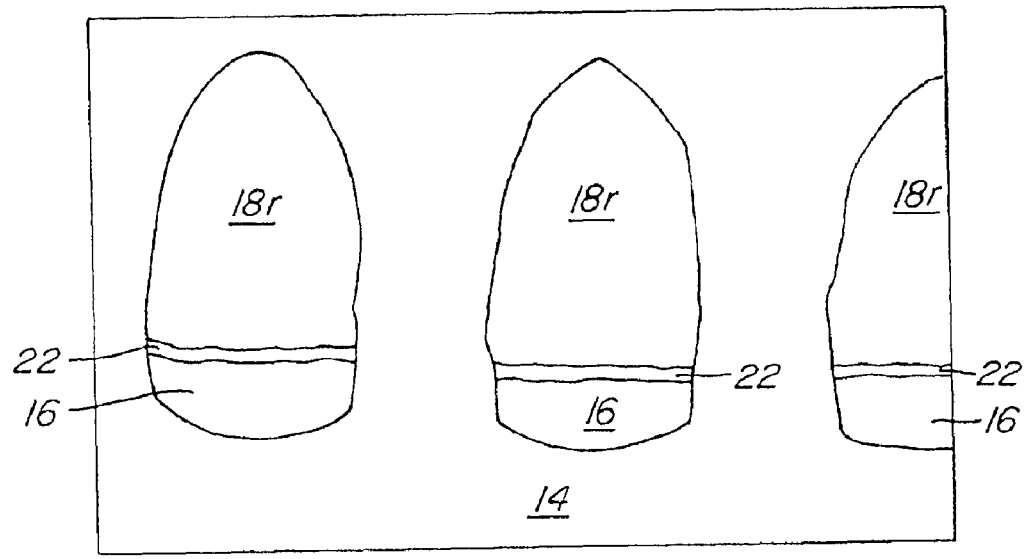
FIG. 21 is a drawing representing the elevational view in the picture of FIG. 19 with the respective parts identified by a reference numeral.
Figure 22:
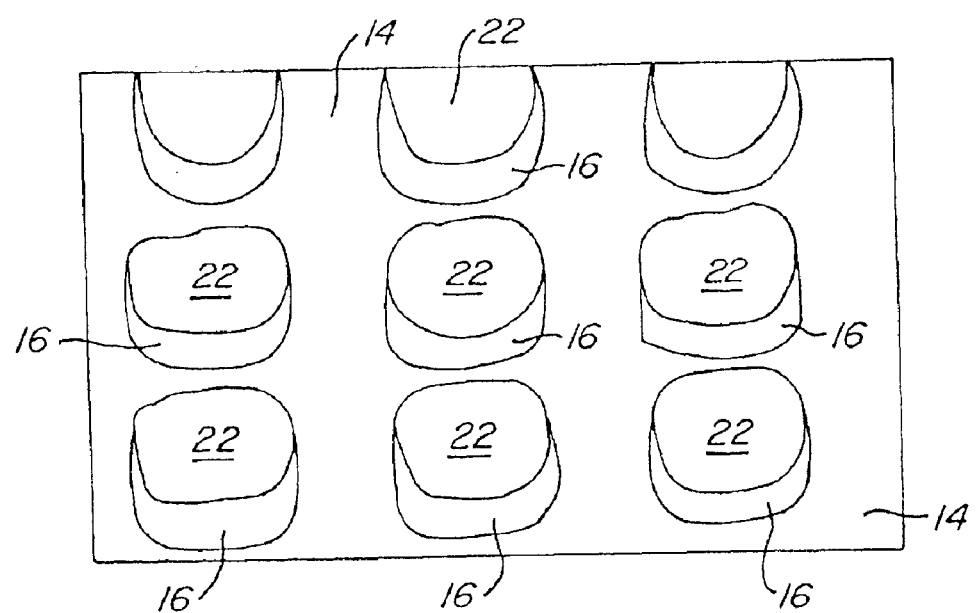
FIG. 22 is a drawing representing the elevational view in the picture of FIG. 20 with the respective parts identified by a reference numeral.

The oxide mask was then removed in a 6:1 HF solution to produce the veil-less test semiconductor wafer shown in FIG. 20. The remaining Ti protective layer could be removed by any suitable means and/or in any suitable manner, such as by etching with Ar, BCl$_3$ and Cl2 as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |
| Process Conditions Based on the Flow Rate of Ar, Cl$_2$ and BCl$_3$ | |
| Ar | 40 sccm |
| Cl$_2$ | 30 sccm |
| BCl$_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |

EXAMPLE II

A test semiconductor wafer was formulated with the following film stack:

0.8 μm patterned PR (photoresist)/5000 Å Oxide/600 Å TiN/2000 Å Pt/300 Å TiN

The feature size of the patterned PR test semiconductor wafer was 0.25 μm block and 0.2 μm spacing. The oxide mask (i.e., the mask layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening the oxide mask comprised about 68% by volume Ar and about 32% by volume CHF$_3$. The reactor and process conditions were as follows:

| Reactor Conditions | |
|---|---|
| Pressure | 60 mTorr |
| RF Power | 850 watts |
| Rotational Magnetic Field | 40 Gauss |
| Temperature of Test Wafer | 100° C. |
| Oxide Mask Etch Rate | 3000 Å/min |
| Process Conditions Based on the Flow Rate of Ar and CHF$_3$ | |
| CHF$_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide mask in an ASP chamber of the Metal Etch MxP Centura™ brand plasma processing apparatus under the following recipe using microwave downstream O$_2$/N$_2$ plasma: 120 seconds, 250° C., 1400 W, 3000 sccm O$_2$, 300 sccm N$_2$, and 2 Torr.

The TiN protective layer was etched with Ar, Cl$_2$ and BCl$_3$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |
| Process Conditions Based on the Flow Rate of Ar and Cl$_2$ and BCl$_3$ | |
| Ar | 40 sccm |
| Cl$_2$ | 30 sccm |
| BCl$_3$ | 30 sccm |
| Pressure | 12 mTorr |

-continued

| Reactor Conditions | |
|---|---|
| RF Power to Coil Inductor | 900 watts |
| RF Power to Wafer Pedestal | 100 watts |
| Temperature of Test Wafer | 110° C. |
| TiN Etch Rate | 2000 Å/min |

The platinum layer of the test semiconductor wafer was then etched with Ar and $Cl_2$ and $BCl_3$ as the etchant gas and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 150 watts |
| Temperature of Test Wafer | 260° C. |
| Platinum Etch Rate | 1500 Å/min |
| Process Conditions Based on the Flow Rate of Ar and $Cl_2$ and $BCl_3$ | |
| Ar | 40 sccm |
| $Cl_2$ | 60 sccm |
| $BCl_3$ | 10 sccm |
| Pressure, mTorr | 12 mTorr |
| RF Power to Coil Inductor | 900 watts |
| RF Power to Wafer Pedestal | 150 watts |
| Temperature (° C.) of Test Wafer | 260° C. |
| Pt Etch Rate (Å/min) | 1500 Å/min |
| Selectivity of Pt/Oxide Mask | 1:1 |

Figure 23:
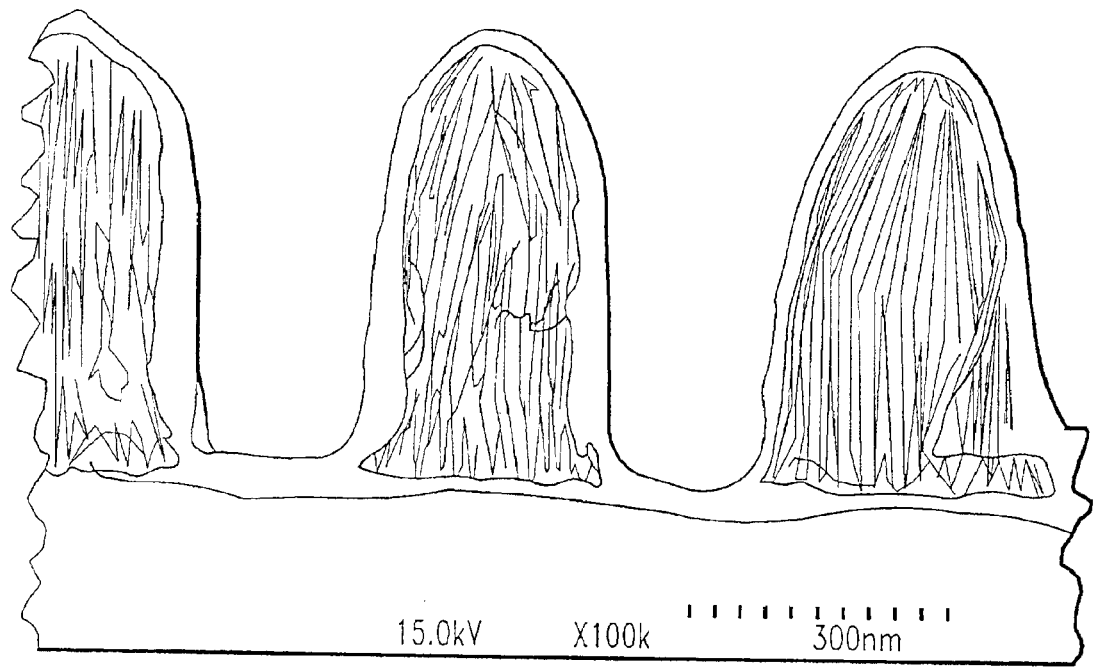
FIG. 23 is a picture showing an elevational view of a test semiconductor wafer for Example II after the platinum electrode layer was etched in accordance with the process conditions listed in Example II.
Figure 24:
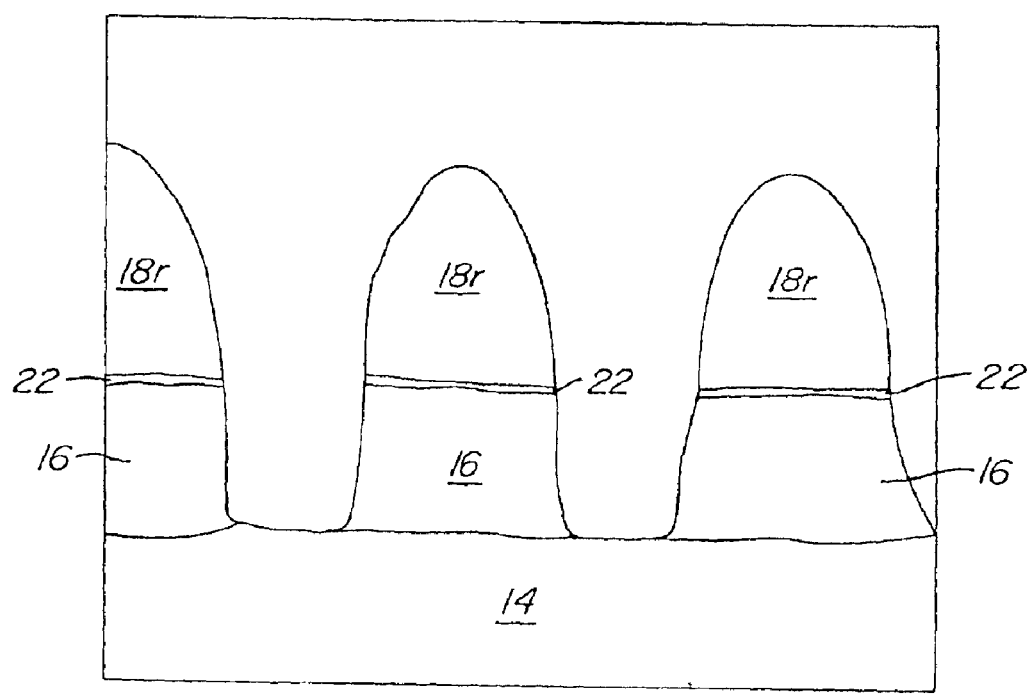
FIG. 24 is a drawing representing the elevational view on the picture of FIG. 23 with the respective parts identified by a reference numeral.

The resulting etched platinum layer of the test semiconductor wafer is shown in FIG. 23 wherein a platinum profile of about 87 degrees is shown.

The oxide mask could have been removed in a 6:1 HF solution to produce a veil-less test semiconductor wafer similar to the one shown in FIG. 20. The remaining TiN protective layer could have been removed by any suitable means and/or in any suitable manner, such as by etching with Ar, $BCl_3$ and $Cl_2$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |

EXAMPLE III

A test semiconductor wafer was formulated with the following film stack:

1.2 μm patterned PR (photoresist)/5000 Å TEOS/200 Å TiN/2500 Å Pt/300 Å TiN/500 Å SiN.

The feature size of the patterned PR test semiconductor wafer was 0.35 μm line and 0.35 μm spacing. The TEOS mask (i.e., the mask layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening the TEOS mask comprised about 68% by volume Ar and about 32% by volume $CHF_3$. The reactor and process conditions were as follows:

| Reactor Conditions | |
|---|---|
| Pressure | 60 mTorr |
| RF Power | 850 watts |
| Rotational Magnetic Field | 40 Gauss |
| Temperature of Test Wafer | 100° C. |
| TEOS Mask Etch Rate | 3000 Å/min |
| Process Conditions Based on the Flow Rate of Ar and $CHF_3$ | |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| TEOS Mask Etch Rate (Å/min) | 3000 Å/min |
| Magnetic Field (Gauss) | 40 Gauss |

The photoresist was stripped from the TEOS mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The TiN protective layer was etched with Ar, $Cl_2$ and $BCl_3$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |

The platinum layer of the test semiconductor wafer was then etched with Ar, $Cl_2$, $BCl_3$ and $N_2$ as the etchant gas and in a DPS™ brand chamber of the Metal Etch DPS Centura™ brand plasma processing apparatus under the following reactor and process conditions:

| Reactor Conditions | |
|---|---|
| Pressure | 36 mTorr |
| RF Power to Coil Inductor | 900 watts |
| RF Power to Wafer Pedestal | 300 watts |
| Temperature of Test Wafer | 320° C. |
| Platinum Etch Rate | 600 Å/min |
| Process Conditions Based on the Flow Rate of Ar, $Cl_2$, $BCl_3$ and $N_2$ | |
| Ar | 24 sccm |
| $Cl_2$ | 120 sccm |
| $BCl_2$ | 10 sccm |
| $N_2$ | 30 sccm |
| Pressure, mTorr | 36 mTorr |
| RF Power to Coil Inductor | 900 watts |
| RF Power to Wafer Pedestal | 300 watts |
| Temperature (° C.) of Test Wafer | 320° C. |
| Pt Etch Rate (Å/min) | 600 Å/min |
| Selectivity of Pt/TEOS Mask | 1:1 |

The TiN layer underneath the platinum layer was then etched with Ar, $BCl_2$ and $N_2$ as the etchant gas and in a DPT™ brand chamber of the Metal Etch DPS Centura™ brand plasma processing apparatus under the following reactor and process conditions:

| Reactor Conditions | |
|---|---|
| Pressure, mTorr | 36 mTorr |
| RF Power to Coil Inductor | 900 watts |
| RF Power to Wafer Pedestal | 300 watts |
| Temperature (° C.) of Test Wafer | 320° C. |
| TiN Etch Rate | 300 Å/min |
| Process Conditions | |
| Ar | 100 sccm |
| $BCl_3$ | 5 sccm |
| $N_2$ | 100 sccm |
| Pressure, mTorr | 36 mTorr |
| RF Power to Coil Inductor | 900 watts |
| RF Power to Wafer Pedestal | 300 watts |
| Temperature (° C.) of Test Wafer | 320° C. |
| TiN Etch Rate | 300 Å/min |

Figure 30:
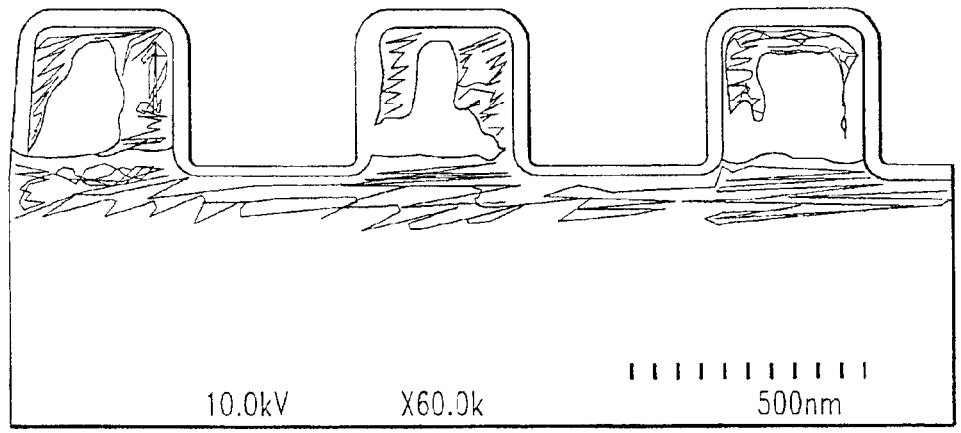
FIG. 30 is a picture show the test semiconductor wafer of Example III after the TEOS mask layer was removed.

The TEOS mark was then removed in a 6:1 HF solution to produce a veil-free test semiconductor wafer shown in the picture of FIG. 30.

The remaining TiN protective layer on the etched platinum layer could be removed by any suitable means and/or in any suitable manner, such as by etching with Ar, $BCl_3$ and $Cl_2$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |
| Process Conditions Based on the Flow Rate of Ar, $Cl_2$ and $BCl_2$ | |
| Ar | 40 sccm |
| $Cl_2$ | 30 sccm |
| $BCl_3$ | 30 sccm |
| Pressure | 12 mTorr |

-continued

| | |
|---|---|
| RF Power to Coil Inductor | 900 watts |
| RF Power to Wafer Pedestal | 100 watts |
| Temperature of Test Wafer | 110° C. |
| TiN Etch Rate | 2000 Å/min |

EXAMPLE IV

A test semiconductor wafer was formulated with the following film stack:

1.2 μm patterned PR (photoresist)/2000 Å TEOS/8000 Å SiLK®/2000 Å Pt/300 Å TiN/$SiO_2$ substrate.

The feature size of the patterned PR test semiconductor wafer was 0.35 μm line and 0.35 μm spacing. SiLK® is a registered trademark of Dow Chemical Co. of Midland, Mich. 48674. It is a high temperature organic polymer. It is disposed on the Pt layer by the spin coating method.

The TEOS mask (i.e., the first mask layer) was etched with Ar, $CF_4$ and $CHF_3$ as the etchant gases and in a DPS™ brand chamber of the Metal Etch DPS Centura™ brand plasma processing apparatus under the following reactor and process conditions:

| Reactor Conditions | |
|---|---|
| Pressure | 10 mTorr |
| RF Power to Coil Inductor | 1500 watts |
| RF Power to Wafer Pedestal | 400 watts |
| Temperature of Test Wafer | 80° C. |
| TEOS Etch Rate | 4500 Å/min |
| Process Conditions Based on the Flow Rate of Ar and $CF_2$ and $CHF_3$ | |
| Ar | 100 sccm |
| $CF_4$ | 20 sccm |
| $CHF_3$ | 60 sccm |
| Pressure | 10 mTorr |
| RF Power to Coil Inductor | 1500 watts |
| RF Power to Wafer Pedestal | 400 watts |
| Temperature of Test Wafer | 80° C. |
| TEOS Etch Rate | 4500 Å/min |

The SiLK® brand layer (i.e., the second mask layer) of the test semiconductor wafer was then etched (which also completely etched away the patterned PR) with $NH_3$ as the etchant gas in a DPS™ brand chamber of the Metal Etch DPS Centura™ brand plasma processing apparatus under the following reactor and process conditions:

| Reactor Conditions | |
|---|---|
| Pressure | 10 mTorr |
| RF Power to Coil Inductor | 1200 watts |
| RF Power to Wafer Pedestal | 400 watts |
| Temperature of Test Wafer | 80° C. |
| SiLK ® Etch Rate | 3000 Å/min |
| Process Conditions Based on the Flow Rate of $NH_3$ | |
| $NH_3$ | 50 sccm |
| Pressure, mTorr | 10 mTorr |
| RF Power to Coil Inductor | 1200 watts |
| RF Power to Wafer Pedestal | 400 watts |
| Temperature (° C.) of Test Wafer | 80° C. |
| SiLK ® Etch Rate (Å/min) | 3000 Å/min |

Figure 31:
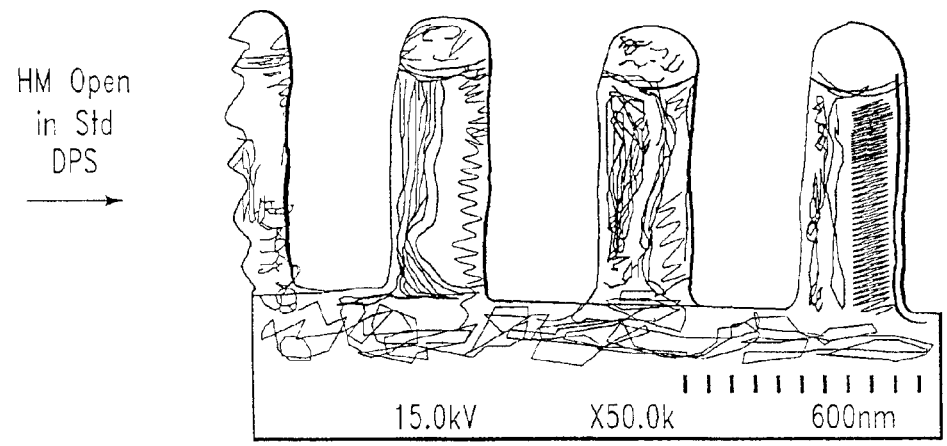
FIG. 31 is a picture of an elevational view of the test semiconductor wafer of Example IV after the SiLK® brand mask layer of the test semiconductor was etched in the DPS™ brand chamber.

The results are shown in FIG. 31. The platinum layer was then etched with Ar, $BCl_2$, $Cl_2$ and $N_2$ as the etchant gas and in a DPT™ brand chamber of the Metal Etch DPS Centura™ brand plasma processing apparatus under the following reactor and process conditions:

| Reactor Conditions | |
|---|---|
| Pressure, mTorr | 32 mTorr |
| RF Power to Coil Inductor | 900 watts |
| RF Power to Wafer Pedestal | 400 watts |
| Temperature (° C.) of Test Wafer | 310° C. |
| Pt Etch Rate | 600 Å/min |
| Process Conditions | |
| Ar | 30 sccm |
| $BCl_3$ | 10 sccm |
| $Cl_2$ | 120 sccm |
| $N_2$ | 30 sccm |
| Pressure, mTorr | 32 mTorr |
| RF Power to Coil Inductor | 900 watts |
| RF Power to Wafer Pedestal | 400 watts |
| Temperature (° C.) of Test Wafer | 310° C. |
| Pt Etch Rate | 600 Å/min |

Figure 32:
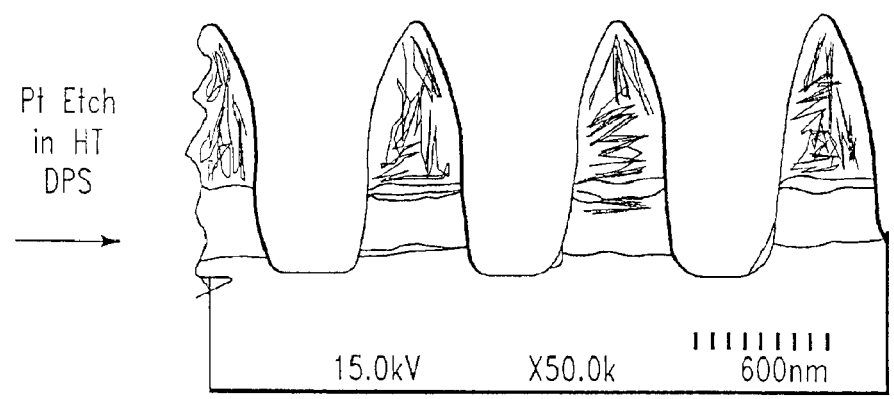
FIG. 32 is a picture of an elevational view of the test semiconductor wafer of Example IV after the platinum layer and the TiN (i.e., a barrier layer) was etched in the DPS™ brand chamber.

The TiN layer (i.e., a barrier layer) underneath the Pt layer is also etched with the same etchant gases and in the same DPS chamber and same reactor and process conditions after Pt etching. The result is shown in FIG. 32.

The remaining SiLK® brand mask was stripped from the Pt layer in an ASP chamber of the Metal Etch DPS Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

Figure 33:
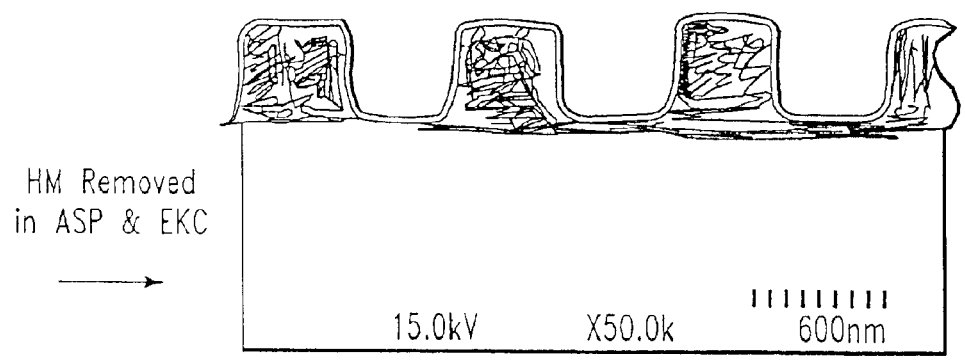
FIG. 33 is a picture of an elevational view of the test semiconductor wafer of Example IV after the SiLK® brand mask layer was removed or stripped from the etched platinum layer in an ASP chamber of the Metal Etch DPS Centura™ brand plasma processing apparatus.
Figure 34:
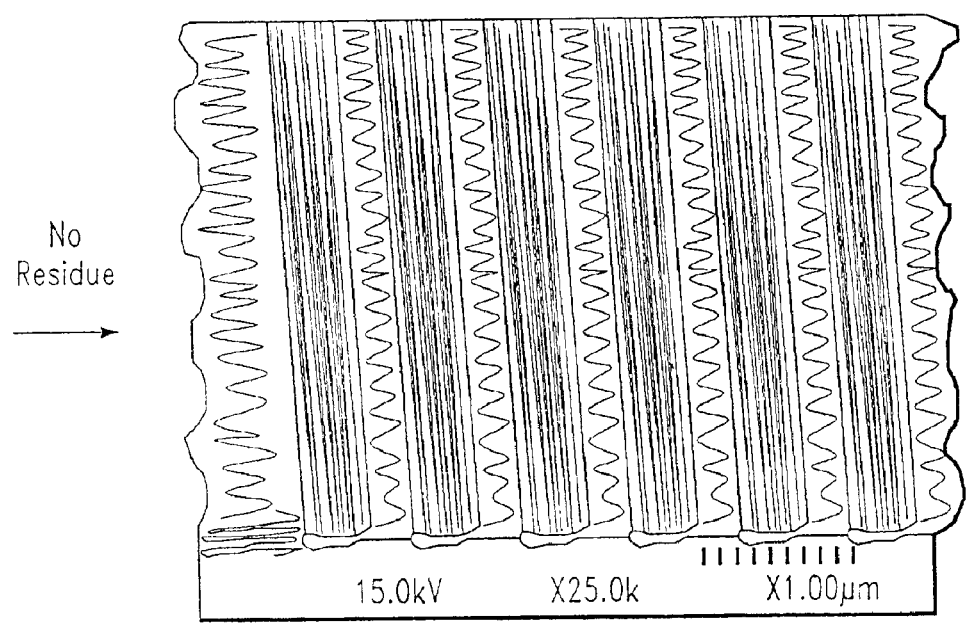
FIG. 34 is a top plan view picture of the etched platinum layer of FIG. 33.
Figure 35:
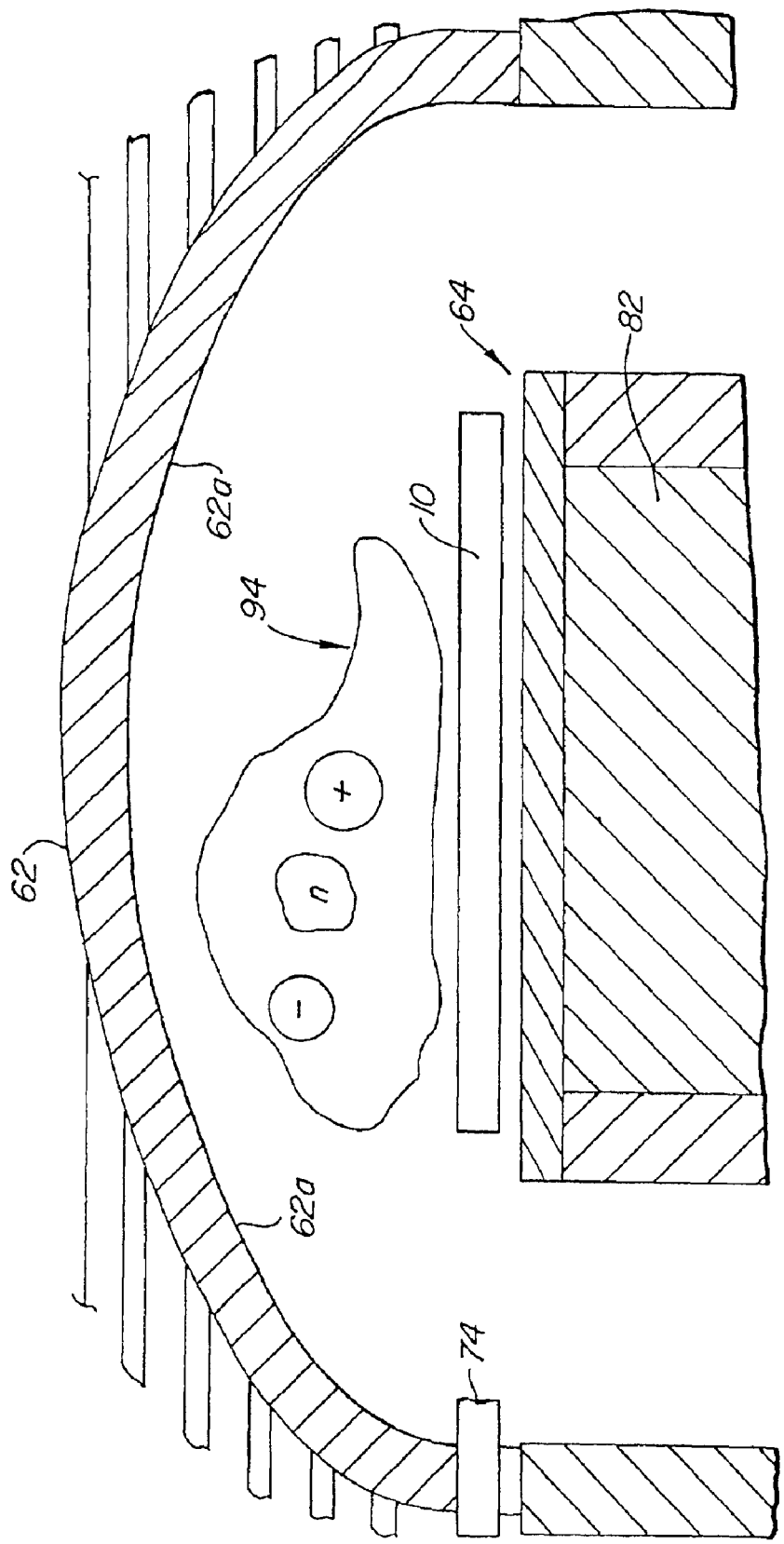
FIG. 35 is a partial exploded sectional view of the inductively coupled RF plasma reactor of FIG. 17 illustrating the dome-shaped dielectric ceiling.

FIG. 33 shows the final result of etching Pt layer after the SiLK® brand mask was removed. FIG. 34 is a top plan view picture of the etched platinum layer of FIG. 33.

EXAMPLE V

A test semiconductor wafer was formulated with the following film stack:

0.8 μm PR (photoresist)/7000 Å Oxide/200 Å Ti/3000 Å Pt/300 Å $TiN/Si_3N_4$

The feature size of the formulated test semiconductor wafer was 0.27 μm block and 0.13 μm spacing. The oxide hard mask (i.e., the insulation layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening up the oxide hard mask comprised about 68% by volume Ar and about 32% by volume $CHF_3$. The reactor and process conditions were as follows:

| Reactor Conditions | |
|---|---|
| Pressure | 60 mTorr |
| RF Power | 850 watts |
| Rotational Magnetic Field | 40 Gauss |
| Temperature of Test Wafer | 100° C. |
| Oxide Hard Mask Etch Rate | 3000 Å/min |
| Process Conditions Based on the Flow Rate of Ar and $CHF_3$ | |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide hard mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The Ti protective layer was etched with Ar, $Cl_2$ and $BCl_3$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 325° C. |
| Ti Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 325° C. |
| Ti Etch Rate | 2000 Å/min |

The platinum layer of the test semiconductor wafer was then etched with $N_2$, Ar and $Cl_2$ as the etchant gas and in a DPS™ brand chamber of the Metal Etch DPS Centura™ brand plasma processing apparatus under the following reactor and process conditions:

| Reactor Conditions | |
|---|---|
| Pressure | 36 mTorr |
| RF Power to Coil Inductor | 900 watts |
| RF Power to Wafer Pedestal | 300 watts |
| Temperature of Test Wafer | 325° C. |
| Platinum Etch Rate | 800 Å/min |
| Process Conditions Based on the Flow Rate of $N_2$ Ar and $Cl_2$ | |
| $N_2$ | 30 sccm |
| Ar | 24 sccm |
| $Cl_2$ | 120 sccm |
| Pressure, mTorr | 36 mTorr |
| RF Power to Coil Inductor | 900 watts |
| RF Power to Wafer Pedestal | 300 watts |
| Temperature (° C.) of Test Wafer | 325° C. |
| Pt Etch Rate (Å/min) | 800 Å/min |
| Selectivity of Pt/Oxide Hard Mask | 1.5:1 |

Figure 37:
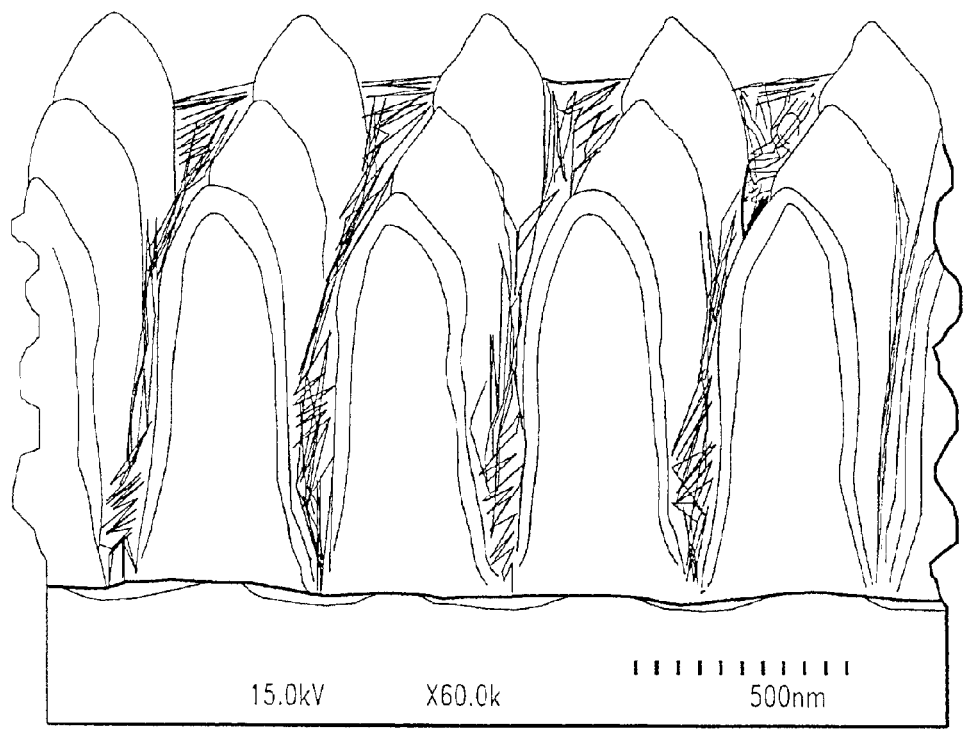
FIG. 37 is a picture showing an elevational view of a test semiconductor wafer for Example V after the platinum electrode layer was etched in accordance with the process conditions listed in Example V.
Figure 38:
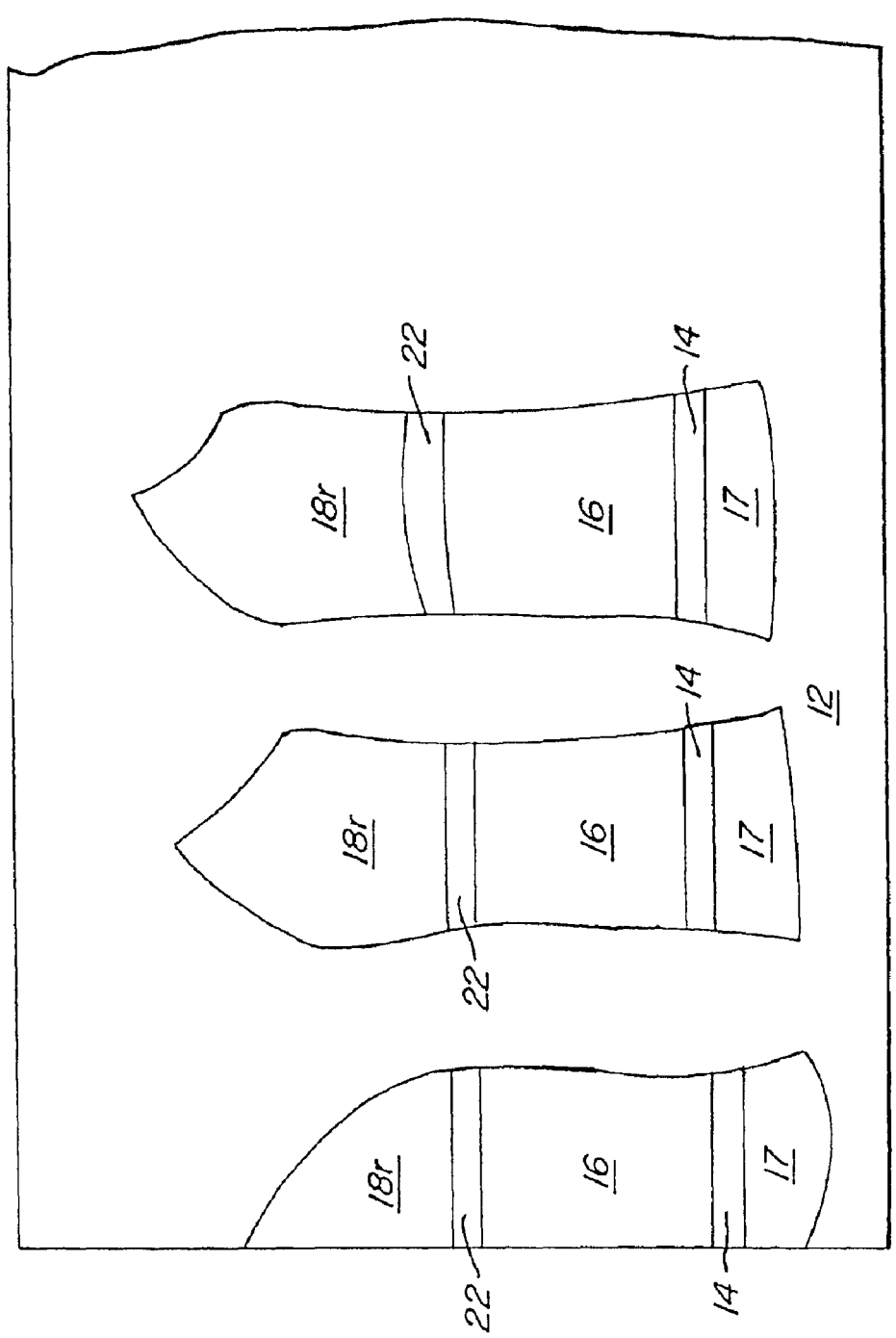
FIG. 38 is a drawing representing the elevational view of the picture of FIG. 37 with the respective parts identified by reference numerals.

The resulting etched platinum layer of the test semiconductor wafer is shown in the photograph picture of FIG. 37 wherein a platinum profile of about 88 degrees is shown. FIG. 38 is a drawing representing the photograph of FIG. 37 with the respective parts identified by a reference numeral.

The oxide hard mask could have been removed in a 6:1 HF solution to produce the veil-less test semiconductor wafer similar to the one shown in FIG. 20. The remaining Ti protective layer could be removed by any suitable means and/or in any suitable manner, such as by etching with Ar, $BCl_3$ and $Cl_2$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |

EXAMPLE VI

A test semiconductor wafer was formulated with the following film stack:

0.8 µm PR (photoresist)/5000 Å Oxide/100 Å TiN/1500 Å Pt/300 Å TiN/$Si_3N_4$

The feature size of the formulated test semiconductor wafer was 0.3 µm block and 0.2 µm spacing. The oxide hard mask (i.e., the insulation layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening up the oxide hard mask comprised about 68% by volume Ar and about 32% by volume $CHF_3$. The reactor and process conditions were as follows:

| Reactor Conditions | |
|---|---|
| Pressure | 60 mTorr |
| RF Power | 850 watts |
| Rotational Magnetic Field | 40 Gauss |
| Temperature of Test Wafer | 100° C. |
| Oxide Hard Mask Etch Rate | 3000 Å/min |
| Process Conditions Based on the Flow Rate of Ar and $CHF_3$ | |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide hard mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The TiN protective layer was etched with Ar, $Cl_2$ and $BCl_3$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 325° C. |
| TiN Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 325 watts |
| Temperature of Test Wafer | 325° C. |
| TiN Etch Rate | 2000 Å/min |

The platinum layer of the test semiconductor wafer was then etched with $N_2$ and $Cl_2$ as the etchant gas and in a parallel plate RIE low density plasma processing apparatus under the following reactor and process conditions:

| Reactor Conditions | |
|---|---|
| Pressure | 100 mTorr |
| RF Power to Wafer Pedestal | 1000 watts |
| Temperature of Test Wafer | 325° C. |
| Platinum Etch Rate | 1000 Å/min |
| Process Conditions Based on the Flow Rate of $N_2$, and $Cl_2$ | |
| $N_2$ | 80 sccm |
| $Cl_2$ | 200 sccm |
| Pressure, mTorr | 100 mTorr |
| RF Power to Wafer Pedestal | 1000 watts |
| Temperature (° C.) of Test Wafer | 325° C. |
| Pt Etch Rate (Å/min) | 1000 Å/min |
| Selectivity of Pt/Oxide Hard Mask | 0.5:1 |

Figure 39:
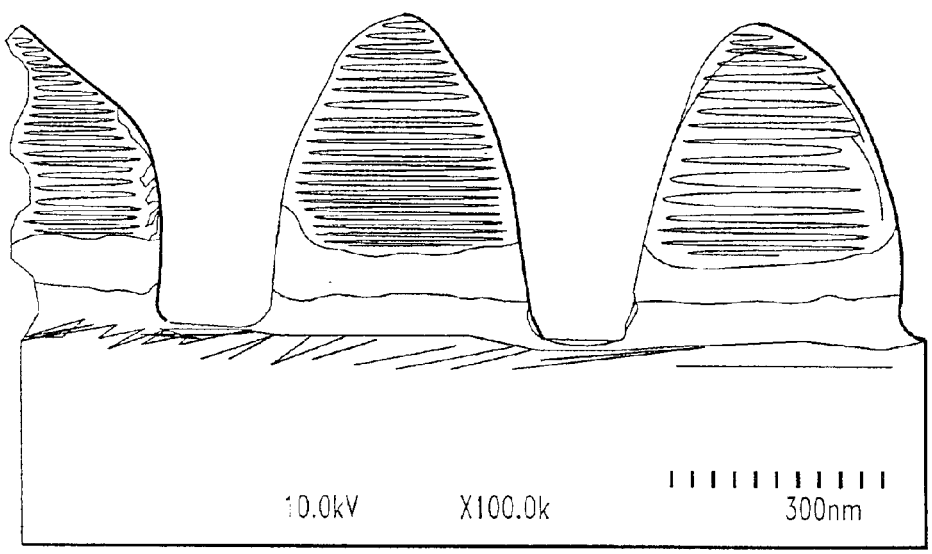
FIG. 39 is a picture showing an elevational view of a test semiconductor wafer for Example VI after the platinum electrode layer was etched in accordance with the process conditions listed in Example VI.
Figure 40:
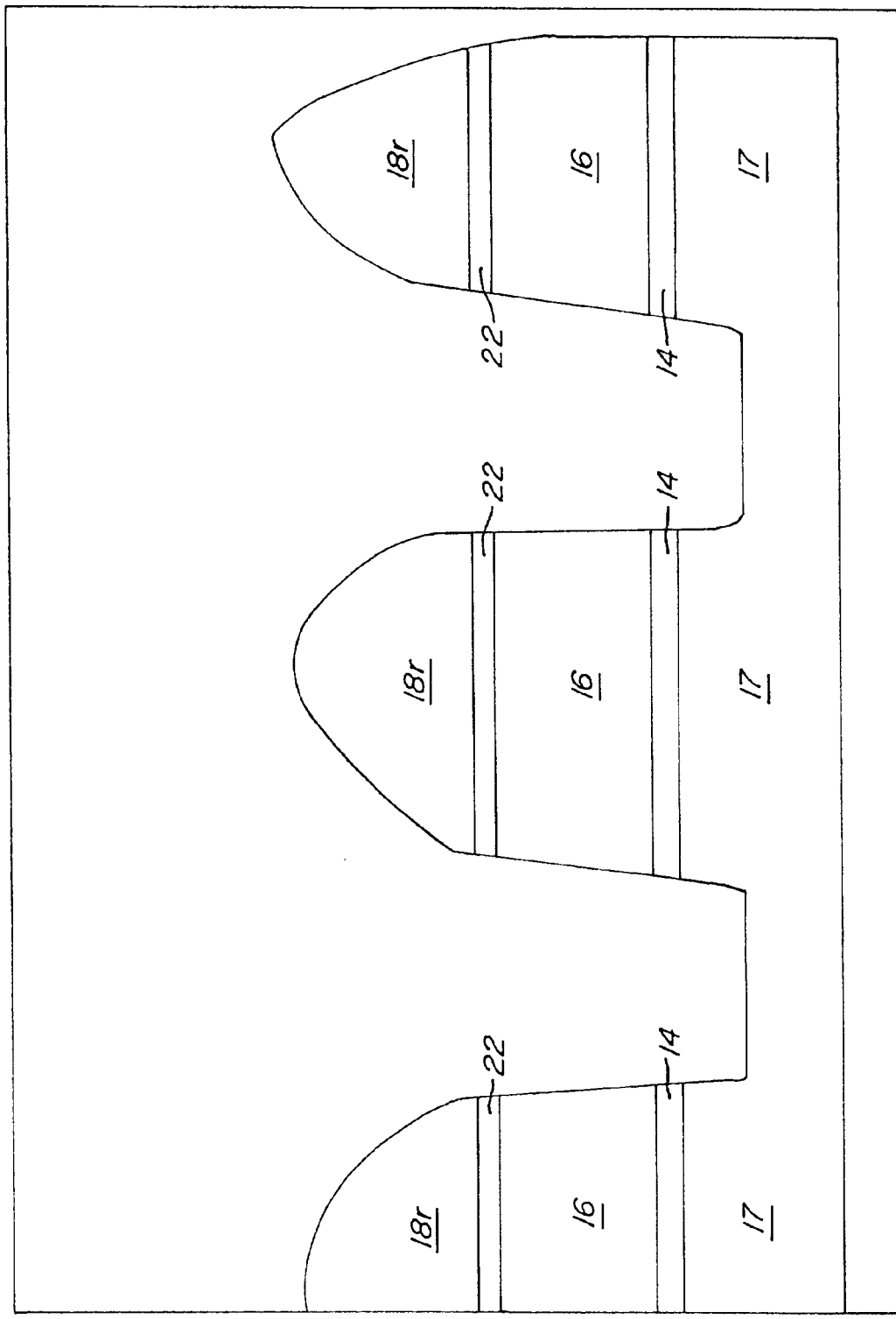
FIG. 40 is a drawing partially representing the elevational view of the picture of FIG. 39 with the respective parts identified by reference numerals.

The resulting etched platinum layer of the test semiconductor wafer is shown in FIG. 39 wherein a platinum profile of about 85 degrees is shown. FIG. 40 is a drawing representing the photograph picture of FIG. 39 with the respective parts identified by a reference numeral.

The oxide hard mask could have been removed in a 6:1 BF solution to produce the veil-less test semiconductor wafer similar to the one shown in FIG. 20. The remaining TiN protective layer could be removed by any suitable means and/or in any suitable manner, such as by etching with Ar, $BCl_3$ and $Cl_2$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |

-continued

| | |
|---|---|
| RF Power to Coil Inductor | 900 watts |
| RF Power to Wafer Pedestal | 100 watts |
| Temperature of Test Wafer | 110° C. |
| TiN Etch Rate | 2000 Å/min |

EXAMPLE VII

A test semiconductor wafer was formulated with the following film stack:

0.8 μm PR (photoresist)/5000 Å Oxide/100 Å Ti/2000 Å Pt/300 Å TiN

The feature size of the formulated test semiconductor wafer was 0.3 μm block and 0.25 μm spacing. The oxide hard mask (i.e., the insulation layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening up the oxide hard mask comprised about 68% by volume Ar and about 32% by volume $CHF_3$. The reactor and process conditions were as follows:

| Reactor Conditions | |
|---|---|
| Pressure | 60 mTorr |
| RF Power | 850 watts |
| Rotational Magnetic Field | 40 Gauss |
| Temperature of Test Wafer | 100° C. |
| Oxide Hard Mask Etch Rate | 3000 Å/min |
| Process Conditions Based on the Flow Rate of Ar and $CHF_3$ | |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide hard mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The Ti protective layer was etched with Ar, $Cl_2$ and $BCl_3$ as the etchant gases and in a DPS™ brand chamber of a Metal Etch DPS Centura™ brand plasma processing apparatus sold by Applied Materials, Inc. The Ti protective layer was etched under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |

| | |
|---|---|
| RF Power to Coil Inductor | 900 watts |
| RF Power to Wafer Pedestal | 100 watts |
| Temperature of Test Wafer | 110° C. |
| Ti Etch Rate | 2000 Å/min |

Figure 41:
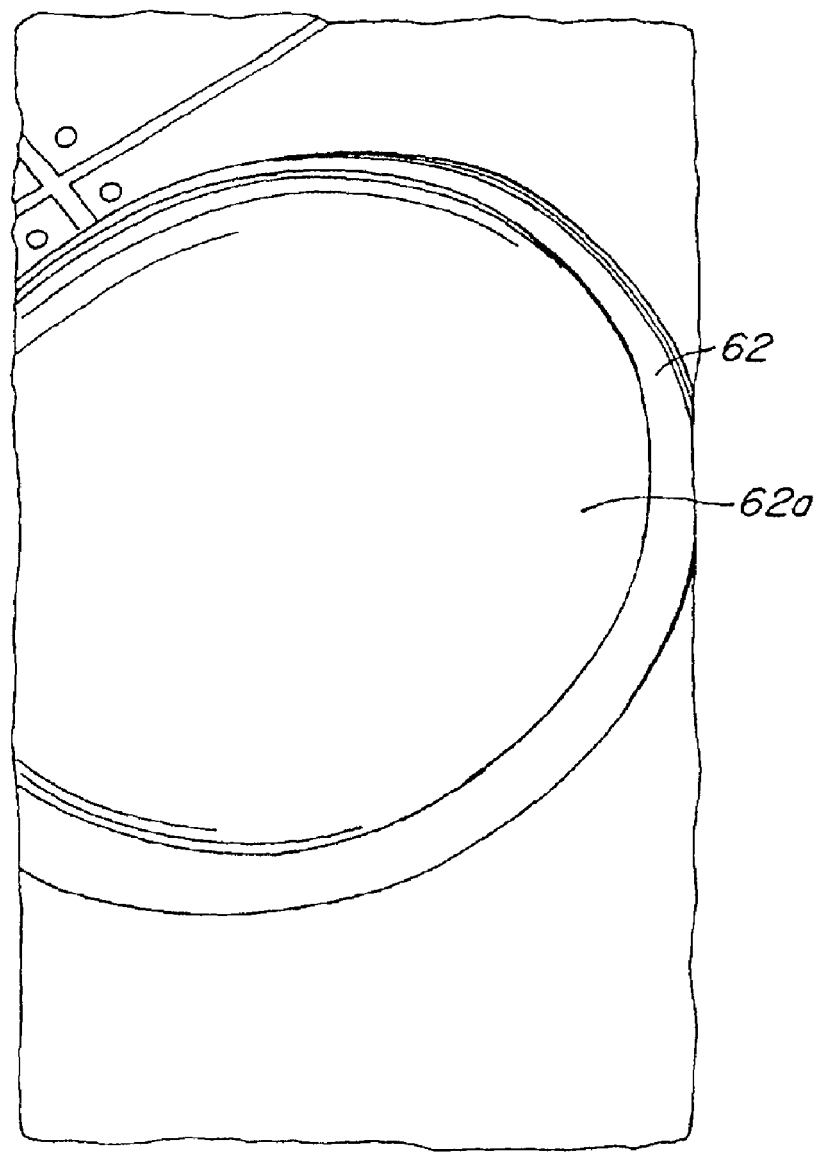
FIG. 41 is a partial perspective view of a dome-shaped dielectric ceiling having an inside concave surface.

The platinum layer of the test semiconductor wafer was then etched in a DPS™ brand chamber of a Metal Etch DPS™ brand plasma processing apparatus. The DPS™ brand chamber included an etch chamber and a generally hemispherical shaped standard dome (i.e., dielectric ceiling 62 having inside concave surface 62a) as shown in FIG. 41 manufactured of a dielectric aluminum oxide that was capable of allowing RF power to pass therethrough for being coupled to a plasma of an etchant gas. The hemispherical shaped standard dome (hereinafter "Standard Dome") covered the etch chamber as a lid as represented in FIGS. 17 and 18 and sealed the chamber for pumping down to mTorr vacuum pressure. The inside concave surface 62a of the dielectric ceiling 62 (i.e., the "Standard Dome") had a peak-to-valley roughness height with an average height value of about 500 Å. The inductive coils circled the outside of the hemispherical sloped dome and connected to a RF power supply. RF power energy delivered to the inductive coils were transmitted through the Standard Dome and into the DPS™ brand chamber and generated a high density plasma from a processing gas for processing the semiconductor test wafer. The platinum layer of the test semiconductor wafer was etched in the DPS™ brand chamber with $BCl_3$, Ar and $Cl_2$ as the etchant gas under the following reactor and process conditions:

| Reactor Conditions | |
|---|---|
| Pressure | 12 mTorr |
| RF Power to Coil Inductor | 1200 watts |
| RF Power to Wafer Pedestal | 150 watts |
| Temperature of Test Wafer | 350° C. |
| Platinum Etch Rate | 1000 Å/min |
| Process Conditions Based on the Flow Rate of Ar, $Cl_2$ and $BCl_3$ | |
| Ar | 30 sccm |
| $Cl_2$ | 70 sccm |
| $BCl_3$ | 10 sccm |
| Pressure, mTorr | 12 mTorr |
| RF Power to Coil Inductor | 900 watts |
| RF Power to Wafer Pedestal | 150 watts |
| Temperature (° C.) of Test Wafer | 350° C. |
| Pt Etch Rate (Å/min) | 1000 Å/min |
| Selectivity of Pt/Oxide Hard Mask | 1:1 |

Figure 42:
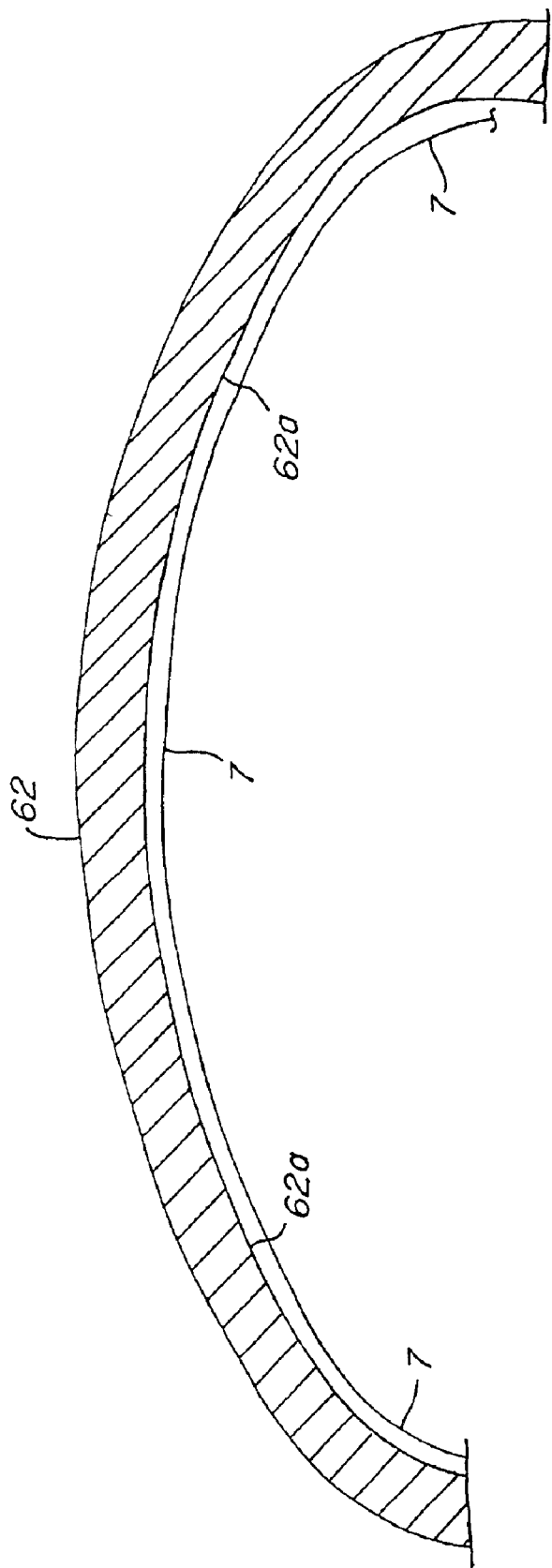
FIG. 42 is a partial sectional view of the dome-shaped dielectric ceiling of FIG. 41 after its associated inside concave surface has received a deposit of by-product materials in accordance with Example VII.
Figure 43:
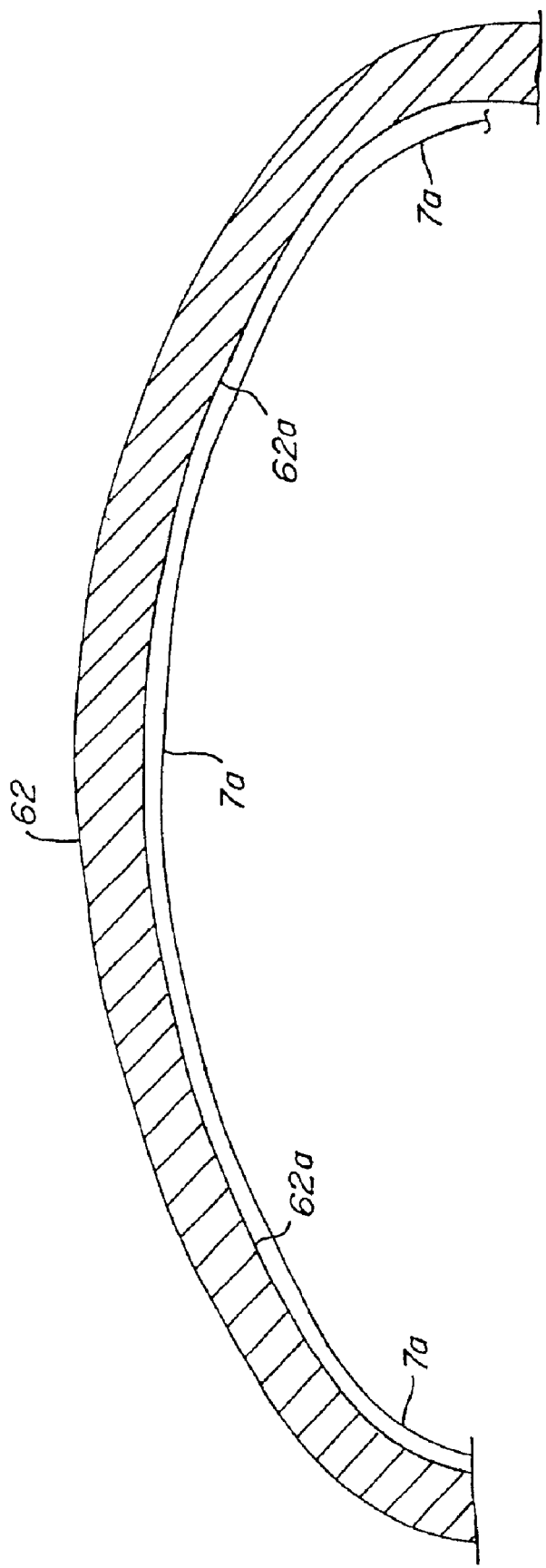
FIG. 43 is a partial sectional view of the dome-shaped dielectric ceiling of FIG. 41 after its associated inside concave surface has received a deposit of by-product materials in accordance with Example VIII.

During the metal etching of the platinum layer of the semiconductor test wafer, a deposit 7 of materials occurred on the inside concave surface 62a of the Standard Dome or ceiling 62, as best shown in FIG. 42. The deposit 7 included, by way of example only, oxides and silicates and chlorides of platinum, and was located between the plasma and the power source. The deposit 7 was conductive and had an electrical resistance of 10 to 20 M ohms measured with a DC ohm meter after etching 25 wafers.

EXAMPLE VIII

Example VII was repeated with the platinum layer of the test semiconductor wafer etched with $BCl_3$, Ar, and $Cl_2$ as the etchant gas and in the same DPS™ brand chamber of the Metal Etch DPS Centura™ brand plasma processing apparatus under the following reactor and process conditions:

| Reactor Conditions | |
| --- | --- |
| Pressure | 24 mTorr |
| RF Power to Coil Inductor | 900 watts |
| RF Power to Wafer Pedestal | 175 watts |
| Temperature of Test Wafer | 350° C. |
| Platinum Etch Rate | 1000 Å/min |
| Process Conditions Based on the Flow Rate of Ar, $Cl_2$ and $BCl_3$ | |
| Ar | 20 sccm |
| $Cl_2$ | 100 sccm |
| $BCl_3$ | 10 sccm |
| Pressure, mTorr | 24 mTorr |
| RF Power to Coil Inductor | 900 watts |
| RF Power to Wafer Pedestal | 175 watts |
| Temperature (° C.) of Test Wafer | 350° C. |
| Pt Etch Rate (Å/min) | 1000 Å/min |
| Selectivity of Pt/Oxide Hard Mask | 1:1 |

During the platinum etching of the platinum layer under the foregoing reactor and process conditions, a deposit 7a of platinum-containing materials occurred on the inside concave surface 62a of the Standard Dome or ceiling 62, as best shown in FIG. 42. The deposit 7a included, by way of example only, oxides, and nitrides and silicates and chlorides of platinum, etc. The deposit 7a was not conductive as measured with a DC ohm meter after etching 50 wafers. Thus, the use of high $Cl_2$ flow and high pressure resulted in a deposit 7a that was less conductive than the deposit 7 in Example VII where the etching was done at low $Cl_2$ content (i.e., low $Cl_2$/Ar volume ratio) and low pressure. More $Cl_2$ content (i.e., high $Cl_2$/Ar volume ratio) at high pressure promotes more chemical etching rather than physical sputtering at low pressure.

EXAMPLE IX

Example VII was repeated with a Modified Dome and with the platinum layer of the test semiconductor wafer etched with $BCl_3$, Ar and $Cl_2$ as an etchant gas and in a DPS™ brand chamber of the Metal Etch DPS™ Centura™ brand plasma processing apparatus under the following reactor and process conditions:

| Reactor Conditions | |
| --- | --- |
| Pressure | 12 mTorr |
| RF Power to Coil Inductor | 1200 watts |
| RF Power to Wafer Pedestal | 150 watts |
| Temperature of Test Wafer | 350° C. |
| Platinum Etch Rate | 1000 Å/min |
| Process Conditions Based on the Flow Rate of Ar and $Cl_2$ | |
| Ar | 30 sccm |
| $Cl_2$ | 70 sccm |
| $BCl_3$ | 10 sccm |
| Pressure, mTorr | 12 mTorr |
| RF Power to Coil Inductor | 1200 watts |
| RF Power to Wafer Pedestal | 150 watts |
| Temperature (° C.) of Test Wafer | 350° C. |
| Pt Etch Rate (Å/min) | 1000 Å/min |
| Selectivity of Pt/Oxide Hard Mask | 1:1 |

Figure 44:
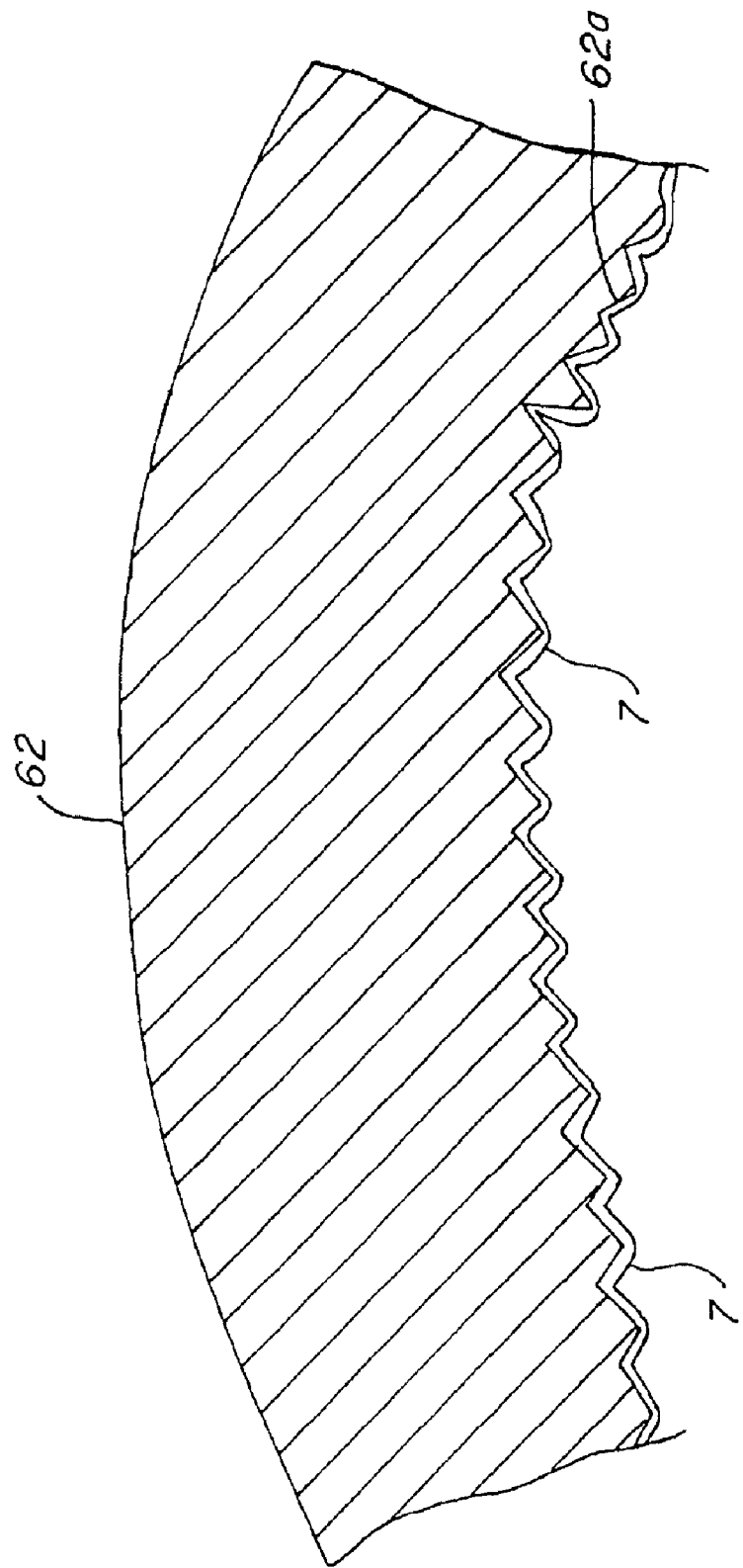
FIG. 44 is a partial exploded sectional view of a dome-shaped dielectric ceiling having a roughened inside concave surface that has received a deposit of by-product materials in accordance with Example IX.

The Modified Dome for this Example IX used the Standard Dome (i.e., dielectric ceiling 62) but whose inside concave surface 62a had a surface finish comprising a peak-to-valley roughness height with an average height value of about 5000 Å. During the platinum etching of the platinum layer under the above-identified conditions, the same deposit 7 from Example VII occurred on the inside concave surface 62a as illustrated in the exploded view of FIG. 44. However, deposit 7 for this Example IX was not conductive as measured with a DC ohm meter after etching 100 wafers. Thus, the electric conductivity (and thickness) of the deposit 7 for this Example IX was less than deposit 7 from Example VII because the inside concave surface 62a for the Modified Dome had a surface finish including a peak-to-valley roughness height with an average height value of about 5000 Å, as opposed to the inside concave surface 62a for the Standard Dome in Example V which had a surface finish including a peak-to-valley roughness height with an average height value of about 500 Å. Using a roughen surface design on the dielectric ceiling increased the overall inside surface area that provided a larger surface area for the same volume of deposit 7, thus causing a decrease in the deposition thickness which would then extend the stability of external RF power transmission through the dielectric ceiling or window for etching platinum.

EXAMPLE X

A test semiconductor wafer was formulated with the following film stack:

1.2 μm patterned PR (photoresist)/4000 Å Oxide/100 Å Ti/2000 Å Ir/1000 Å TiN

The feature size of the patterned PR test semiconductor wafer was 2.5 μm block and 4.0 μm spacing. The oxide mask (i.e., the mask layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening the oxide mask comprised about 68% by volume Ar and about 32% by volume $CHF_3$. The reactor and process conditions were as follows:

| Reactor Conditions | |
| --- | --- |
| Pressure | 60 mTorr |
| RF Power | 850 watts |
| Rotational Magnetic Field | 40 Gauss |
| Temperature of Test Wafer | 100° C. |
| Oxide Mask Etch Rate | 3000 Å/min |
| Process Conditions Based on the Flow Rate of Ar and $CHF_3$ | |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The Ti protective layer was etched with Ar, $Cl_2$ and $BCl_3$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |

The iridium layer of the test semiconductor wafer was then etched with $O_2$, Ar and $Cl_2$ as the etchant gas and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 450 watts |
| Temperature of Test Wafer | 300° C. |
| Iridium (Ir) Etch Rate | 600 Å/min |
| Process Conditions Based on the Flow Rate of $O_2$, Ar and $Cl_2$ | |
| $O_2$ | 15 sccm |
| Ar | 100 sccm |
| $Cl_2$ | 50 sccm |
| Pressure, mTorr | 12 mTorr |
| RF Power to Coil Inductor | 900 watts |
| RF Power to Wafer Pedestal | 450 watts |
| Temperature (° C.) of Test Wafer | 300° C. |
| Ir Etch Rate (Å/min) | 600 Å/min |
| Selectivity of Ir/Oxide Mask | 2:1 |

Figure 45:
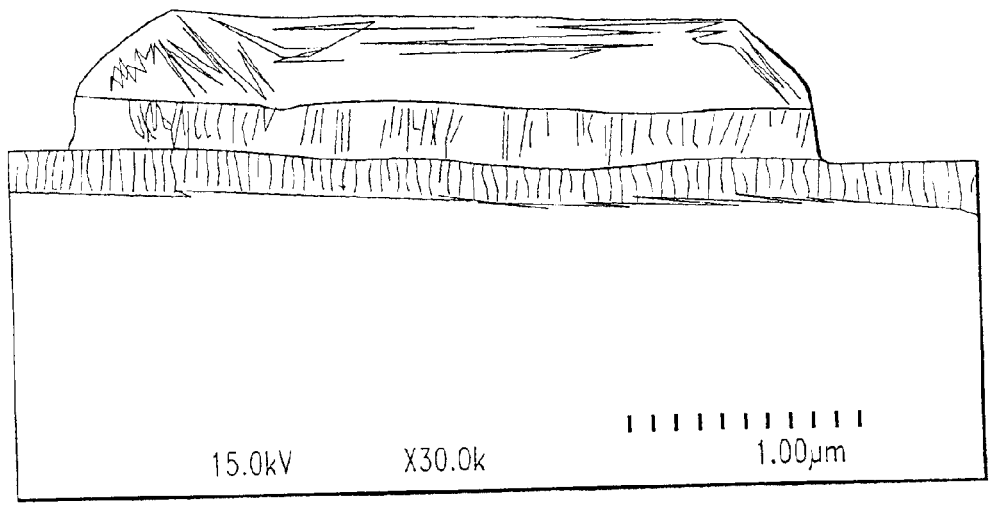
FIG. 45 is a picture showing an elevational view of a test semiconductor wafer for Example X after an iridium electrode layer was etched in accordance with the process conditions listed in Example X.
Figure 46:
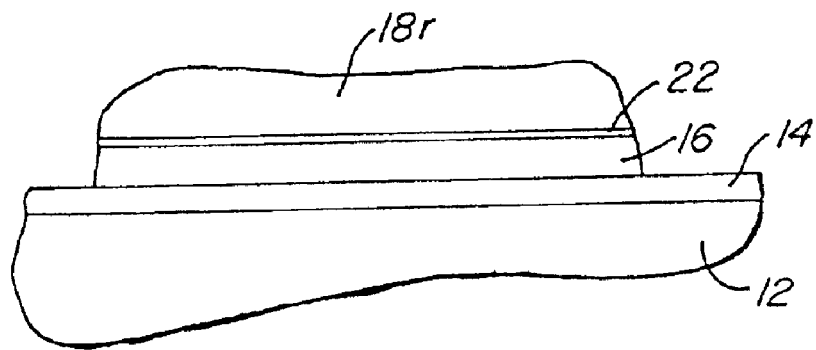
FIG. 46 is a drawing representing the elevational view in the picture of FIG. 45 with respective parts identified by a reference numeral.

The resulting etched iridium layer of the test semiconductor wafer is shown in the picture of FIG. 45 wherein an iridium profile of about 85 degrees is shown. FIG. 46 is a drawing representing the elevational view in the picture of FIG. 45 with the respective parts identified by a reference numeral.

The oxide mask was then removed in a 6:1 HF solution to produce the veil-less test semiconductor wafer. The remaining Ti protective layer could be removed by any suitable means and/or in any suitable manner, such as by etching with Ar, $BCl_3$ and $Cl_2$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |
| Process Conditions Based on the Flow Rate of Ar, $Cl_2$, $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |

EXAMPLE XI

A test semiconductor wafer was formulated with the following film stack:

1.2 µm patterned PR (photoresist)/1000 Å TiN/2000 Å Ir/1000 Å TiN

The feature size of the patterned PR test semiconductor wafer was 2.5 µm block and 4.0 µm spacing. The TiN mask (i.e., the mask layer) was opened in the metal etch chamber of a plasma processing apparatus sold under the trademark Metal Etch DPS Centura™, owned by Applied Materials Inc., 3050 Bowers Avenue, Santa Clara, Calif. 95054-3299. The etchant gas for opening the TiN mask comprised about 68% by volume Ar and about 32% by volume $Cl_2$. The reactor and process conditions were as follows:

| Reactor Conditions | |
|---|---|
| Pressure | 12 mTorr |
| RF Power to Coil Inductor | 1200 watts |
| RF Power to Wafer Pedestal | 100 watts |
| Temperature of Test Wafer | 110° C. |
| TiN Etch Rate | 2000 Å/min |
| Process Conditions Based on the Flow Rate of Ar and $Cl_2$ | |
| Ar | 100 sccm |
| $Cl_2$ | 50 sccm |
| Pressure | 12 mTorr |
| RF Power to Coil Inductor | 1200 watts |
| RF Power to Wafer Pedestal | 100 watts |
| Temperature of Test Wafer | 110° C. |
| TiN Etch Rate | 2000 Å/min |

The photoresist was stripped from the oxide mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The iridium layer of the test semiconductor wafer was then etched with $O_2$ Ar and $Cl_2$ as the etchant gas and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 450 watts |
| Temperature of Test Wafer | 320° C. |
| Iridium Etch Rate | 600 Å/min |
| Process Conditions Based on the Flow Rate of $O_2$ and Ar and $Cl_2$ | |
| $O_2$ | 15 sccm |
| Ar | 100 sccm |

-continued

| | |
|---|---|
| Cl₂ | 50 sccm |
| Pressure | 12 mTorr |
| RF Power to Coil Inductor | 900 watts |
| RF Power to Wafer Pedestal | 150 watts |
| Temperature (° C.) of Test Wafer | 320° C. |
| Iridium Etch Rate (Å/min) | 1500 Å/min |
| Selectivity of Ir/TiN Mask | 10:1 |

The remaining TiN mask layer could have been removed by any suitable means and/or in any suitable manner, such as by etching with Ar and Cl₂ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 1200 watts |
| RF Power to Wafer Pedestal | 100 watts |
| Temperature of Test Wafer | 110° C. |
| TiN Etch Rate | 2000 Å/min |
| Process Conditions Based on the Flow Rate of Ar and Cl₂ | |
| Ar | 100 sccm |
| Cl₂ | 50 sccm |
| Pressure | 12 mTorr |
| RF Power to Coil Inductor | 1200 watts |
| RF Power to Wafer Pedestal | 100 watts |
| Temperature of Test Wafer | 110° C. |
| TiN Etch Rate | 2000 Å/min |

Figure 47:
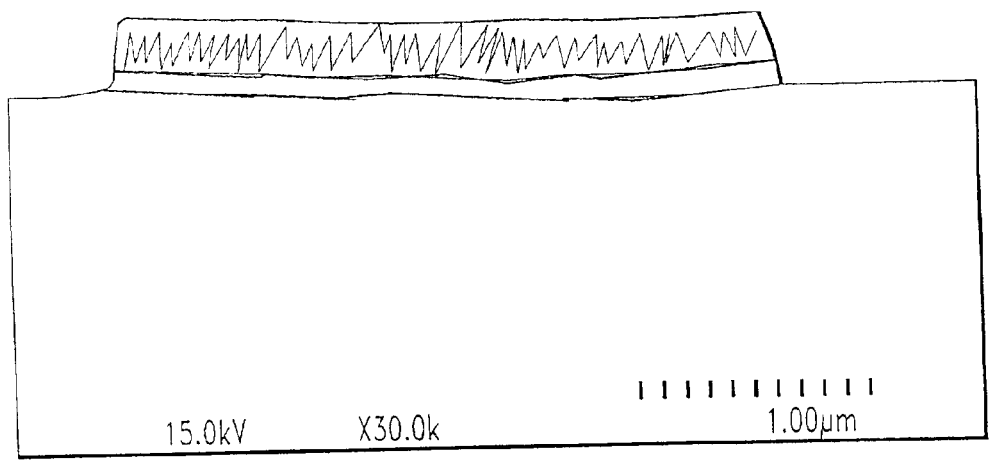
FIG. 47 is a picture showing an elevational view of a test semiconductor wafer for Example XI after an iridium electrode layer was etched in accordance with the process conditions listed in Example XI.
Figure 48:
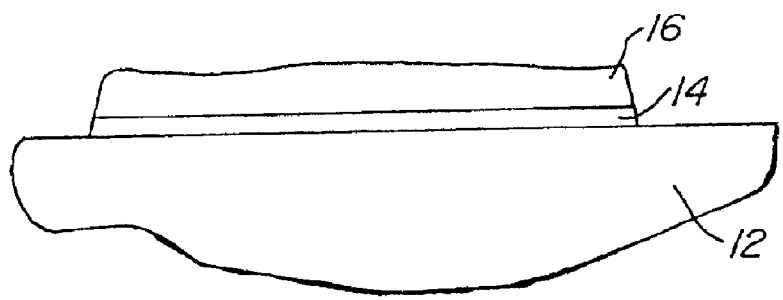
FIG. 48 is a drawing representing the elevational view in the picture of FIG. 47 with the respective parts identified by a reference numeral.

The resulting etched iridium layer of the test semiconductor wafer is shown in FIG. 47 wherein an iridium profile of about 80 degrees is shown. FIG. 48 is a drawing representing the elevational view in the picture of FIG. 47 with the respective parts identified by a reference numeral.

Conclusion

Thus, by the practice of the present invention there is provided a method for etching of the electrode layer 16 (e.g., platinum electrode layer 16 or iridium electrode layer 16). The etched electrode layer 16 includes a plurality of etched electrode layers 16a, 16b, 16c and 16d having a platinum profile where the angle ∝ of the sidewalls 16s with respect to a horizontal plane is equal to or greater than about 80 degrees, preferably equal or greater than about 85 degrees. The electrode layers 16a, 16b, 16c and 16d are separated by a distance or space having a dimension equal to or less than about 0.35 μm, preferably equal to or less than about 0.3 μm. Each of the electrode layers 16a, 16b, 16c and 16d include a dimension having a value equal to or less than about 0.6 μm, preferably equal to or less than about 0.35 μm, more preferably equal to or less than about 0.3 μm. More preferably, each of the electrode layers 16a, 16b, 16c and 16d has a width equal to or less than about 0.35 μm, preferably equal to or less than about 0.3 μm, a length equal to or less than about 0.6 μm, and a height equal to or less than about 0.6 μm. Because the produced etched electrode layers 16a, 16b, 16c and 16d are essentially a "veil-less" with no "fences" or "rabbit ears," they are ideally suited for receiving a dielectric (e.g., a BST layer) in producing a semiconductor device. The etchant gas in Example I consisted of about 40% by vol. Ar and about 60% by vol. Cl₂, and produced an etched platinum layer with a platinum profile of about 87 degrees. In Example II, the etchant gas consisted of 54.5% by vol. (about 55% by vol.) Cl₂, 36.4% by vol. (about 36% by vol.) Ar, and 9.1% by vol. (about 9% by vol.) BCl₃, and the resulting etched platinum layer had a platinum profile of about 87 degrees. In Example X, the etchant gas consisted of about 9.1% by vol. O₂, about 60.6% by vol. argon, and about 30.3% by vol. Cl₂, and produced an etched iridium layer with an iridium profile of about 85 degrees. In Example XI, the etchant gas consisted of about 9.1% by vol. O₂, about 60.6% by vol. argon, and about 30.3 % by vol. Cl₂, and produced an etched iridium layer with an iridium profile of about 80 degrees.

By the further practice of the present invention there is provided a method for etching a noble metal, and masking and etching sequences for patterning electrodes of high density RAM capacitors. One masking and etching sequence is to etch through a protective layer, an electrode layer, and into a barrier layer before removing a mask layer and a protective layer. A pair of mask layers may be employed instead of only one mask layer. Optionally, etching may be through the barrier layer and into the substrate before removing a mask layer and a protective layer. Another masking and etching sequence comprises respectively etching through a protective layer, an electrode layer, a barrier layer and into a etch-stop layer before removing a mask layer and a protective layer. In Example III, the etchant gas for etching the protective layer, the electrode layer, and the barrier layer included Ar/Cl₂/BCl₃, Ar/Cl₂/BCl₃/N₂ and Ar/BCl₂/N₂, respectively.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. While some features of the subject invention have been described with platinum or iridium being the electrode layer, it is to be understood that the spirit and scope of the present invention would include the use of other noble metal(s) and/or noble metal oxide(s) and/or alloy(s) of noble metal(s) (e.g., iridium, iridium oxide (IrO₂), ruthenium, ruthenium oxide (RuO₂), palladium, palladium oxide, platinum alloy(s), rhodium, etc.) instead of platinum or iridium under the identical disclosed conditions employing the identical parameters. Therefore, many modifications may be made to adapt a particular situation or material to the teachings of the invention without departing from the essential scope and spirit of the present invention. It is intended that the invention not be limited to the particular embodiment(s) disclosed as the best mode contemplated for carrying out this invention, but that the invention will include all embodiments and equivalents falling within the scope of the appended claims.

What is claimed is:

1. A method of pattern etching a noble metal layer to form an electrode in a RAM capacitor, comprising the steps of:
   a) providing a substrate supporting a series of layers consisting essentially of a barrier layer on said substrate, a noble metal layer on said barrier layer, a protective layer directly overlying said noble metal layer, a mask layer directly overlying said protective layer, and a patterned resist layer on said mask layer, wherein said protective layer and said mask layer consist essentially of inorganic materials;
   b) pattern etching said mask layer using a plasma generated from an etchant gas to expose a portion of said protective layer;

c) removing said patterned resist layer from said mask layer;

d) pattern etching said protective layer to expose a portion of said noble metal layer;

e) heating said noble metal layer to a temperature ranging from about 150° C. to about 500° C.;

f) pattern etching said noble metal layer using a plasma generated from an etchant gas consisting essentially of a halogen containing gas, and a gas selected from the group consisting of a noble gas, nitrogen, and mixtures thereof;

g) removing said mask layer from said protective layer; and h) pattern etching said barrier layer using a plasma generated from an etchant gas, to expose a portion of said substrate.

2. The method of claim 1 wherein, after completion of step g), there is residual noble metal on a surface of said barrier layer, and wherein said method comprises an additional step g-2) after step g), in which said residual noble metal is removed from said barrier layer prior to said step (h) pattern etching of said barrier layer.

3. The method of claim 2 wherein said mask layer and said substrate each comprises CVD $SiO_2$.

4. The method of claim 1 wherein said method comprises an additional step g-2) after step g), in which residual protective layer material is removed from said noble metal layer.

5. The method of claim 1 wherein, after completion of step g), there is residual noble metal on a surface of said barrier layer, and wherein said method comprises an additional step g-2) after step g), in which said residual noble metal and any remaining protective layer material are removed prior to said step (h) pattern etching of said barrier layer.

6. The method of claim 5 wherein said mask layer comprises CVD $SiO_2$.

7. The method of claim 1 wherein said protective layer is removed from said noble metal layer during pattern etching of said barrier layer.

8. The method of claim 1 wherein said mask layer comprises CVD $SiO_2$.

9. The method of claim 1 wherein said mask layer comprises a compound selected from the group consisting of TEOS, CVD $SiO_2$, $Si_3N_4$, BSG, PSG, BPSG, and mixtures thereof.

10. The method of claim 1 wherein said barrier layer comprises a compound selected from the group consisting of TiN, TiSiN, Ti, WN, TaN, TaSiN, Ta, and mixtures thereof.

11. The method of claim 1 wherein said protective layer comprises a compound selected from the group consisting of TiN, TiSiN, Ti, WN, TaN, TaSiN, Ta, and mixtures thereof.

12. A method of pattern etching a noble metal layer to form an electrode in a RAM capacitor, comprising the steps of:

a) providing a substrate supporting a series of layers consisting essentially of a barrier layer on said substrate, a noble metal layer on said barrier layer, an inorganic mask layer directly overlying said noble metal layer, and a patterned resist layer on said mask layer;

b) pattern etching said mask layer using a plasma generated from an etchant gas to expose a portion of said noble metal layer;

c) removing said patterned resist layer from said mask layer;

d) heating said noble metal layer to a temperature ranging from about 150° C. to about 500° C.;

e) pattern etching said noble metal layer using a plasma generated from an etchant gas consisting essentially of a halogen containing gas, and a gas selected from the group consisting of a noble gas, nitrogen, and mixtures thereof;

f) removing said mask layer from said etched noble metal layer; and g) pattern etching said barrier layer using a plasma generated from an etchant gas to expose a portion of said substrate.

13. A method of pattern etching a noble metal layer to form an electrode in a RAM capacitor, comprising the steps of:

a) providing a substrate supporting a series of layers consisting essentially of a barrier layer on said substrate, a noble metal layer on said barrier layer, a protective layer directly overlying said noble metal layer, a mask layer directly overlying said protective layer, and a patterned resist layer on said mask layer, wherein said protective layer and said mask layer consist essentially of inorganic materials;

b) pattern etching said mask layer using a plasma generated from an etchant gas to expose a portion of said protective layer;

c) removing said patterned resist layer from said mask layer;

d) pattern etching said protective layer to expose a portion of said noble metal layer;

e) pattern etching said noble metal layer using a plasma generated from an etchant gas consisting essentially of a halogen containing gas, and a gas selected from the group consisting of a noble gas, nitrogen, and mixtures thereof, at a substrate temperature between about 150° C. and about 500° C.;

f) pattern etching said barrier layer using a plasma generated from an etchant gas to expose a portion of said substrate; and g) removing said mask layer from said protective layer.

14. The method of claim 13 wherein said barrier layer comprises a compound selected from the group consisting of TiN, TiSiN, Ti, WN, TaN, TaSiN, Ta, and mixtures thereof.

15. The method of claim 13 wherein said protective layer comprises a compound selected from the group consisting of TiN, TiSiN, Ti, WN, TaN, TaSiN, Ta, and mixtures thereof.

16. The method of claim 13 wherein said mask layer comprises a compound selected from the group consisting of TEOS, CVD $SiO_2$, $Si_3N_4$, BSG, PSG, BPSG, and mixtures thereof.

17. A method of pattern etching a noble metal layer to form an electrode in a RAM capacitor, comprising the steps of:

a) providing a substrate supporting a series of layers consisting essentially of an etch-stop layer on said substrate, a barrier layer on said etch-stop layer, a noble metal layer on said barrier layer, an inorganic mask layer directly overlying said noble metal layer, and a patterned resist layer on said mask layer;

b) pattern etching said mask layer using a plasma generated from an etchant gas to expose a portion of said noble metal layer;

c) removing said patterned resist layer from said mask layer;

d) pattern etching said noble metal layer using a plasma generated from an etchant gas consisting essentially of a halogen containing gas, a gas selected from the group consisting of a noble gas, nitrogen, and mixtures thereof, and an additive gas selected from the group consisting of HBr, BCl$_3$, and mixtures thereof, at a substrate temperature between about 150° C. and about 500° C.;

e) pattern etching said barrier layer to expose a portion of said etch-stop layer; and f) removing said mask layer from said etched noble metal layer.

18. The method of claim 17 wherein said method additionally comprises the step of etching said etch-stop layer.

19. The method of claim 17 wherein said mask layer comprises a compound selected from the group consisting of TEOS, CVD SiO$_2$, Si$_3$N$_4$, BSG, PSG, BPSG, and mixtures thereof.

20. A method of pattern etching a noble metal layer to form an electrode in a RAM capacitor, comprising the steps of:

a) providing a substrate supporting a barrier layer, a noble metal layer on said barrier layer, a first mask layer directly overlying said noble metal layer, a second mask layer directly overlying said first mask layer, and a patterned resist layer on said second mask layer, wherein said first mask layer and said second mask layer consist essentially of inorganic materials;

b) pattern etching said second mask layer using a plasma generated from an etchant gas to expose a portion of said first mask layer;

c) pattern etching said first mask layer to expose a portion of said noble metal layer;

d) removing said patterned resist layer from said second mask layer;

e) pattern etching said noble metal layer and etching said second mask layer surface using a plasma generated from an etchant gas consisting essentially of a halogen containing gas, and a gas selected from the group consisting of a noble gas, nitrogen, and mixtures thereof, at a substrate temperature between about 150° C. and about 500° C.;

f) pattern etching said barrier layer; and g) removing any residue of said second mask layer and said first mask layer from said etched noble metal layer.

21. The method of claim 20 wherein said patterned resist layer is removed from said second mask layer during etching of said first mask layer.

22. The method of claim 20 wherein said first mask layer comprises a compound selected from the group consisting of Si$_3$N$_4$, BSG, PSG, BPSG, and mixtures thereof.

23. The method of claim 20 wherein said second mask layer comprises a compound selected from the group consisting of CVD SiO$_2$, TEOS, Si$_3$N$_4$, BSG, PSG, BPSG, SiC, and mixtures thereof.

24. The method of claim 20 wherein said second mask layer has a thickness ranging from about 500 Å to about 4000 Å.

25. A method of pattern etching a noble metal layer to form an electrode in a RAM capacitor, comprising the steps of:

a) providing a substrate supporting a series of layers consisting essentially of a barrier layer on said substrate, a noble metal layer on said barrier layer, a protective layer directly overlying said noble metal layer, a mask layer directly overlying said protective layer, and a patterned resist layer on said mask layer, wherein said protective layer and said mask layer consist essentially of inorganic materials;

b) pattern etching said mask layer using a plasma generated from an etchant gas to expose a portion of said protective layer;

c) removing said patterned resist layer from said mask layer;

d) pattern etching said protective layer to expose a portion of said noble metal layer;

e) heating said noble metal layer to a temperature ranging from about 150° C. to about 500° C.;

f) pattern etching said noble metal layer using a plasma generated from an etchant gas consisting essentially of a halogen containing gas, a gas selected from the group consisting of a noble gas, nitrogen, and mixtures thereof, and an additive gas selected from the group consisting of HBr, BCl$_3$, SiCl$_4$ and mixtures thereof;

g) removing said mask layer from said protective layer; and h) pattern etching said barrier layer using a plasma generated from an etchant gas, to expose a portion of said substrate.

26. A method of pattern etching a noble metal layer to form an electrode in a RAM capacitor, comprising the steps of:

a) providing a substrate supporting a series of layers consisting essentially of a barrier layer on said substrate, a noble metal layer on said barrier layer, an inorganic mask layer directly overlying said noble metal layer, and a patterned resist layer on said mask layer;

b) pattern etching said mask layer using a plasma generated from an etchant gas to expose a portion of said noble metal layer;

c) removing said patterned resist layer from said mask layer;

d) heating said noble metal layer to a temperature ranging from about 150° C. to about 500° C.;

e) pattern etching said noble metal layer using a plasma generated from an etchant gas consisting essentially of a halogen containing gas, a gas selected from the group consisting of a noble gas, nitrogen, and mixtures thereof, and an additive gas selected from the group consisting of HBr, BCl$_3$, SiCl$_4$ and mixtures thereof;

f) removing said mask layer from said etched noble metal layer; and g) pattern etching said barrier layer using a plasma generated from an etchant gas to expose a portion of said substrate.

27. A method of pattern etching a noble metal layer to form an electrode in a RAM capacitor, comprising the steps of:

a) providing a substrate supporting a series of layers consisting essentially of a barrier layer on said substrate, a noble metal layer on said barrier layer, a protective layer directly overlying said noble metal layer, a mask layer directly overlying said protective layer, and a patterned resist layer on said mask layer, wherein said protective layer and said mask layer consist essentially of inorganic materials;

b) pattern etching said mask layer using a plasma generated from an etchant gas to expose a portion of said protective layer;

c) removing said patterned resist layer from said mask layer;

d) pattern etching said protective layer to expose a portion of said noble metal layer;

e) pattern etching said noble metal layer using a plasma generated from an etchant gas consisting essentially of a halogen containing gas, a gas selected from the group consisting of a noble gas, nitrogen, and mixtures thereof, and an additive gas selected from the group consisting of HBr, BCl$_3$, SiCl$_4$ and mixtures thereof, at a substrate temperature between about 150° C. and about 500° C.;

f) pattern etching said barrier layer using a plasma generated from an etchant gas to expose a portion of said substrate; and g) removing said mask layer from said protective layer.

28. A method of pattern etching a noble metal layer to form an electrode in a RAM capacitor, comprising the steps of:

a) providing a substrate supporting a barrier layer, a noble metal layer on said barrier layer, a first mask layer directly overlying said noble metal layer, a second mask layer directly overlying said first mask layer, and a patterned resist layer on said second mask layer, wherein said first mask layer and said second mask layer consist essentially of inorganic materials;

b) pattern etching said second mask layer using a plasma generated from an etchant gas to expose a portion of said first mask layer;

c) pattern etching said first mask layer to expose a portion of said noble metal layer;

d) removing said patterned resist layer from said second mask layer;

e) pattern etching said noble metal layer and etching said second mask layer surface using a plasma generated from an etchant gas consisting essentially of a halogen containing gas, a gas selected from the group consisting of a noble gas, nitrogen, and mixtures thereof, and an additive gas selected from the group consisting of HBr, BCl$_3$, SiCl$_4$ and mixtures thereof, at a substrate temperature between about 150° C. and about 500° C.;

f) pattern etching said barrier layer; and g) removing any residue of said second mask layer and said first mask layer from said etched noble metal layer.

* * * * *